(12) United States Patent
Tada et al.

(10) Patent No.: US 12,193,324 B2
(45) Date of Patent: Jan. 7, 2025

(54) MELT MIXTURE FOR ORGANIC ELECTROLUMINESCENT ELEMENT, AND ORGANIC ELECTROLUMINESCENT ELEMENT

(71) Applicant: NIPPON STEEL Chemical & Material Co., Ltd., Tokyo (JP)

(72) Inventors: Masashi Tada, Tokyo (JP); Yuta Sagara, Tokyo (JP)

(73) Assignee: NIPPON STEEL Chemical & Material Co., Ltd., Tokyo (JP)

(*) Notice: Subject to any disclaimer, the term of this patent is extended or adjusted under 35 U.S.C. 154(b) by 758 days.

(21) Appl. No.: 17/442,601

(22) PCT Filed: Mar. 13, 2020

(86) PCT No.: PCT/JP2020/010975
§ 371 (c)(1),
(2) Date: Sep. 23, 2021

(87) PCT Pub. No.: WO2020/195917
PCT Pub. Date: Oct. 1, 2020

(65) Prior Publication Data
US 2022/0173326 A1    Jun. 2, 2022

(30) Foreign Application Priority Data
Mar. 25, 2019 (JP) .................................. 2019-056860

(51) Int. Cl.
*H01L 51/50* (2006.01)
*H10K 71/16* (2023.01)
(Continued)

(52) U.S. Cl.
CPC ......... *H10K 85/654* (2023.02); *H10K 71/164* (2023.02); *H10K 85/626* (2023.02);
(Continued)

(58) Field of Classification Search
None
See application file for complete search history.

(56) References Cited

U.S. PATENT DOCUMENTS

| | | |
|---|---|---|
| 2015/0166886 A1 | 6/2015 | Endo et al. |
| 2016/0141505 A1 | 5/2016 | Park et al. |

(Continued)

FOREIGN PATENT DOCUMENTS

| | | | |
|---|---|---|---|
| KR | 10-2015-0042650 A | † | 4/2015 |
| KR | 10-2015-0046750 A | † | 4/2015 |

(Continued)

OTHER PUBLICATIONS

"International Preliminary Report On Patentability (Form PCT/IPEA/409) of PCT/JP2020/010975," completed on Feb. 18, 2021, with English translation thereof, pp. 1-11.

*Primary Examiner* — Gregory D Clark
(74) *Attorney, Agent, or Firm* — JCIPRNET

(57) ABSTRACT

Provided are an organic EL device having high luminous efficiency and a prolonged lifespan with a low driving voltage, and a melt mixture for an organic electroluminescent device used in the organic EL device. The melt mixture for an organic electroluminescent device is a melt mixture of at least two types of organic compounds including a first organic compound and a second organic compound, and a difference in vapor deposition temperature between the first organic compound and the second organic compound is 20° C. or less, and a difference between a PL maximum emission wavelength of the melt mixture and a PL maximum emission wavelength of any of the first organic compound and the second organic compound is within ±10 nm. The melt mixture is suitable as a host material of a light-emitting layer.

8 Claims, 2 Drawing Sheets

(51) Int. Cl.
  *H10K 85/60*    (2023.01)
  *H10K 50/11*    (2023.01)
  *H10K 50/12*    (2023.01)
  *H10K 101/10*   (2023.01)

(52) U.S. Cl.
  CPC ..... *H10K 85/6572* (2023.02); *H10K 85/6574* (2023.02); *H10K 85/6576* (2023.02); *H10K 50/11* (2023.02); *H10K 50/12* (2023.02); *H10K 2101/10* (2023.02)

(56) References Cited

U.S. PATENT DOCUMENTS

| | | | |
|---|---|---|---|
| 2018/0138420 A1 | 5/2018 | Tada et al. | |
| 2020/0028089 A1* | 1/2020 | Cho | .................... C07D 403/04 |
| 2021/0143340 A1 | 5/2021 | Ogawa et al. | |

FOREIGN PATENT DOCUMENTS

| | | | |
|---|---|---|---|
| WO | 2004070787 | | 8/2004 |
| WO | 2011070963 | | 6/2011 |
| WO | 2012127990 | | 9/2012 |
| WO | 2015053459 | | 4/2015 |
| WO | 2016194604 | | 12/2016 |
| WO | 2016194604 | A1 † | 12/2016 |
| WO | 2018198844 | | 11/2018 |
| WO | 2020111277 | | 6/2020 |

\* cited by examiner
† cited by third party

MELT MIXTURE FOR ORGANIC ELECTROLUMINESCENT ELEMENT, AND ORGANIC ELECTROLUMINESCENT ELEMENT

CROSS-REFERENCE TO RELATED APPLICATION

This application is a 371 application of the International PCT application serial no. PCT/JP2020/010975, filed on Mar. 13, 2020, which claims the priority benefit of Japan Patent Application No. 2019-056860, filed on Mar. 25, 2019. The entirety of each of the above-mentioned patent applications is hereby incorporated by reference herein and made a part of this specification.

TECHNICAL FIELD

The present invention relates to a melt mixture for an organic electroluminescent device and an organic electroluminescent device (referred to as an organic EL device) using the same.

When a voltage is applied to an organic EL device, holes are injected from an anode and electrons are injected from a cathode to a light-emitting layer, respectively. Thus, in the light-emitting layer, injected holes and electrons recombine to generate excitons. In this case, according to statistical rules of electron spins, singlet excitons and triplet excitons are generated at a ratio of 1:3. It is said that the internal quantum efficiency of a fluorescence-emitting organic EL device using light emission from singlet excitons is limited to 25%. On the other hand, it is known that, in a phosphorescent organic EL device using light emission from triplet excitons, when intersystem crossing is efficiently performed from singlet excitons, the internal quantum efficiency is raised to 100%.

However, for phosphorescent organic EL devices, prolonging the lifespan is a technical issue.

In addition, recently, organic EL devices using delayed fluorescence and having high efficiency have been developed. For example, PTL 1 discloses an organic EL device using a Triplet-Triplet Fusion (TTF) mechanism which is one of delayed fluorescence mechanisms. The TTF mechanism utilizes a phenomenon in which singlet excitons are generated due to collision of two triplet excitons, and it is thought that the internal quantum efficiency is theoretically raised to 40%. However, compared to phosphorescent organic EL devices, since the efficiency is low, further improvement in efficiency is required.

On the other hand, PTL 2 discloses an organic EL device using a thermally activated delayed fluorescence (TADF) mechanism. The TADF mechanism utilizes a phenomenon in which reverse intersystem crossing from triplet excitons to singlet excitons is generated in a material having a small energy difference between a singlet level and a triplet level, and it is thought that the internal quantum efficiency is theoretically raised to 100%. However, further improvement in lifespan characteristics is required as in the phosphorescent elements.

CITATION LIST

Patent Literature

[PTL 1] WO2010/134350 A
[PTL 2] WO2011/070963 A
[PTL 3] WO2016/194604 A
[PTL 4] WO2018/198844 A
[PTL 5] WO2015/053459 A
[PTL 6] WO2012/127990 A

PTL 3 and PTL 4 disclose an organic EL device using an indolocarbazole compound as a first host and a biscarbazole compound as a second host.

PTL 5 discloses an organic EL device in which two types of organic compounds are melted and mixed to produce an organic alloy having a maximum emission wavelength of a fluorescence-emitting spectrum different from a maximum emission wavelength of a fluorescence-emitting spectrum of each individual organic compound and a maximum emission wavelength of a fluorescence-emitting spectrum of a simple mixture by 20 nm or more, and the organic alloy is used as a host.

PTL 6 discloses an organic EL device using a first organic compound and a second organic compound which form an exciplex as hosts.

SUMMARY OF INVENTION

In order to apply an organic EL device to a display element such as a flat panel display or a light source, it is necessary to improve the luminous efficiency of the element and to sufficiently secure stability during driving at the same time. An object of the present invention is to provide a practically useful organic EL device having high efficiency and high driving stability despite having a low driving voltage.

The present invention provides a melt mixture for an organic electroluminescent device which is a melt mixture of at least two types of organic compounds, wherein the two types of organic compounds include a first organic compound and a second organic compound, a difference in vapor deposition temperature between the first organic compound and the second organic compound is 20° C. or less, and a difference between a maximum emission wavelength of a fluorescence-emitting spectrum of the melt mixture and a maximum emission wavelength of a fluorescence-emitting spectrum of any of the first organic compound and the second organic compound is within ±10 nm.

The first organic compound is a compound represented by the following General Formula (1).

[C1]

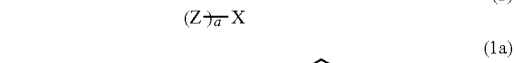

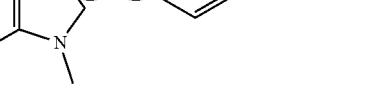

Here, X represents an aromatic hydrocarbon group having 6 to 18 carbon atoms, an aromatic heterocyclic group having 3 to 17 carbon atoms or a linked aromatic group in which 2 to 8 of these aromatic rings are linked.

Z represents an aromatic heterocyclic group represented by the Formula (1a), the ring A is an aromatic hydrocarbon ring represented by Formula (1b), the ring B is a heterocycle represented by Formula (1c), and the ring A and the ring B are each fused to an adjacent ring at any position.

$R^1$'s independently represent a cyano group, deuterium, an aliphatic hydrocarbon group having 1 to 10 carbon atoms, an aromatic hydrocarbon group having 6 to 18 carbon atoms, or an aromatic heterocyclic group having 3 to 17 carbon atoms.

Y represents O, S, or N—$Ar^1$, $Ar^1$ represents an aromatic hydrocarbon group having 6 to 18 carbon atoms, an aromatic heterocyclic group having 3 to 17 carbon atoms, or a linked aromatic group in which 2 to 8 of these aromatic rings are linked.

a represents an integer of 1 to 3, b and c represent an integer of 0 to 4, and d represents an integer of 0 to 2.)

The second organic compound is a compound represented by the following General Formula (2).

[C2]

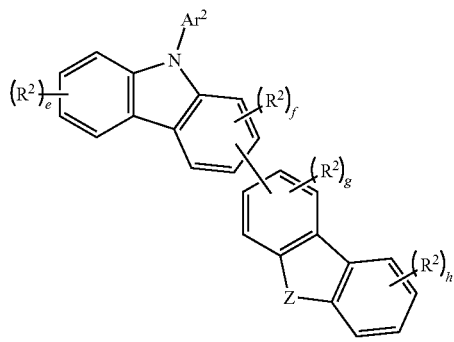

(2)

Here, Z represents O, S, or N—$Ar^3$. Are and Ara represent an aromatic hydrocarbon group having 6 to 18 carbon atoms, an aromatic heterocyclic group having 3 to 17 carbon atoms or a linked aromatic group in which 2 to 8 of these aromatic rings are linked.

$R^2$'s independently represent a cyano group, deuterium, an aliphatic hydrocarbon group having 1 to 10 carbon atoms, an aromatic hydrocarbon group having 6 to 18 carbon atoms, or an aromatic heterocyclic group having 3 to 17 carbon atoms.

e and h represent an integer of 0 to 4, and f and g represent an integer of 0 to 3.

Preferable embodiments of General Formula (2) include the following Formula (3).

[C3]

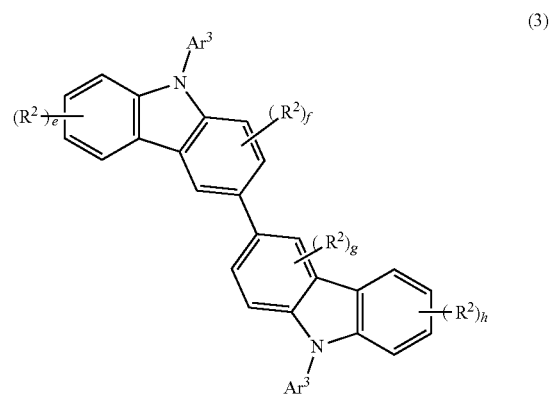

(3)

Here, $Ar^2$, $Ar^3$, $R^2$, e, h, f and g are the same as those in General Formula (2).

In addition, preferably, Y or Z is N—$Ar^1$ or N—$Ar^3$.

In addition, the present invention provides an organic electroluminescent device containing a sublimate obtained by vacuum-vapor-depositing the melt mixture for an organic electroluminescent device in a light-emitting layer.

In addition, the present invention provides a method of producing an organic electroluminescent device including a process in which the melt mixture for an organic electroluminescent device is vacuum-vapor-deposited to form a light-emitting layer.

When the melt mixture for an organic EL device of the present invention is vacuum-vapor-deposited to form a light-emitting layer and an organic EL device is produced, it is possible to provide an organic EL device having high luminous efficiency and a prolonged lifespan with a low driving voltage.

DESCRIPTION OF EMBODIMENTS

Figure 1:
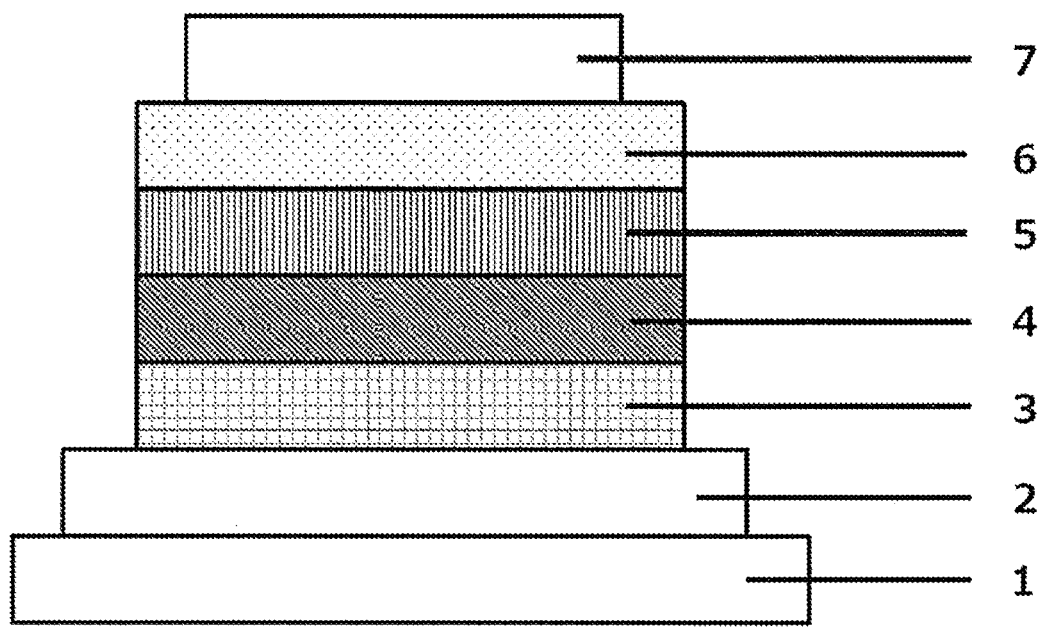
FIG. 1 is a cross-sectional view schematically showing an example of an organic EL device.

A melt mixture for organic EL device of the present invention is a mixture obtained by uniformly mixing by melting a mixture containing at least two types of organic compounds. The melt mixture may be in a molten state, but a melted mixture that has been cooled and solidified is suitable.

At least two types of organic compounds include a first organic compound and a second organic compound, and a difference in vapor deposition temperature between the first organic compound and the second organic compound is 20° C. or less.

The vapor deposition temperature is an average temperature of a vapor deposition source when the first organic compound or the second organic compound is vapor-deposited on a substrate under a high vacuum of $1.0 \times 10^{-2}$ Pa or less and at a vapor deposition rate of 1 Å/s.

Here, a total amount of the first organic compound and the second organic compound is preferably 50 wt % or more of the melt mixture for organic EL device, more preferably 70 wt % or more, and still more preferably 80 wt % or more, 90 wt % or more, or 95 wt % or more in that order. Further, the first organic compound and the second organic compound are preferably two compounds whose contents are largest in the compounds contained in the melt mixture for organic EL device.

Here, a difference between a maximum emission wavelength of a fluorescence-emitting spectrum of the melt mixture and a maximum emission wavelength of a fluorescence-emitting spectrum of any of the first organic compound and the second organic compound is within ±10 nm.

The maximum emission wavelength of the fluorescence-emitting spectrum is also called a PL maximum emission wavelength.

The wavelength difference between the PL maximum emission wavelength of the melt mixture and the PL maximum emission wavelength of any of the first organic compound and the second organic compound is more preferably within ±5 nm.

Here, the PL maximum emission wavelength is a wavelength at an emission peak exhibiting a maximum emission intensity in an emission spectrum observed in a measurement range of 350 nm to 700 nm when excitation light of 340 nm is emitted to a powder sample using a spectrophotometer.

The first organic compound is preferably the compound represented by General Formula (1).

In General Formula (1), Z is an aromatic heterocyclic group represented by Formula (1a), the ring A is an aromatic hydrocarbon group represented by Formula (1b), the ring B is a heterocycle represented by Formula (1c), and the ring A and the ring B are each fused to an adjacent ring.

a represents an integer of 1 to 3, and is preferably 1 or 2, and more preferably 1.

X represents an aromatic hydrocarbon group having 6 to 18 carbon atoms, an aromatic heterocyclic group having 3 to 17 carbon atoms or a linked aromatic group in which 2 to 8 of these aromatic rings are linked.

An aromatic hydrocarbon group having 6 to 12 carbon atoms, an aromatic heterocyclic group having 3 to 15 carbon atoms, or a linked aromatic group composed of 2 to 6 of these aromatic rings linked is preferable. An aromatic hydrocarbon group having 6 to 10 carbon atoms, an aromatic heterocyclic group having 3 to 12 carbon atoms, or a linked aromatic group composed of 2 to 4 of these rings linked is more preferable.

Here, the linked aromatic group is a group having a structure in which the aromatic rings of the aromatic hydrocarbon group or the aromatic heterocyclic group are bonded by a single bond, and the linking groups or the aromatic rings may be the same as or different from each other, and they may be linearly linked or branched.

Specific examples of X include a group formed by removing a hydrogen atoms from benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, carbazole, or linked aromatic compound in which 2 to 8 of these rings are linked.

Preferable examples thereof include a group formed by removing a hydrogen atoms from benzene, naphthalene, acenaphthene, acenaphthylene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, carbazole, or linked aromatic compound in which 2 to 6 of these rings are linked.

More preferable examples thereof include a group formed by removing a hydrogen atoms from benzene, naphthalene, azulene, pyridine, pyrimidine, triazine, thiophene, isothiazole, triazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, carbazole, or linked aromatic compound in which 2 to 4 of these rings are linked.

$R^1$'s independently represent a cyano group, deuterium, an aliphatic hydrocarbon group having 1 to 10 carbon atoms, an aromatic hydrocarbon group having 6 to 18 carbon atoms, or an aromatic heterocyclic group having 3 to 17 carbon atoms. Preferable examples thereof include an aliphatic hydrocarbon group having 1 to 8 carbon atoms, an aromatic hydrocarbon group having 6 to 12 carbon atoms, and an aromatic heterocyclic group having 3 to 15 carbon atoms. More preferable examples thereof include an aromatic hydrocarbon group having 6 to 10 carbon atoms and an aromatic heterocyclic group having 3 to 12 carbon atoms.

b and c represent an integer of 0 to 4, and d represents an integer of 0 to 2.

Specific examples of $R^1$ include cyano, deuterium, methyl, ethyl, propyl, butyl, pentyl, hexyl, heptyl, octyl, nonyl, or groups obtained by removing one hydrogen atom from benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, and carbazole.

Preferable examples thereof include methyl, ethyl, propyl, butyl, pentyl, hexyl, heptyl, octyl, or groups obtained by removing one hydrogen atom from benzene, naphthalene, acenaphthene, acenaphthylene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, and carbazole. More preferable examples thereof include groups obtained by removing one hydrogen atom from benzene, naphthalene, azulene, pyridine, pyrimidine, triazine, thiophene, isothiazole, triazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, and carbazole.

Y represents O, S, or N—Ar$^1$ and is preferably N—Ar$^1$.

Ar$^1$ represents an aromatic hydrocarbon group having 6 to 18 carbon atoms, an aromatic heterocyclic group having 3 to 17 carbon atoms, or a linked aromatic group in which 2 to 8 of these aromatic rings are linked. An aromatic hydrocarbon group having 6 to 12 carbon atoms, an aromatic heterocyclic group having 3 to 15 carbon atoms, or a linked aromatic group in which 2 to 6 of these rings are linked is preferable. An aromatic hydrocarbon group having 6 to 10 carbon atoms, an aromatic heterocyclic group having 3 to 12 carbon atoms, or a linked aromatic group in which 2 to 4 of these rings are linked is more preferable.

Specific examples of Ar$^1$ include a group obtained by removing one hydrogen atom from benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, carbazole, or linked aromatic compound in which 2 to 6 of these rings are linked. Preferable examples thereof include a group obtained by removing one hydrogen atom from benzene, naphthalene, acenaphthene, acenaphthylene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, carbazole, or linked aromatic compound in which 2 to 4 of these rings are linked.

More preferable examples thereof include a group obtained by removing one hydrogen atom from benzene, naphthalene, azulene, pyridine, pyrimidine, triazine, thiophene, isothiazole, triazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, carbazole, or linked aromatic compound in which 2 to 4 of these rings are linked.

Specific examples of compounds represented by General Formula (1) are shown below, but the present invention is not limited to such exemplary compounds.

[C4]

1-1

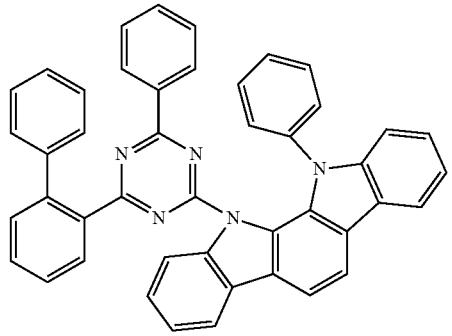

1-2

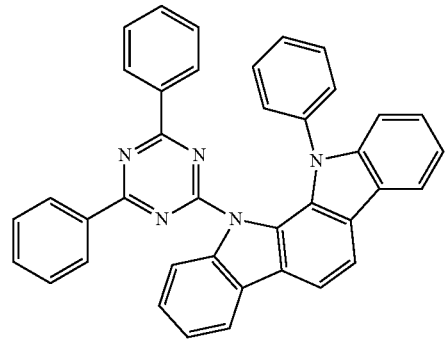

1-3

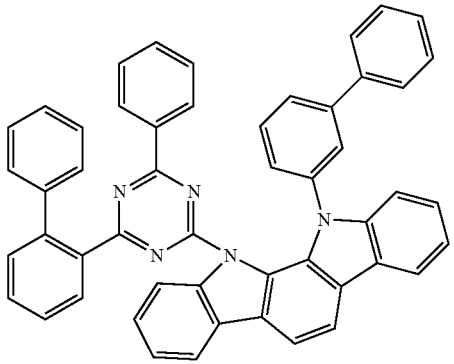

1-4

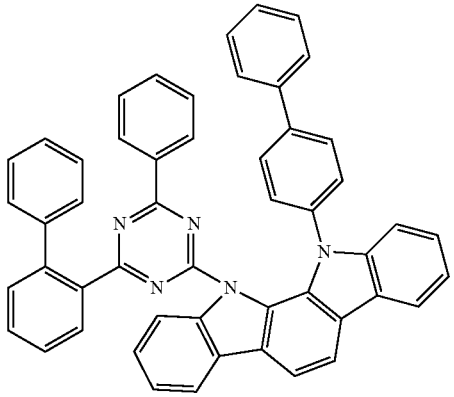

1-5
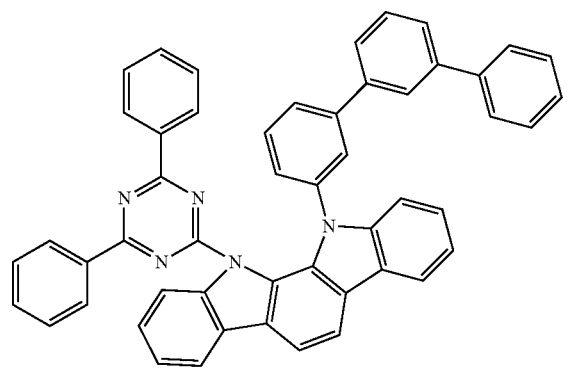
1-6
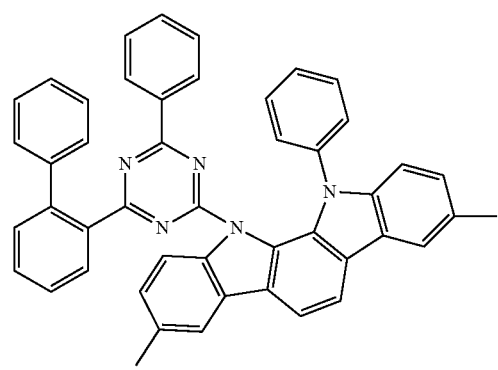
1-7
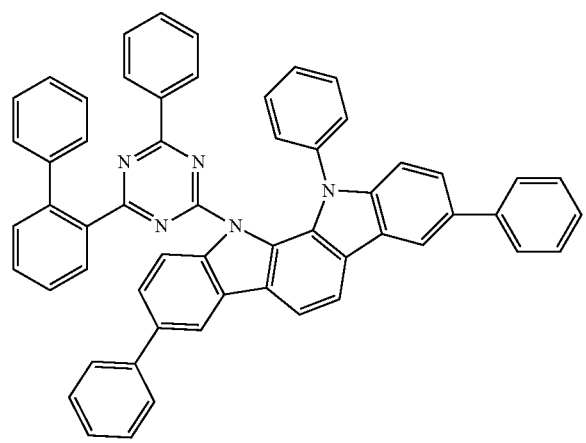
1-8
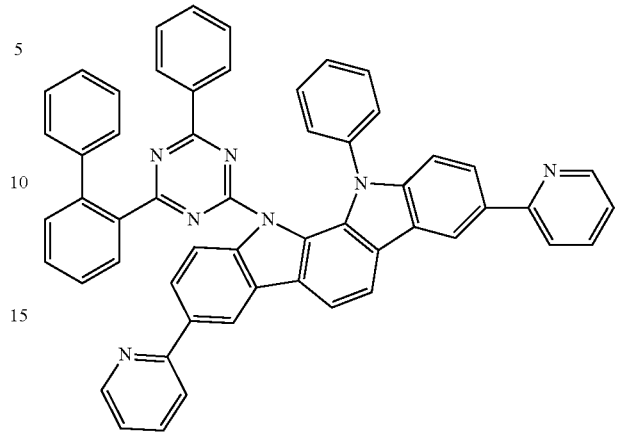
1-9
1-10
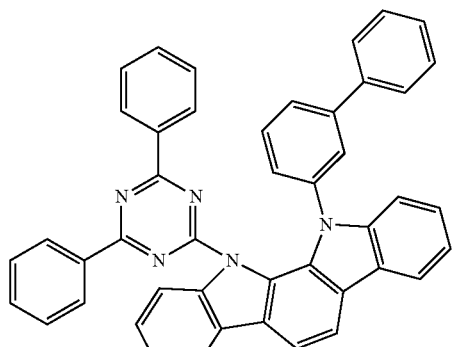
1-11

1-12
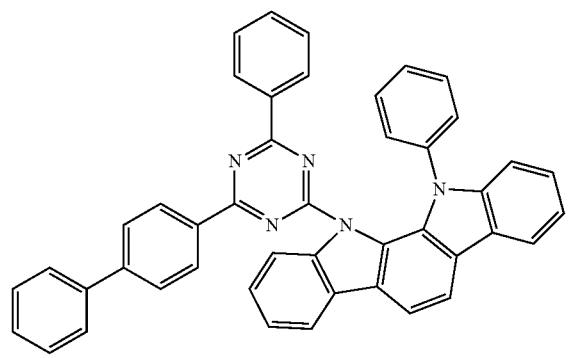
1-13
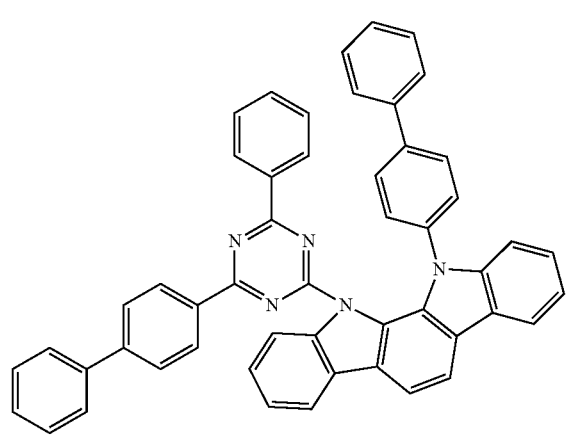
1-14
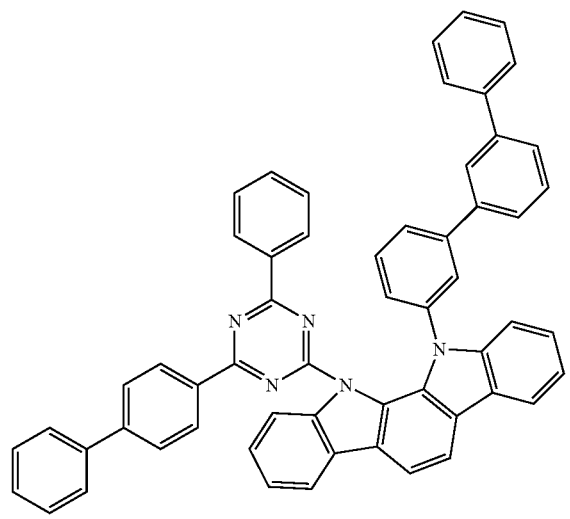
1-15
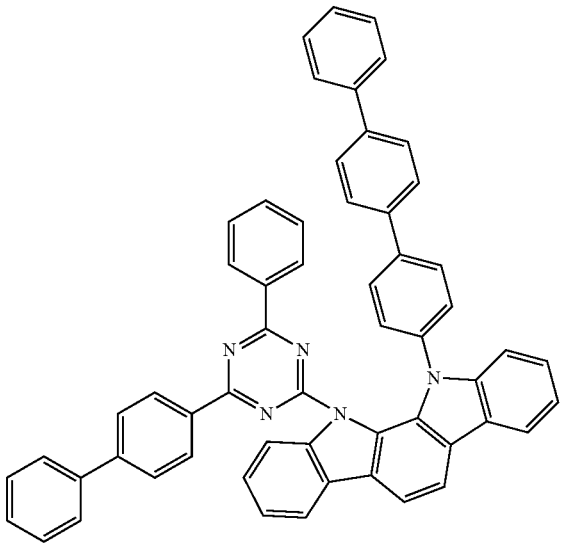
1-16
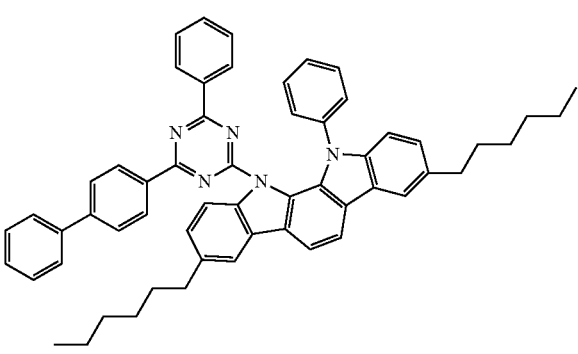
1-17
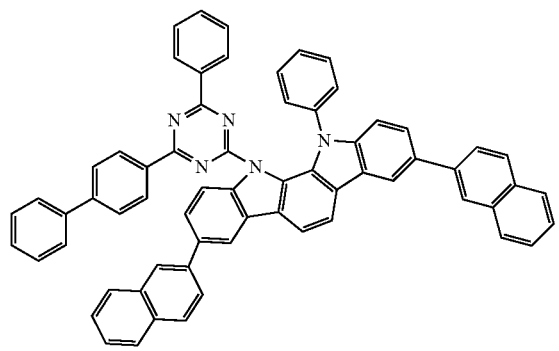

1-18
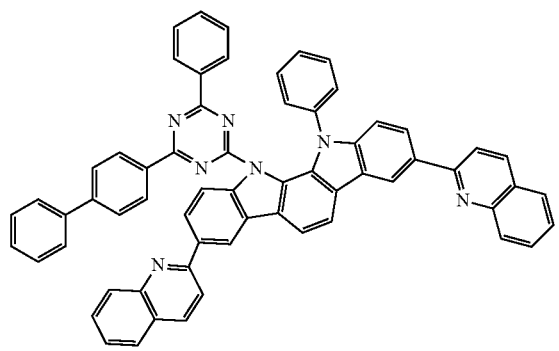
1-19
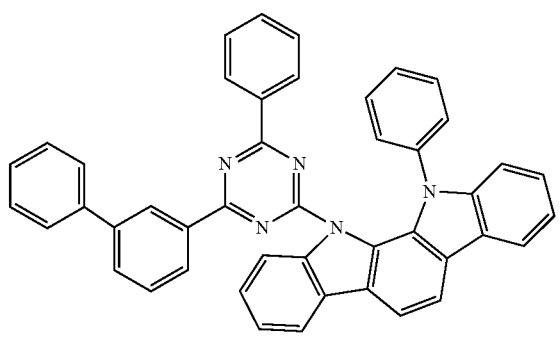
1-20
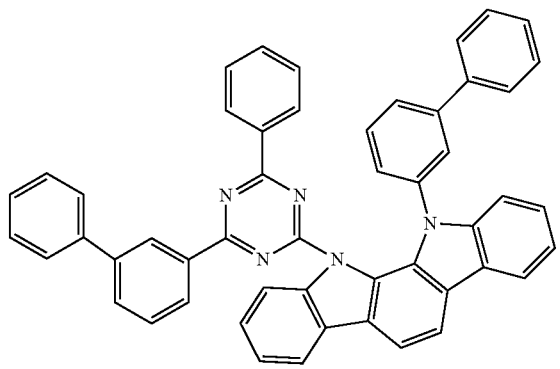
[C6]
1-21
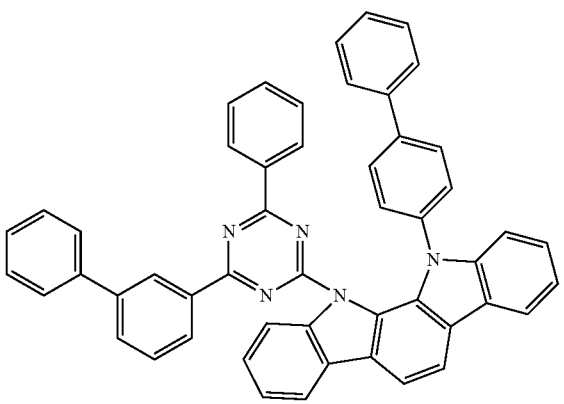
1-22
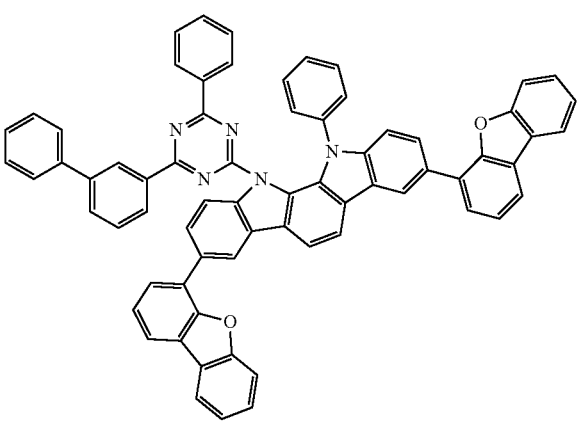
1-23
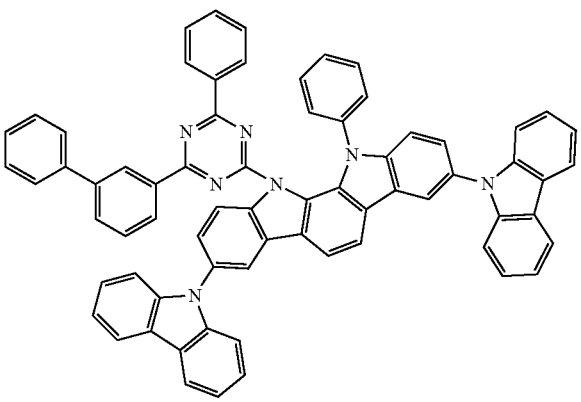
1-24
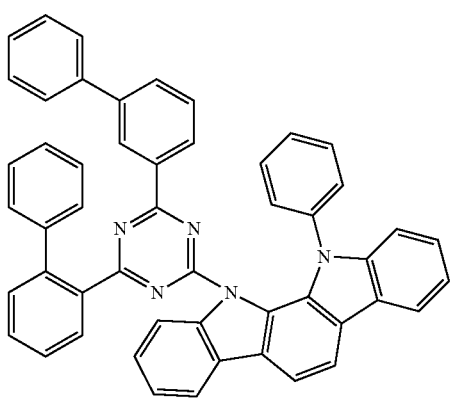

1-25
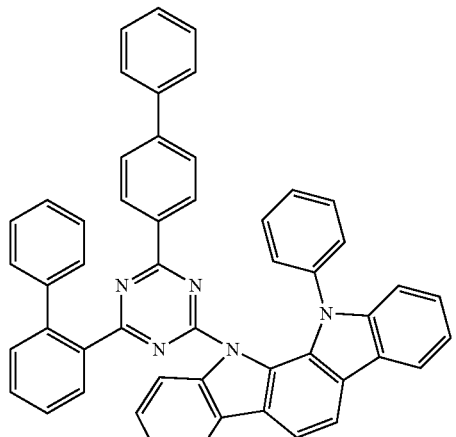
1-26
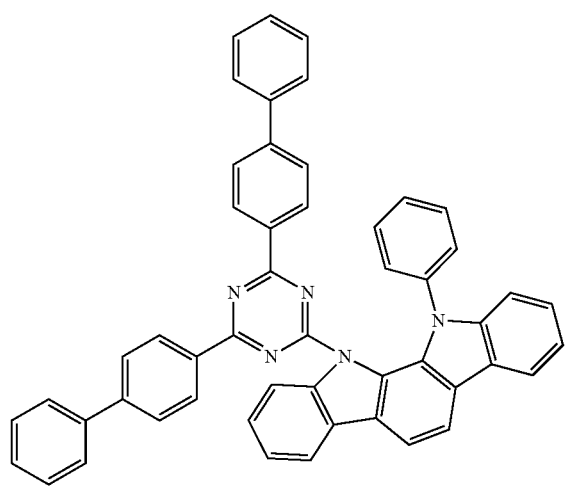
1-27
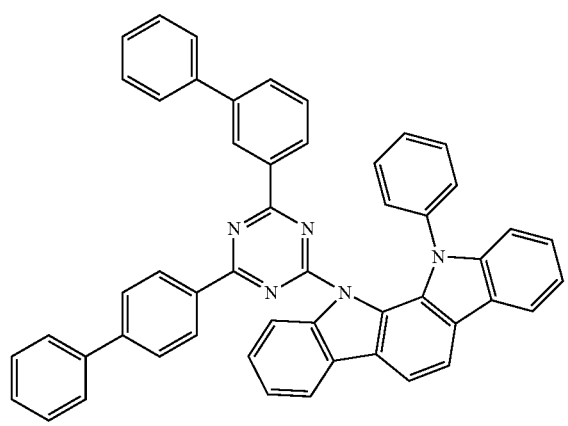
1-28
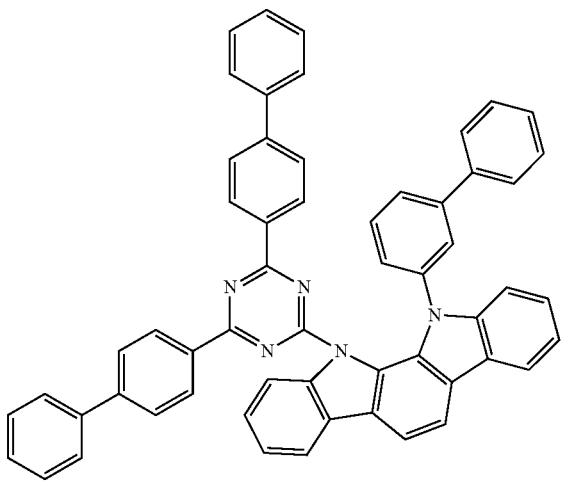
1-29
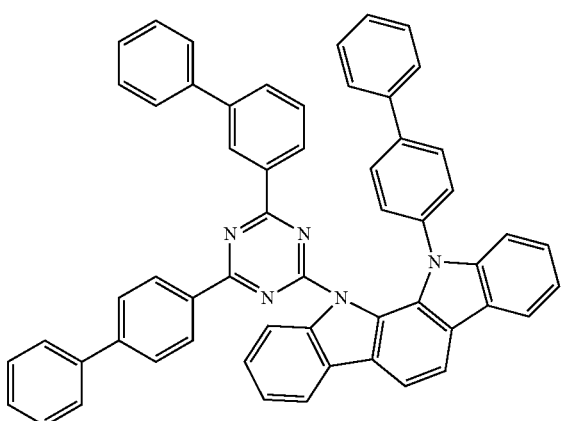
[C7]
1-30
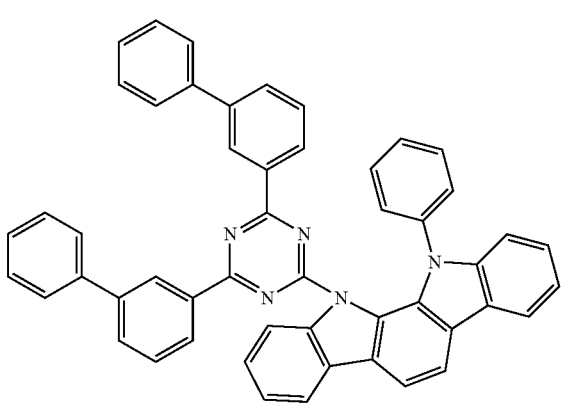

-continued
1-31
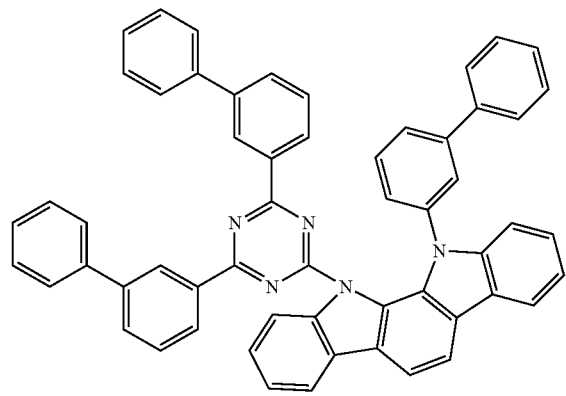
1-32
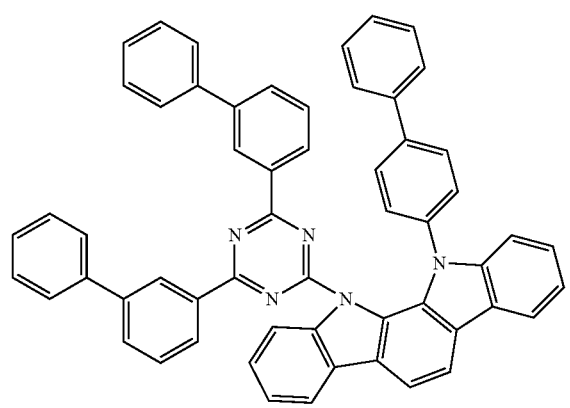
1-33
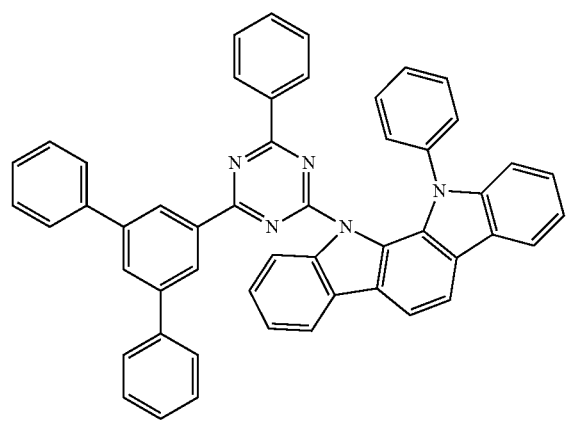
-continued
1-34
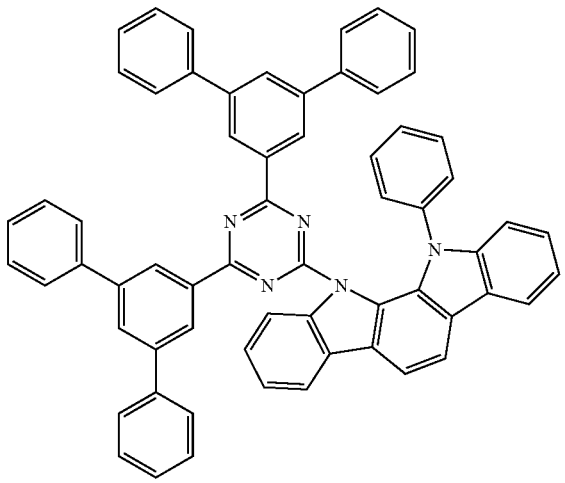
1-35
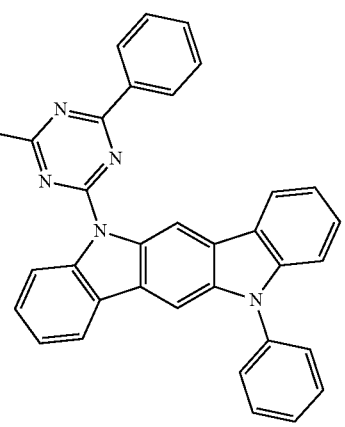
1-36
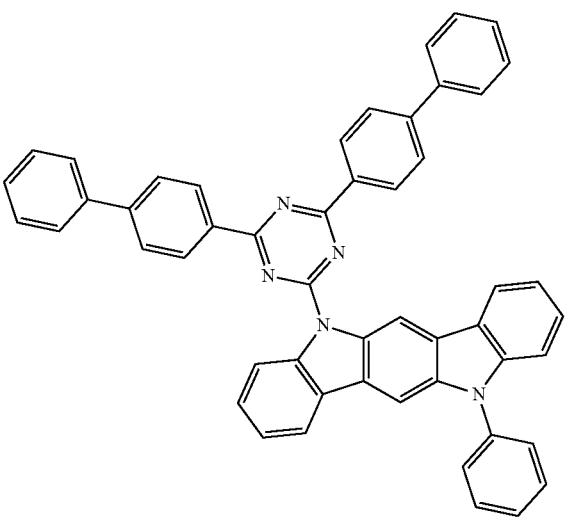

1-37
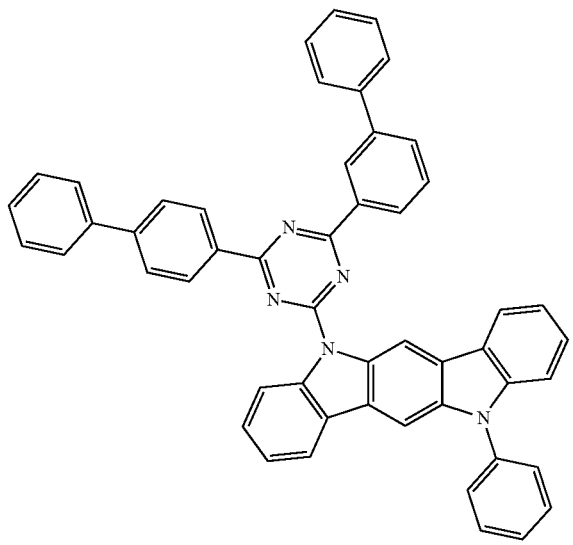
1-38
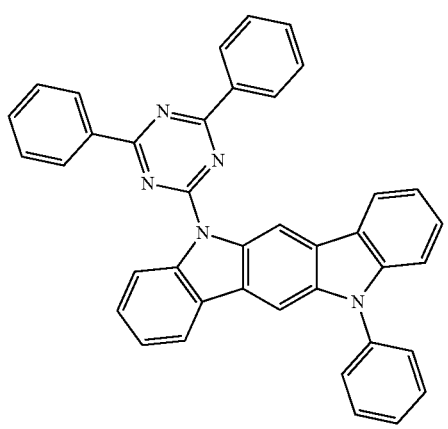
1-39
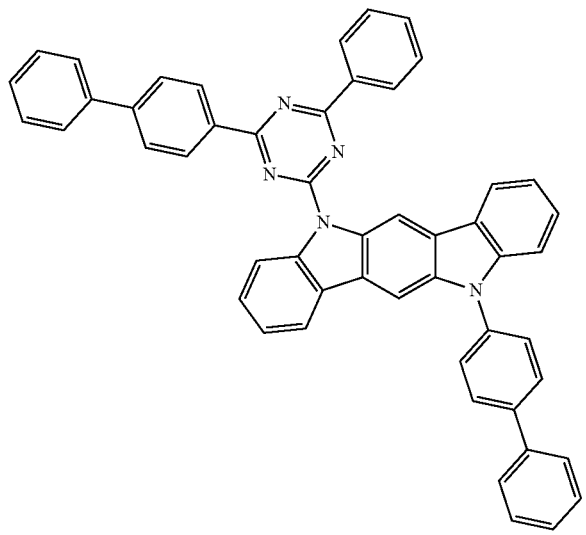
1-40
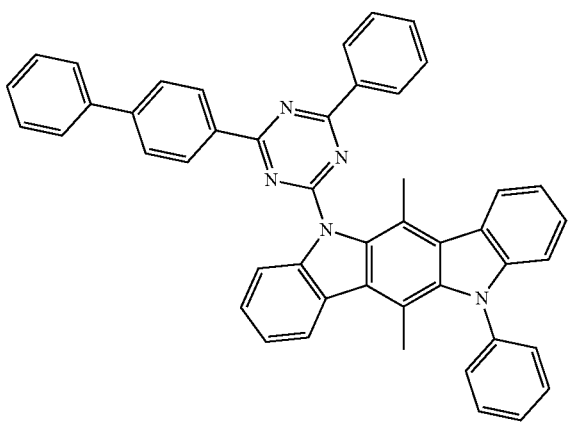
1-41
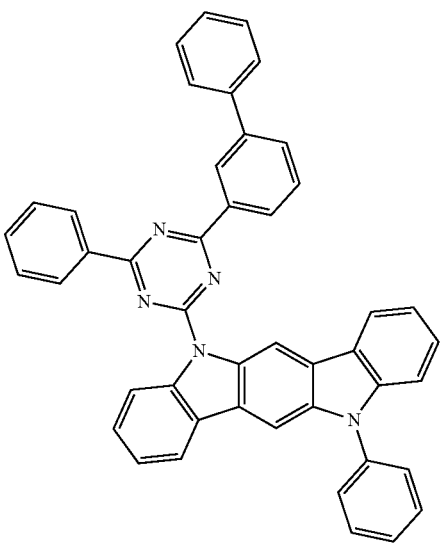
1-42
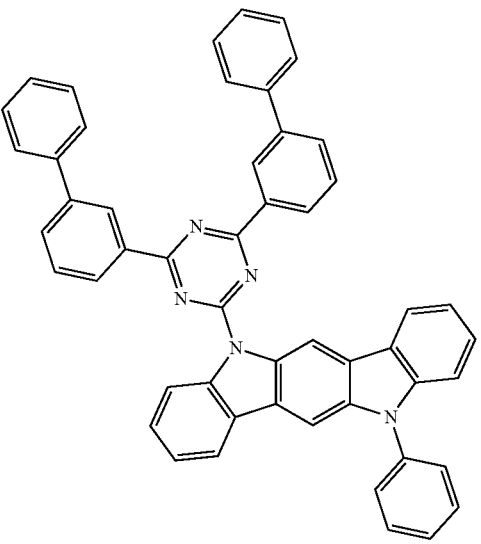

-continued
1-43
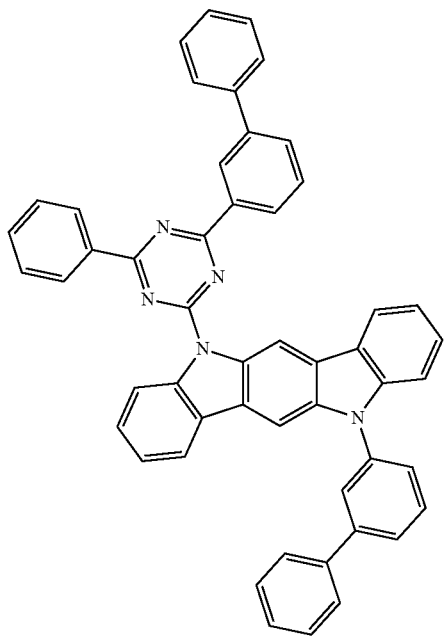
1-44
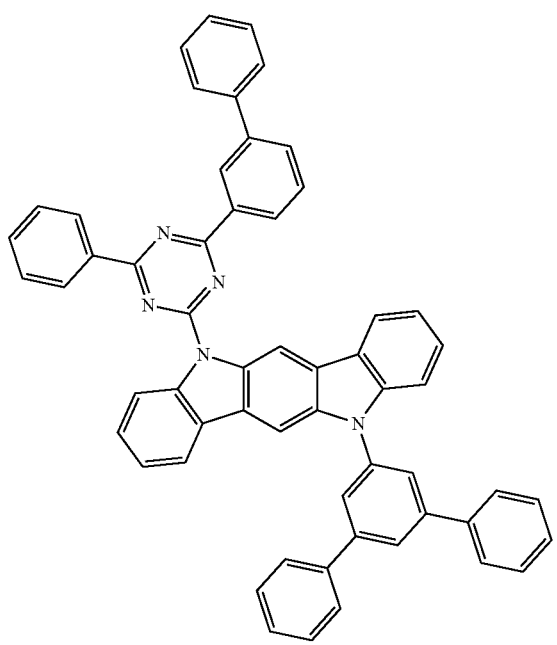
1-45
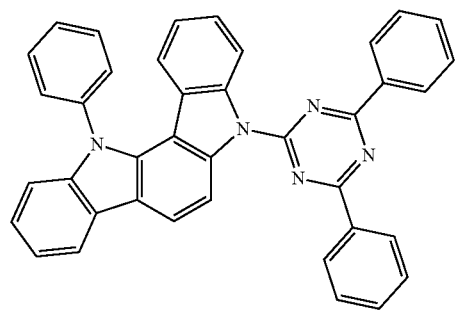
-continued
1-46
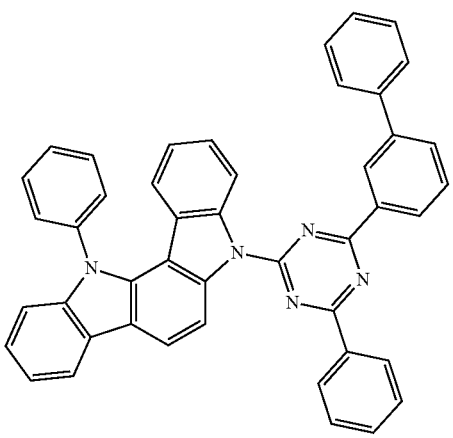
[C9]
1-47
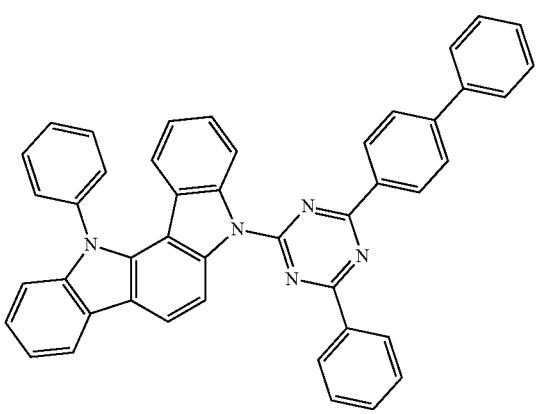
1-48
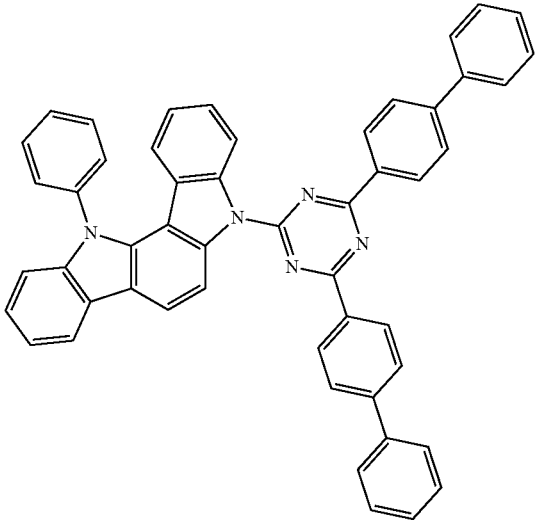

1-49
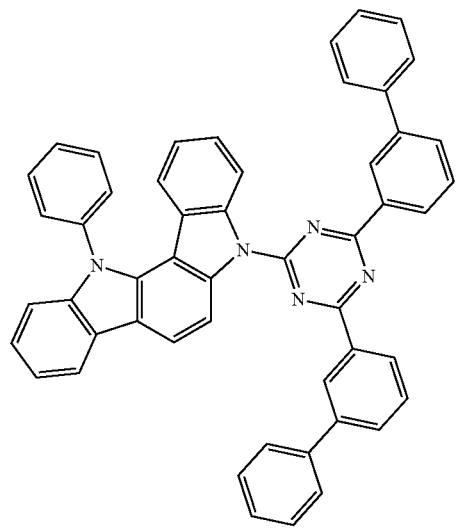
1-50
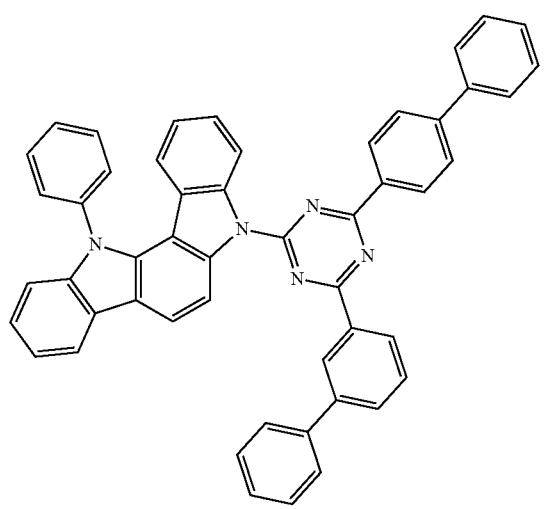
1-51
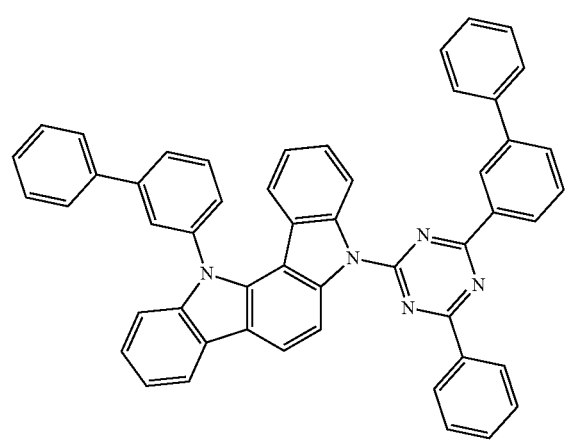
1-52
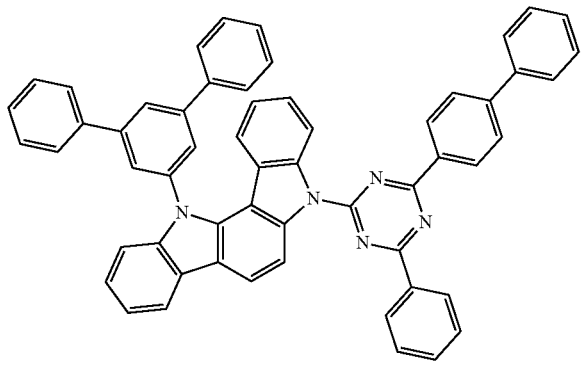
1-53
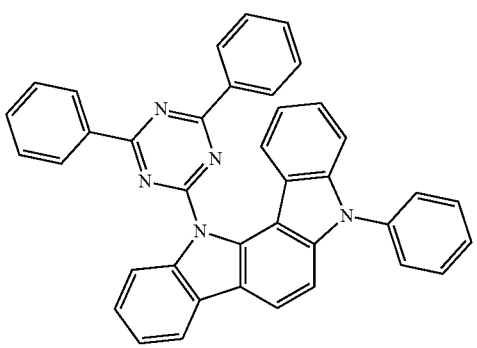
1-54
1-55
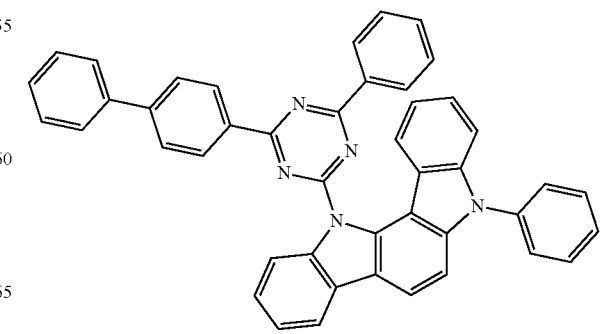

1-56
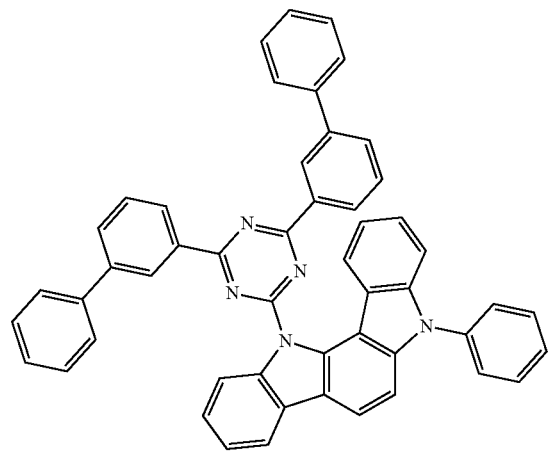
1-57
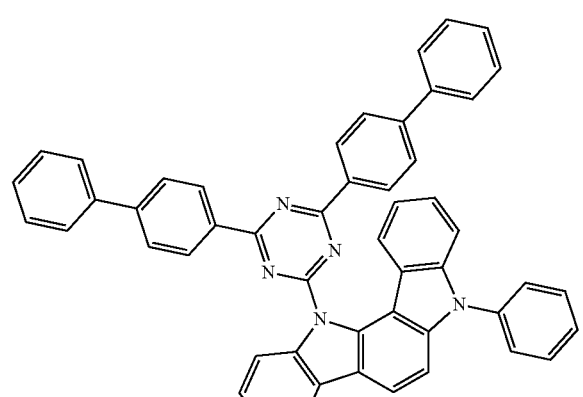
1-58
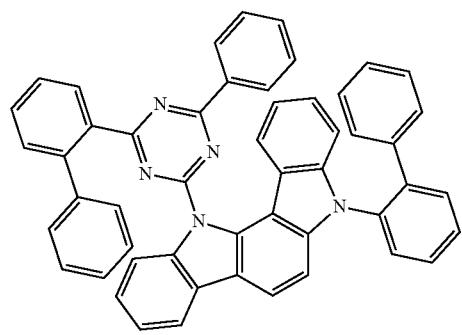
1-59
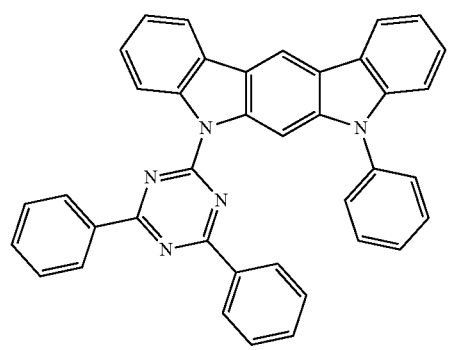
1-60
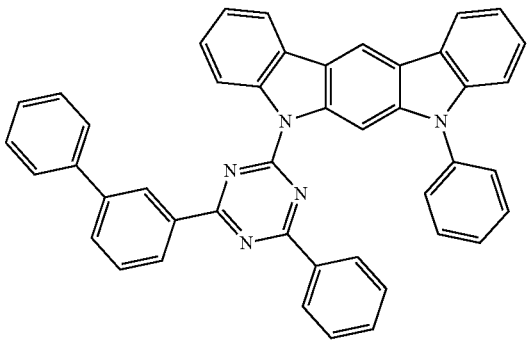
1-61
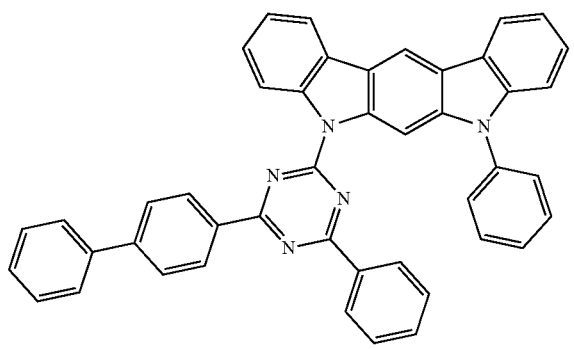
1-62
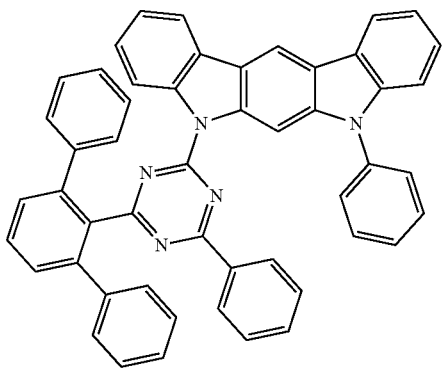
1-63
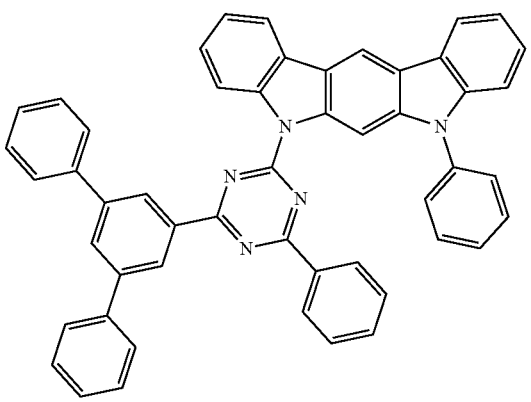

1-64
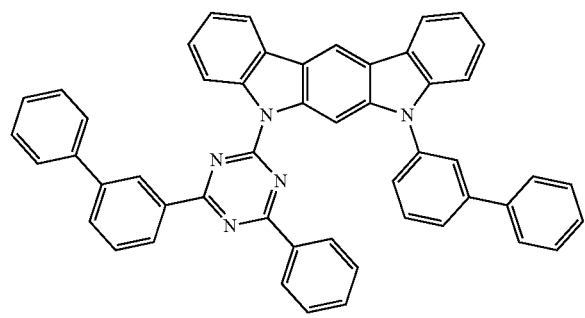
1-65
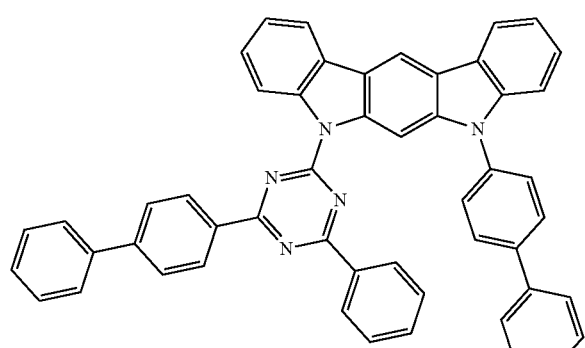
1-66
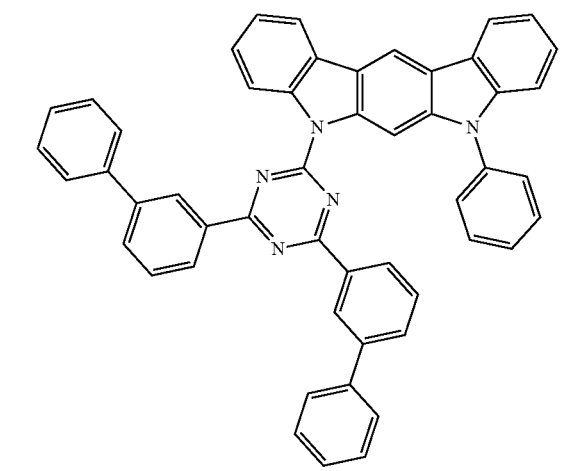
[C11]
1-67
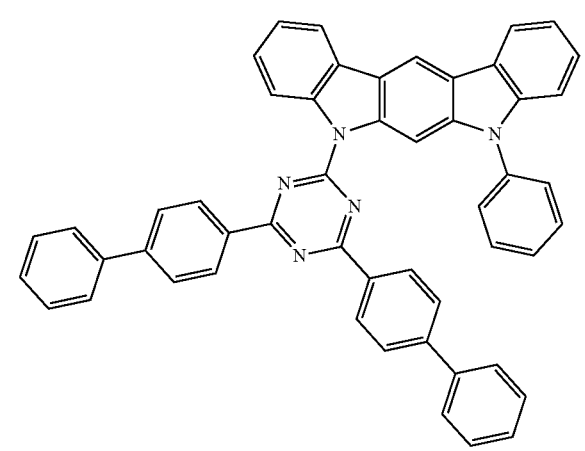
1-68
1-69

1-70
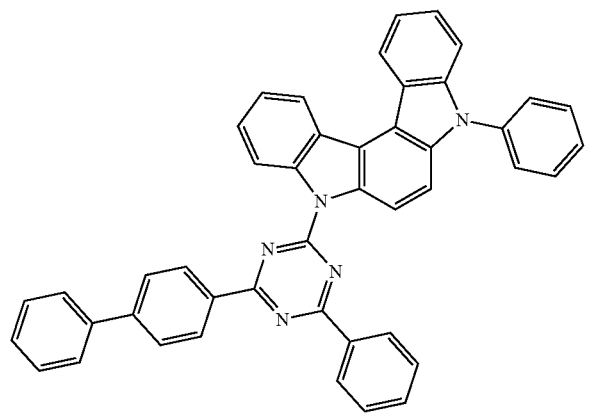
1-71
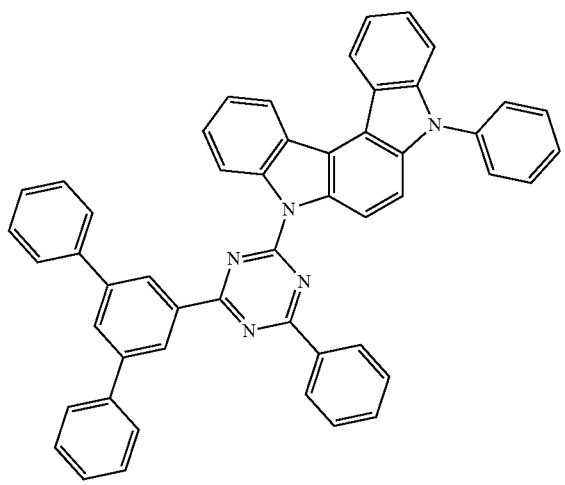
1-72
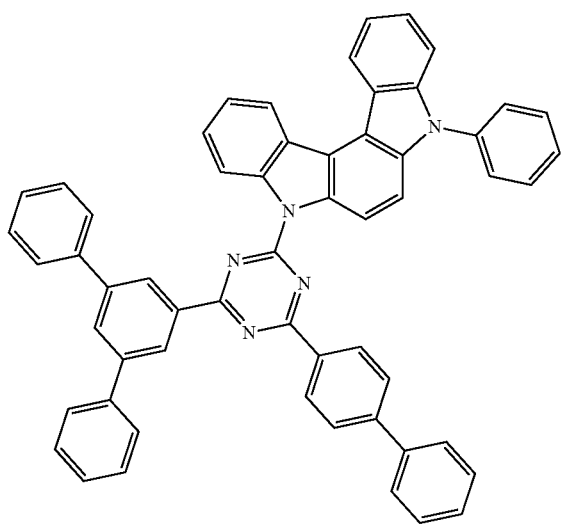
1-73
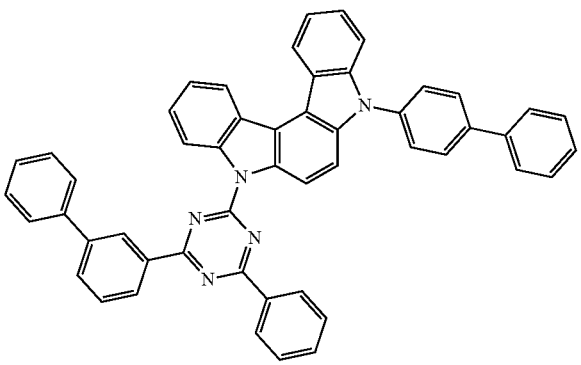
1-74
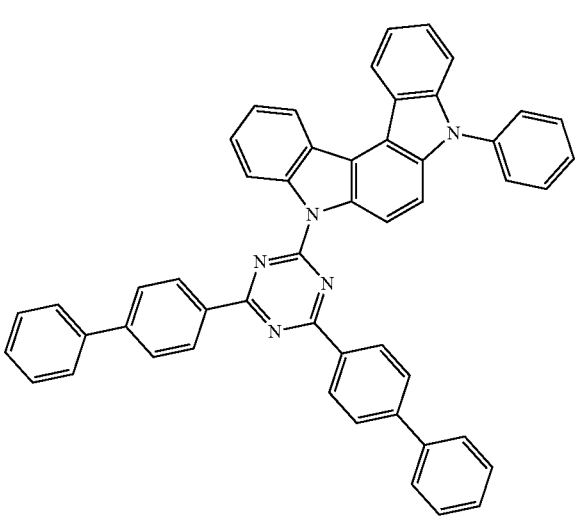
1-75
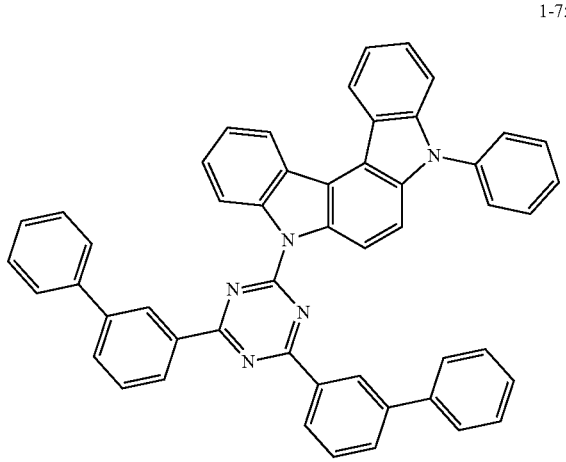 [SMILES: c1ccc(-c2cccc(-c3nc(-c4cccc(-c5ccccc5)c4)nc(-n4c5ccccc5c5c6c7ccccc7n(-c7ccccc7)c6ccc54)n3)c2)cc1]

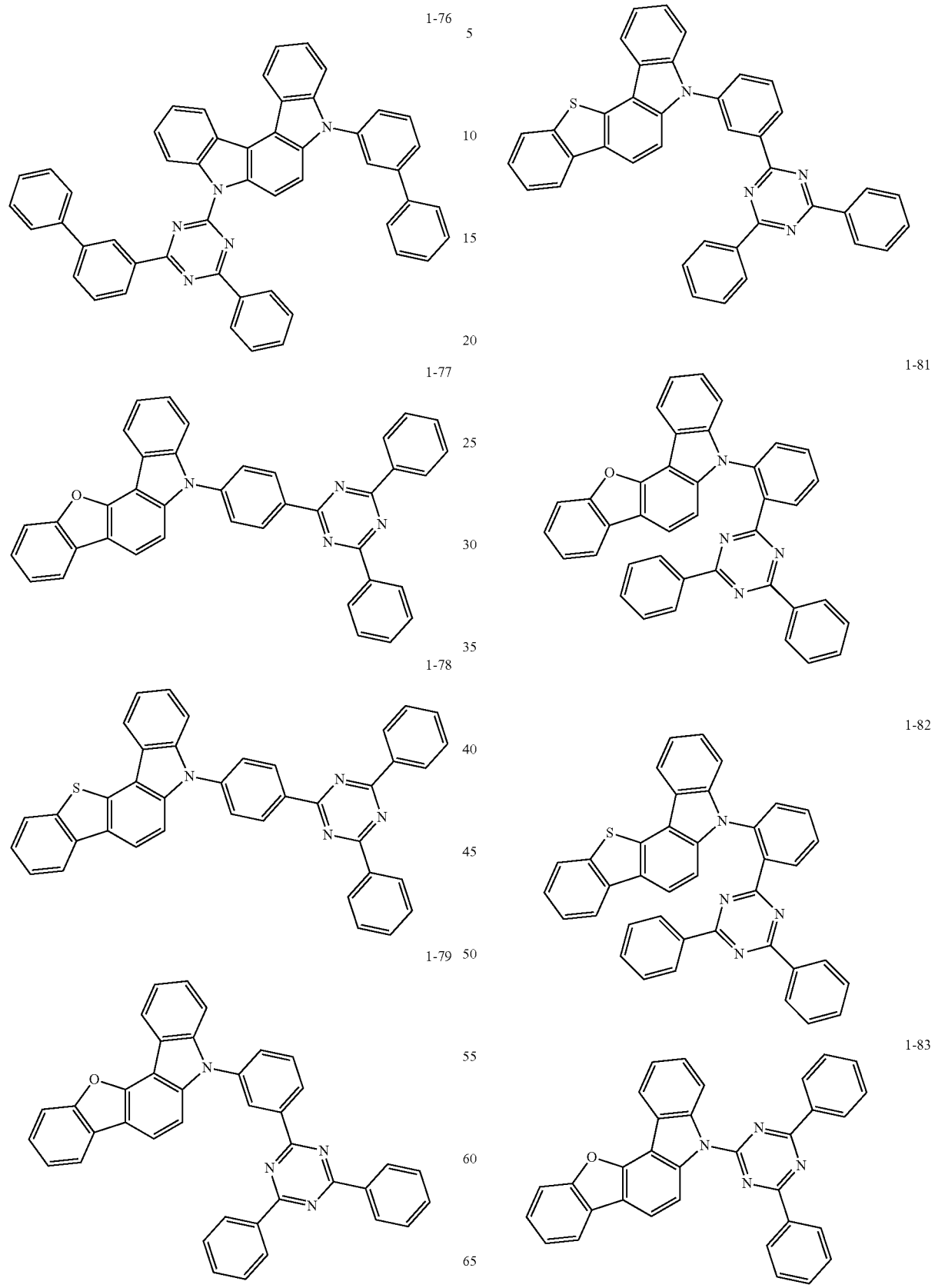

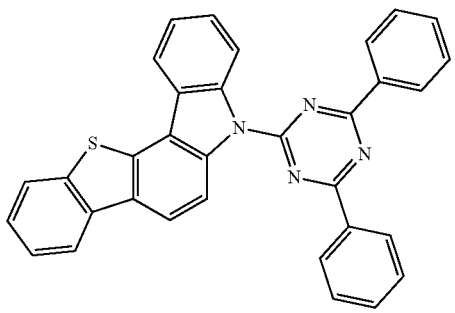

1-84

The second organic compound is preferably the compound represented by General Formula (2).

In General Formula (2), Z represents O, S, or N—Ar³, and is preferably N—Ar³.

Preferable embodiments of General Formula (2) include Formula (3). In General Formula (2) and Formula (3), the same symbols have the same meanings.

Ar² and Ar³ have the same meaning as Ar¹ in General Formula (1). Specific examples and preferable ranges of Ar² and Ar³ are the same as those of Ar¹ in General Formula (1).

That is, Ar² and Ar³ represent an aromatic hydrocarbon group having 6 to 18 carbon atoms, an aromatic heterocyclic group having 3 to 17 carbon atoms or a linked aromatic group in which 2 to 8 of these aromatic rings are linked.

An aromatic hydrocarbon group having 6 to 12 carbon atoms or a linked aromatic group in which 2 to 4 of these rings are linked is preferable. An aromatic hydrocarbon group having 6 to 10 carbon atoms or a linked aromatic group in which 2 to 3 of these rings are linked is more preferable.

R² has the same meaning as R¹ in General Formula (1). Specific examples and preferable ranges of R² are the same as those of R¹ in General Formula (1).

e and h represent an integer of 0 to 4, and f and g represent an integer of 0 to 3.

Specific examples of compounds represented by General Formula (2) are shown below, but the present invention is not limited to such exemplary compounds.

[13]

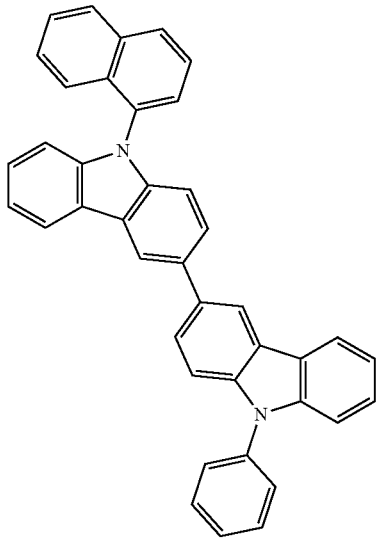

2-1

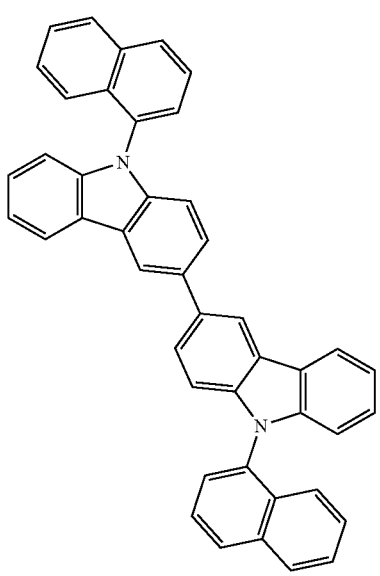

2-2

2-3
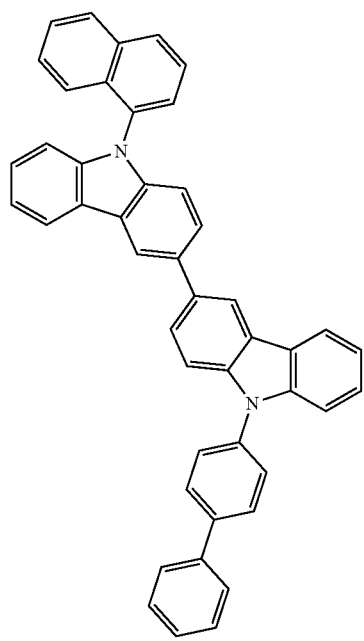
2-5
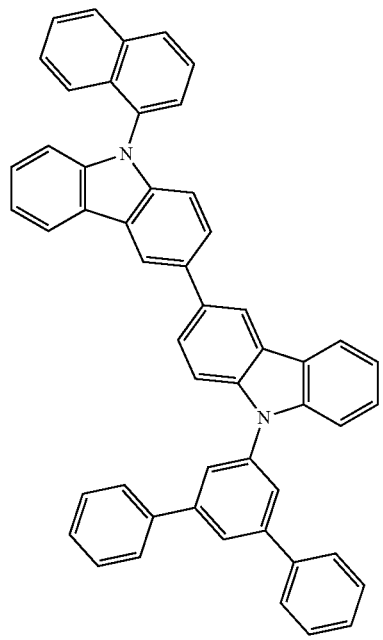
2-4
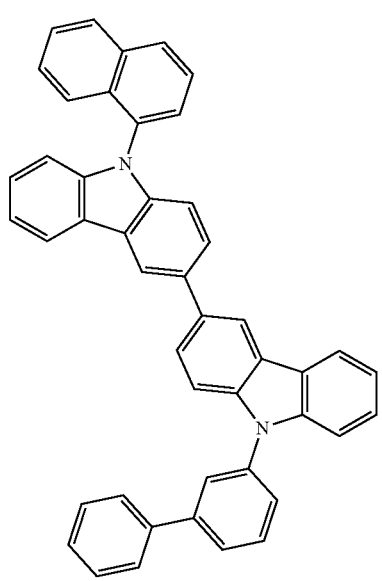
2-6
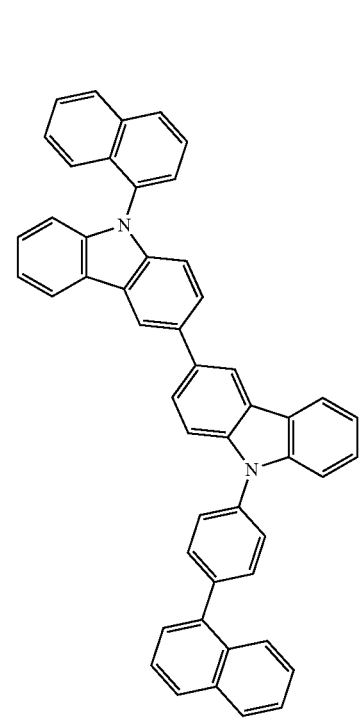

2-7
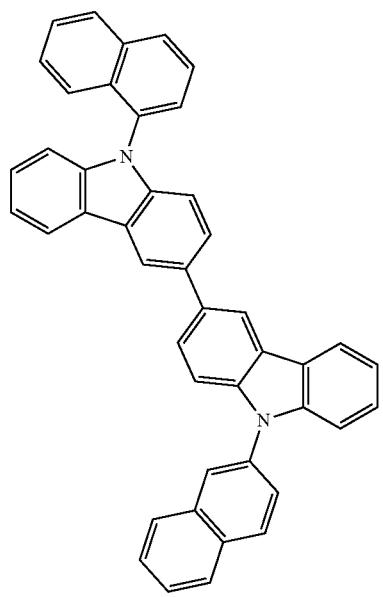
2-8
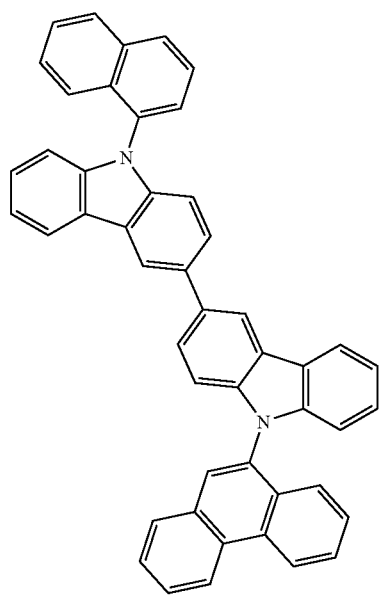
2-9
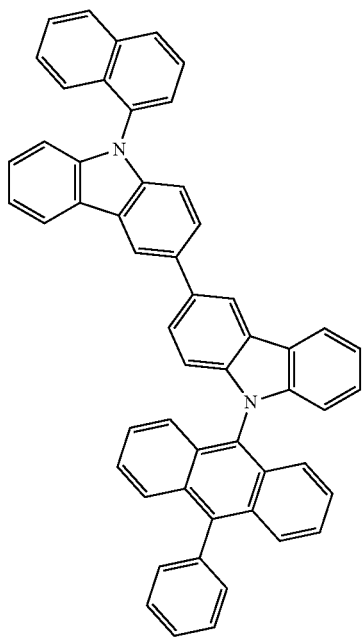
[14]
2-10
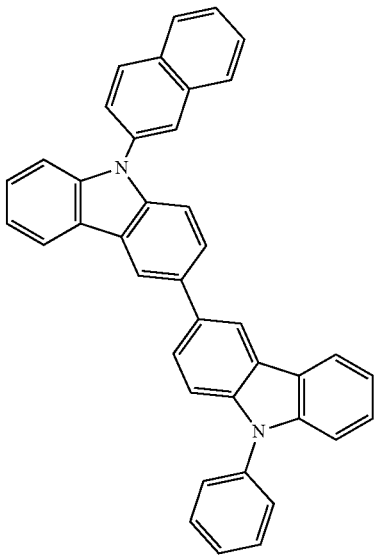

2-11
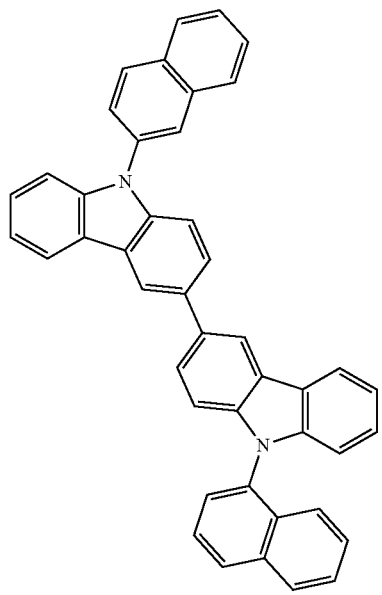
2-12
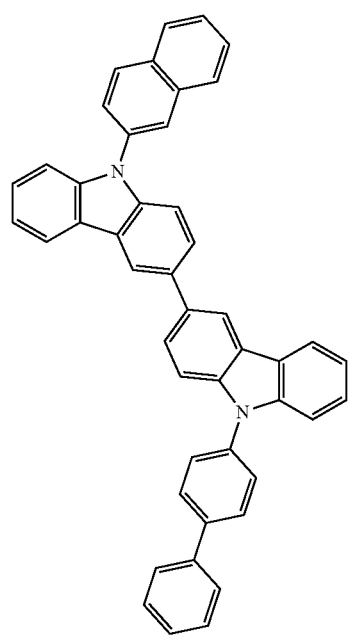
2-13
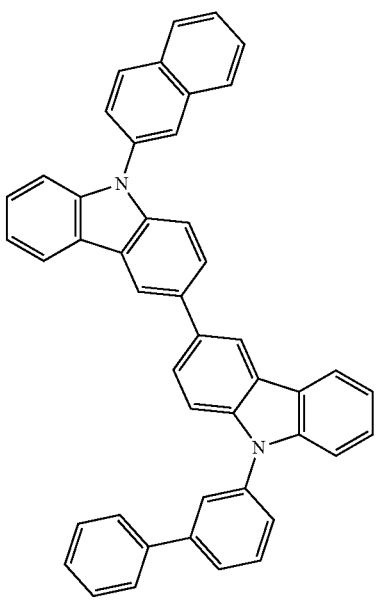
2-14
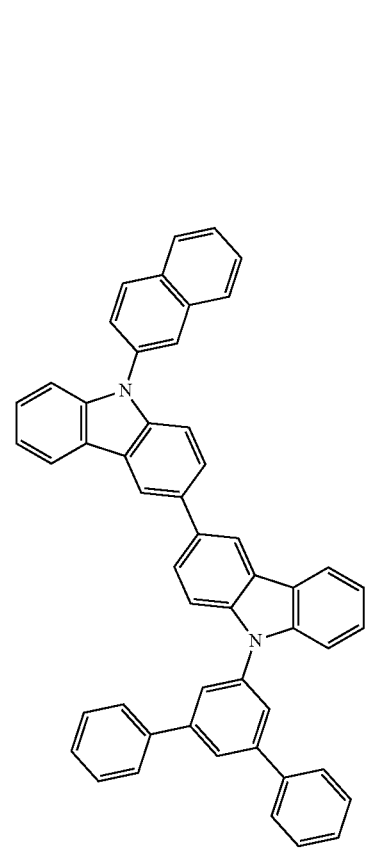

2-15
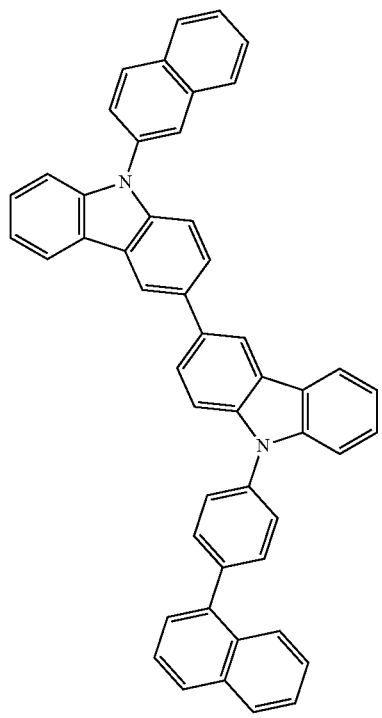
2-17
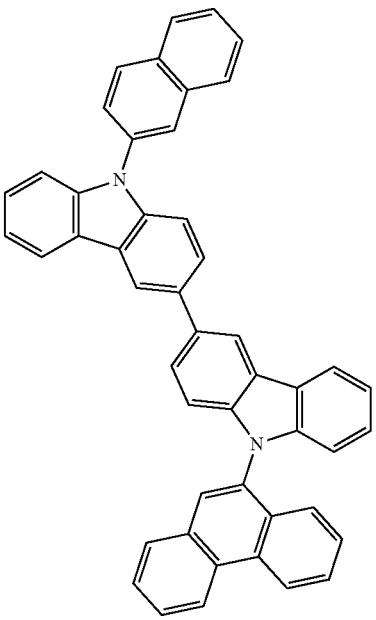
2-16
2-18
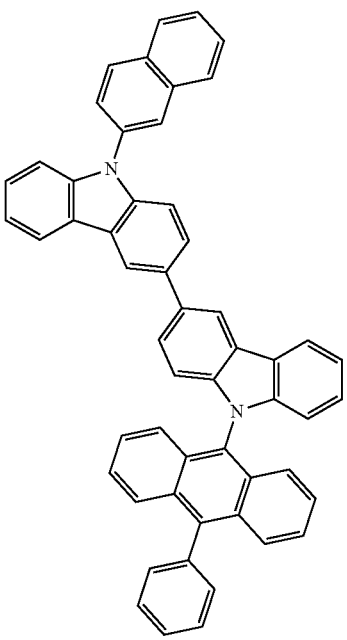

[15]
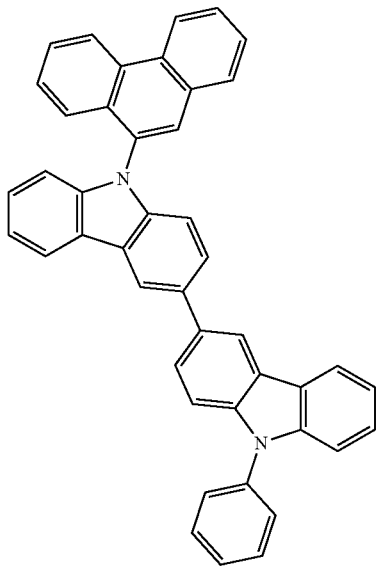
2-19
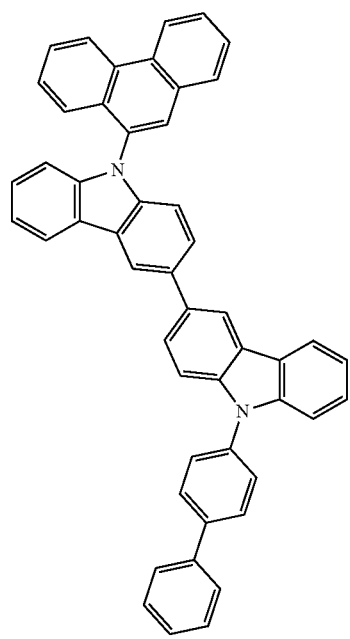
2-20
2-21
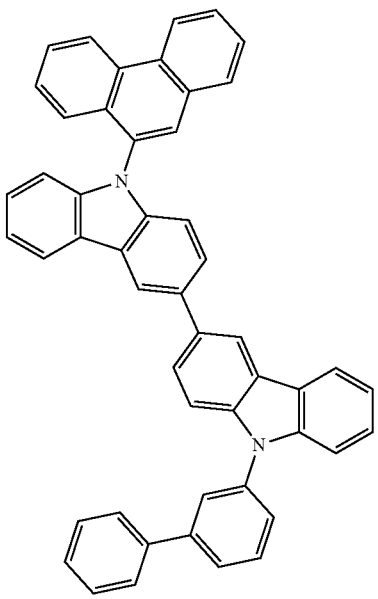
2-22
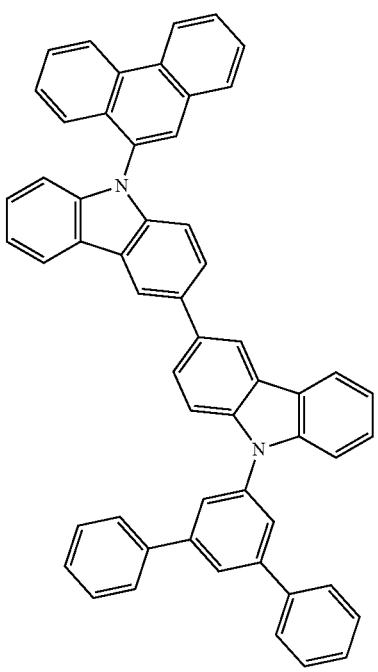

2-23
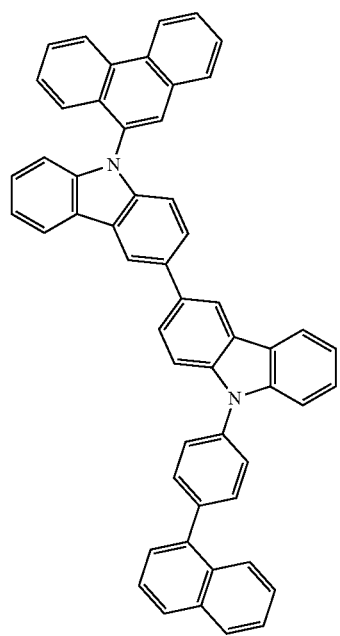
2-24
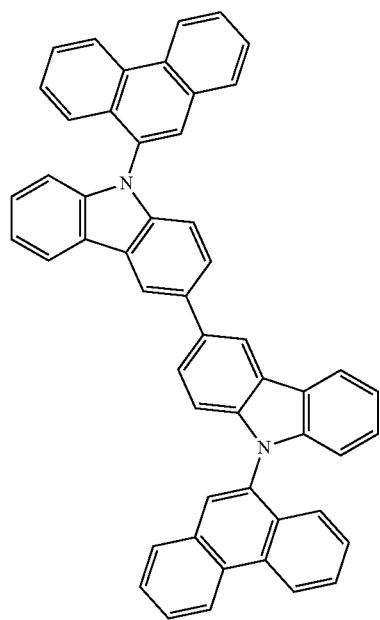
2-25
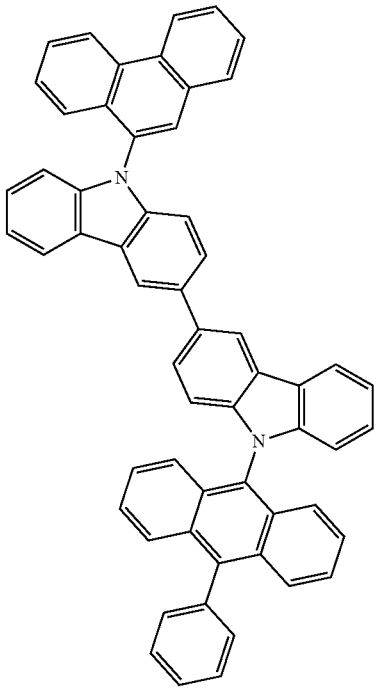
2-26
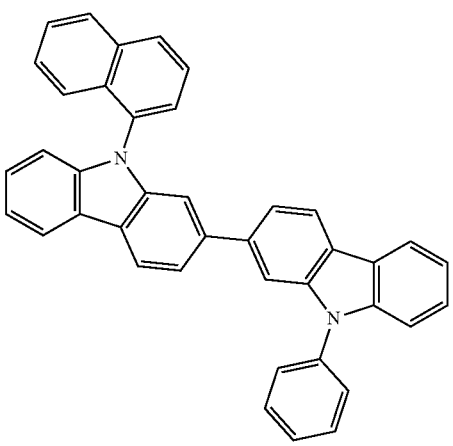
2-27
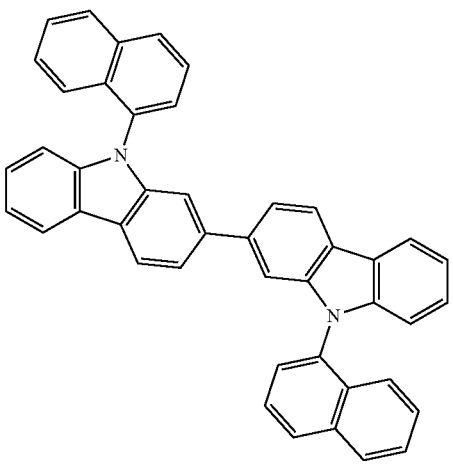

[16]
2-28
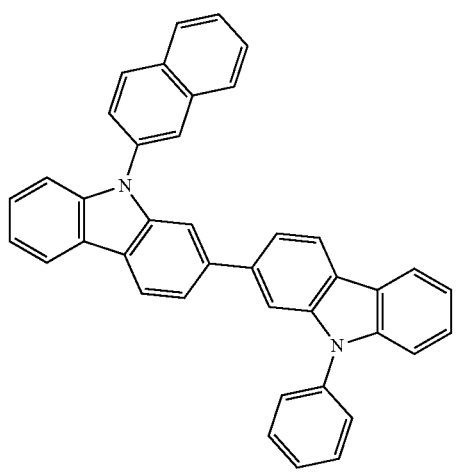
2-29
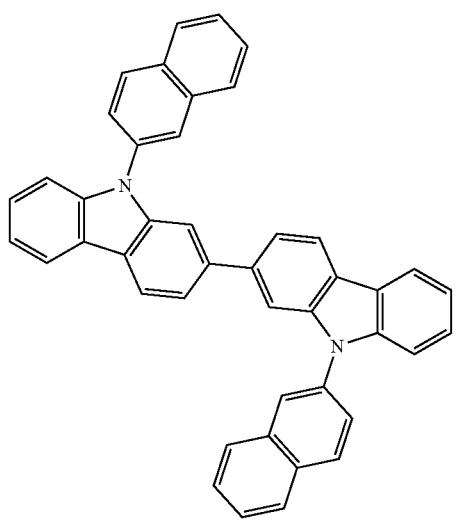
2-30
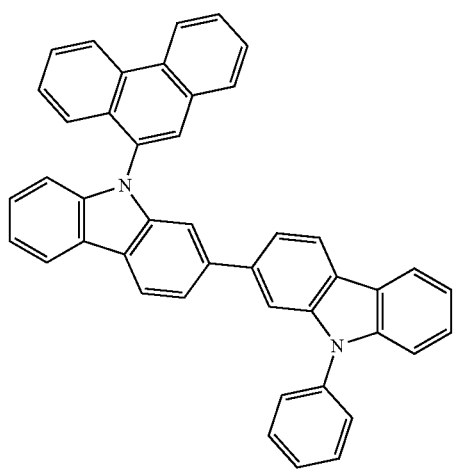
2-31
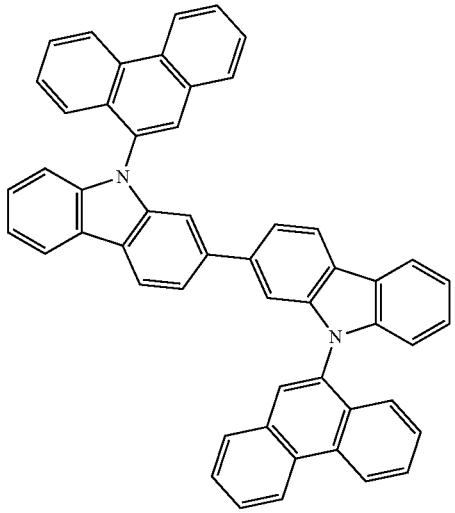
2-32
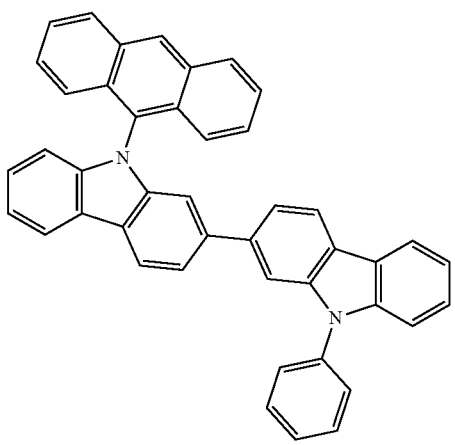
2-33
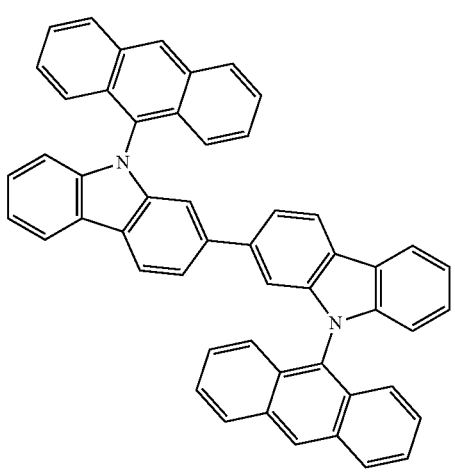

2-34
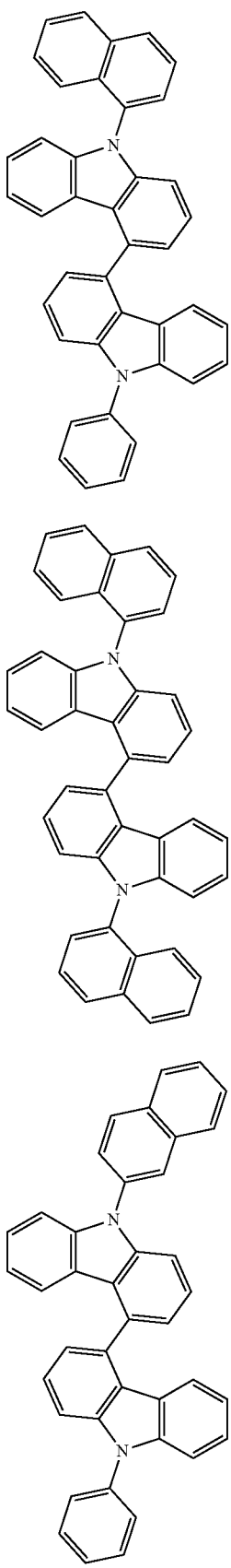
2-35
2-36
2-37
2-38

2-39
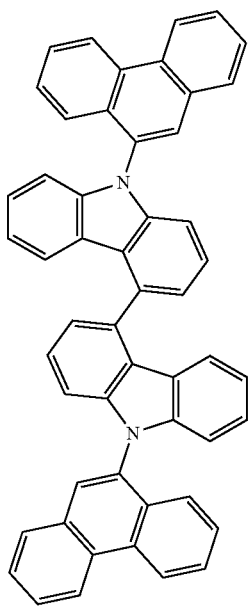
2-40
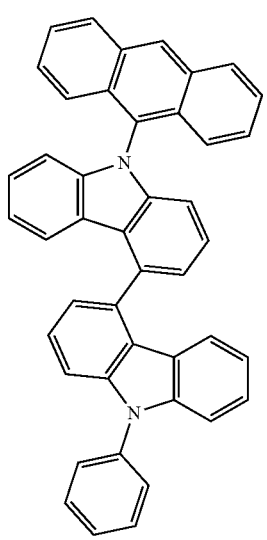
2-41
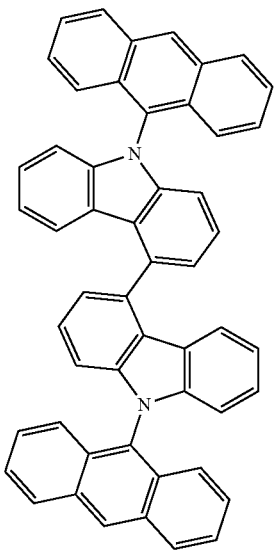
2-42
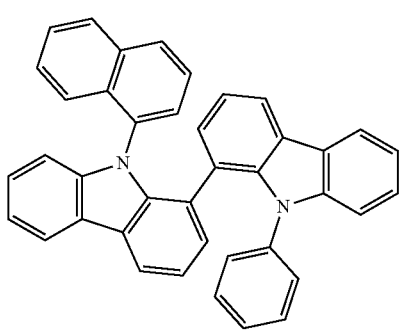
2-43
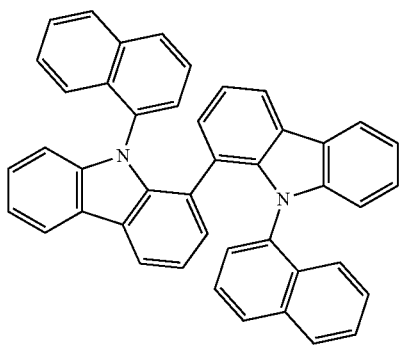
2-44
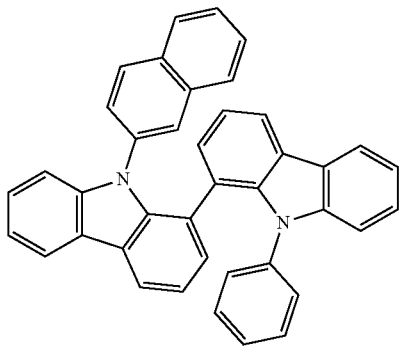

-continued
2-45
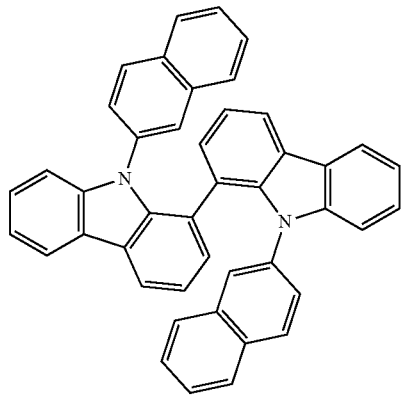
2-46
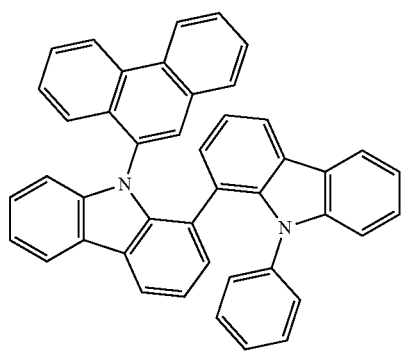
2-47
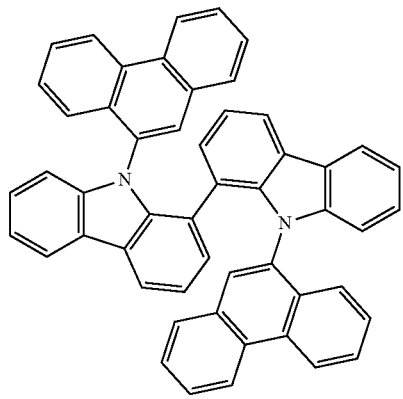
2-48
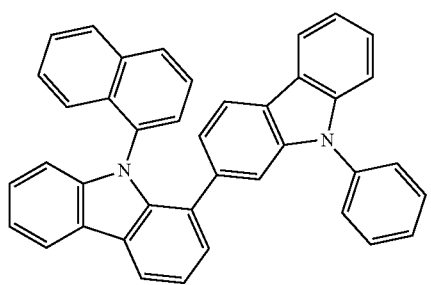
-continued
2-49
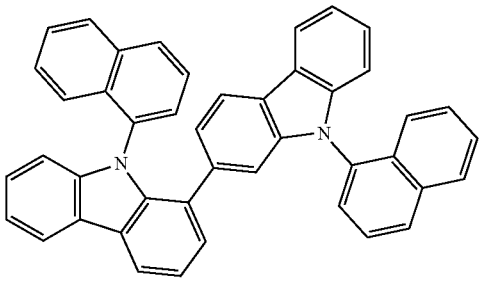
2-50
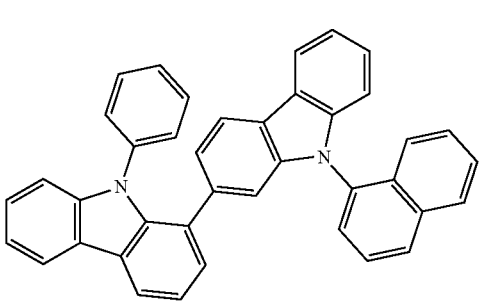
2-51
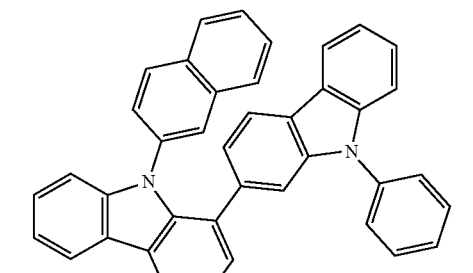
2-52
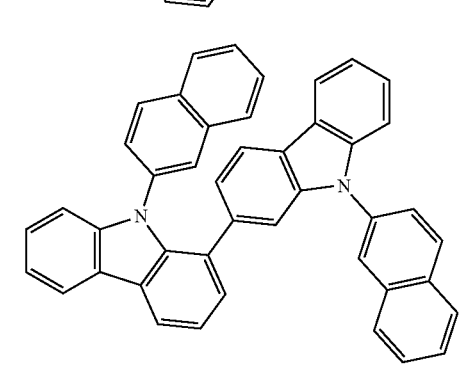
2-53
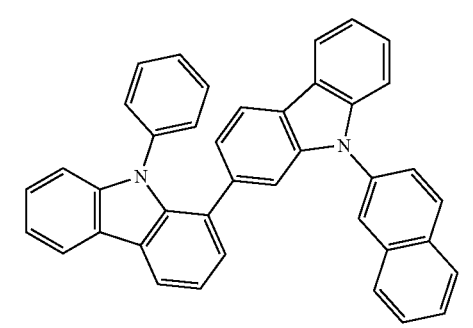

2-54
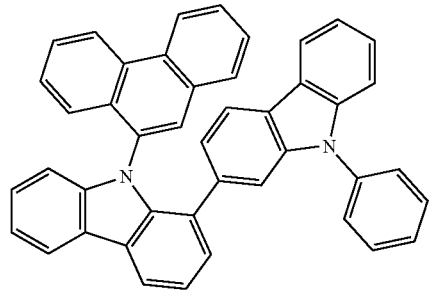
2-55
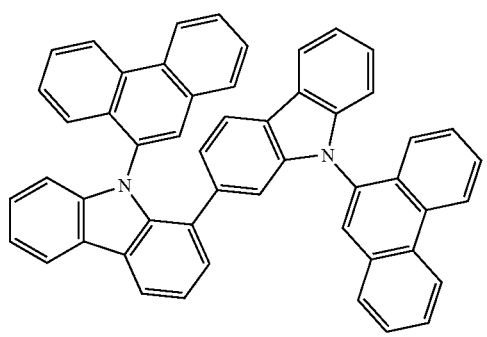
2-56
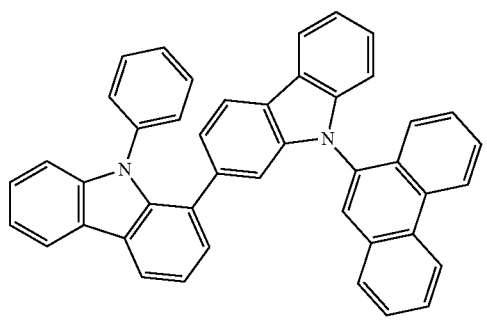
2-57
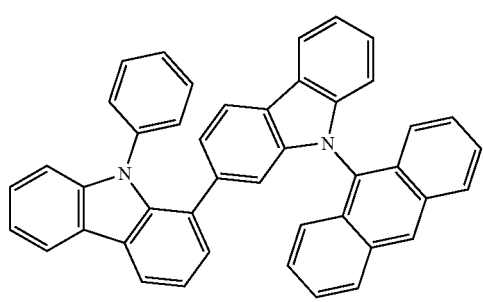
2-58
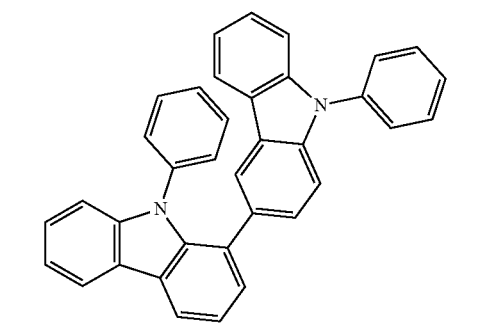
2-59
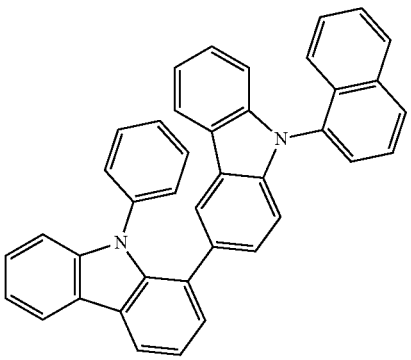
2-60
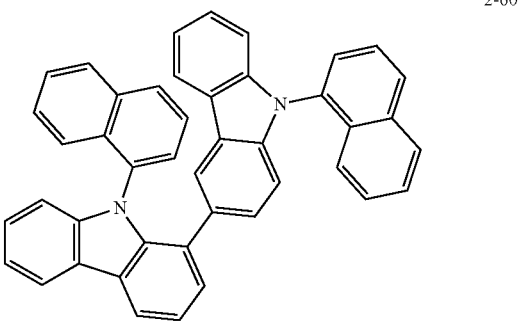
[18]
2-61
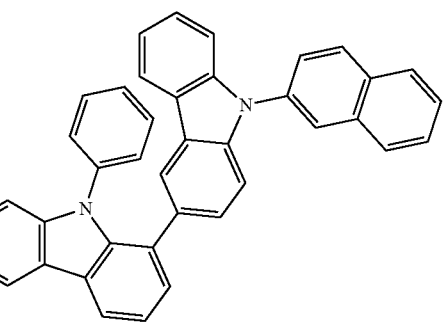
2-62
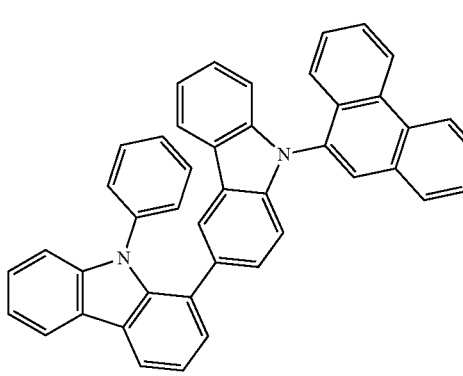

-continued
2-63
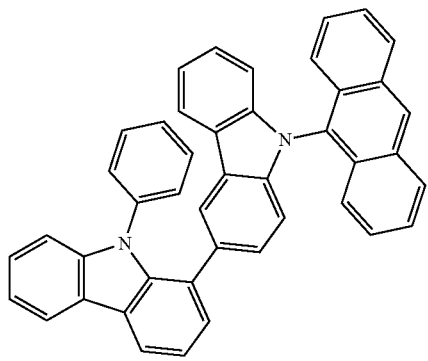
2-64
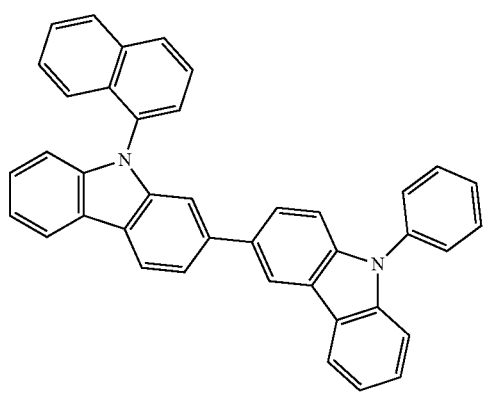
2-65
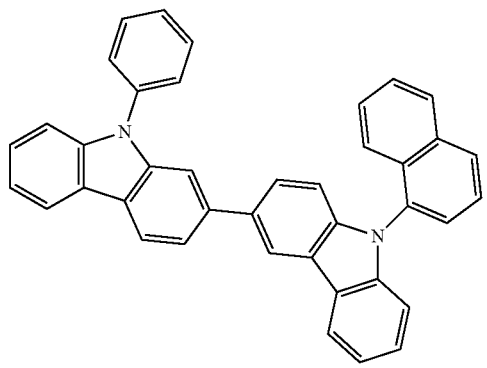
2-66
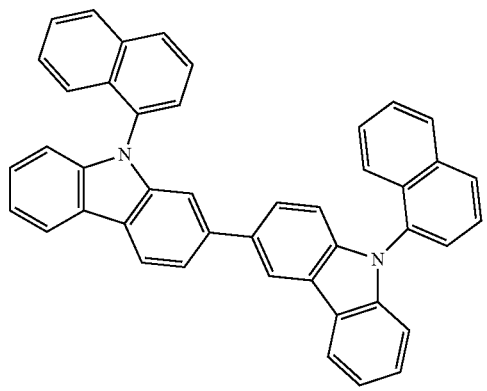
-continued
2-67
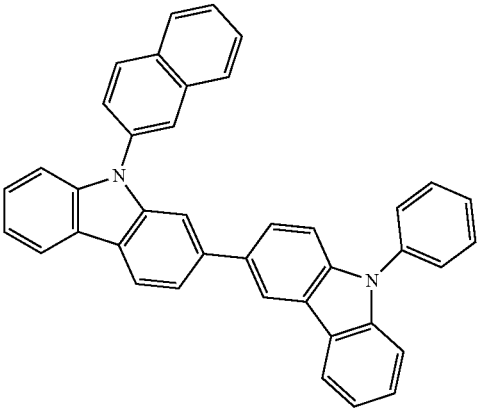
2-68
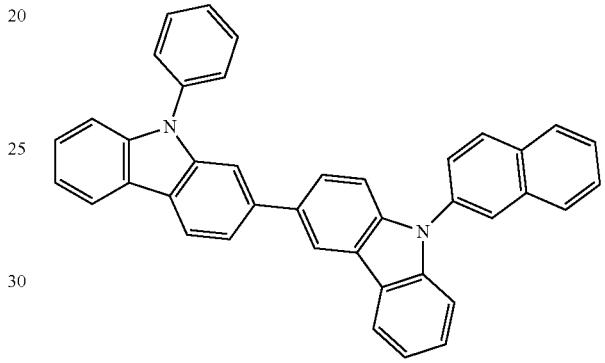
2-69
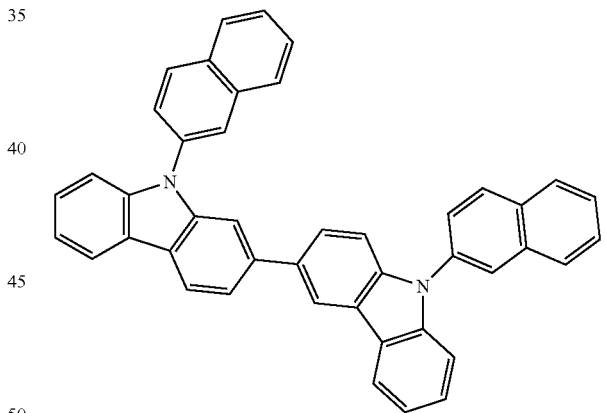
2-70
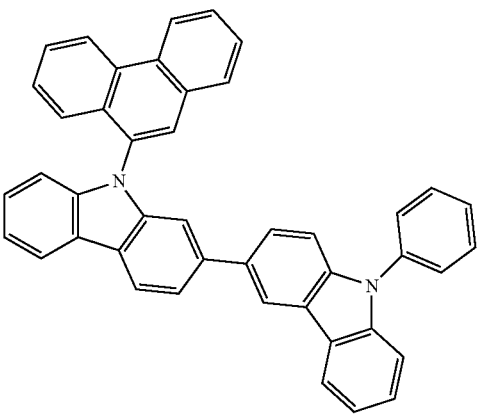

2-71
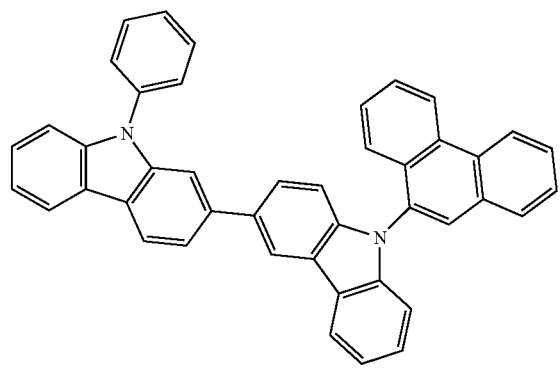
2-72
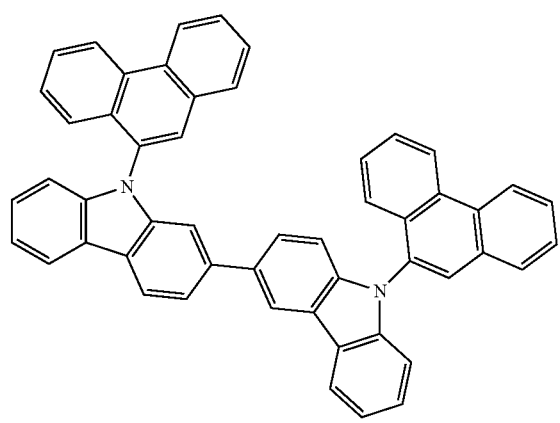
2-73
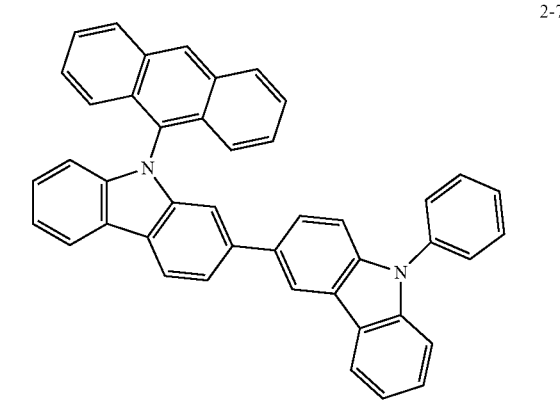
2-74
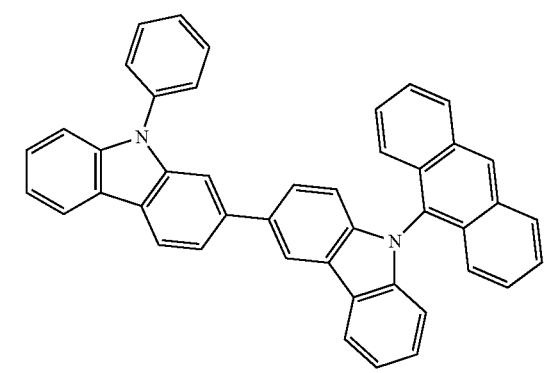
2-75
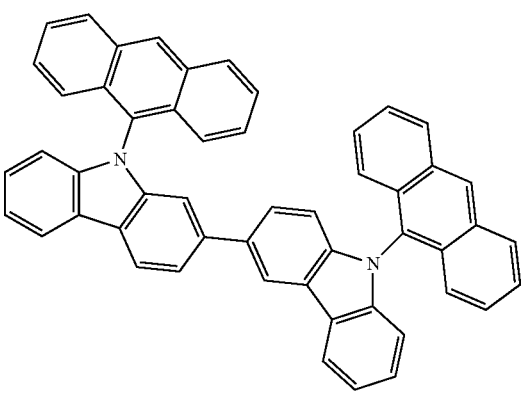
2-76
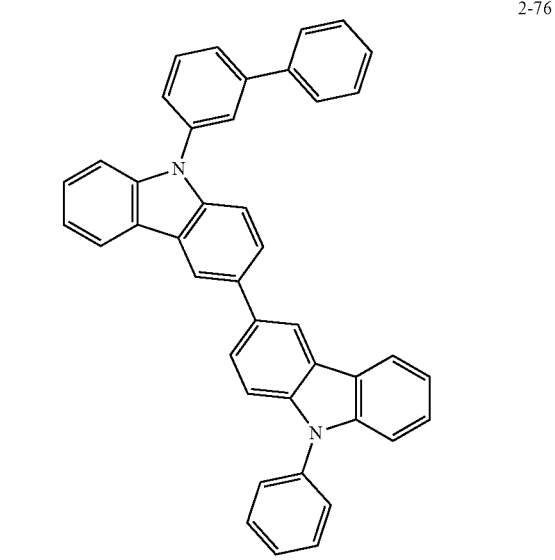
2-77
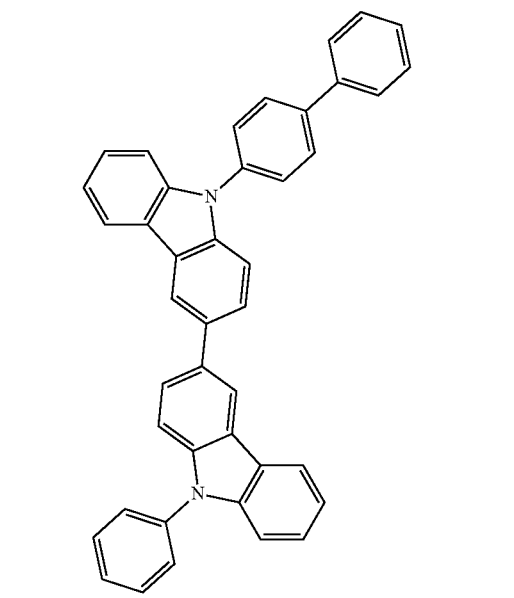

2-78
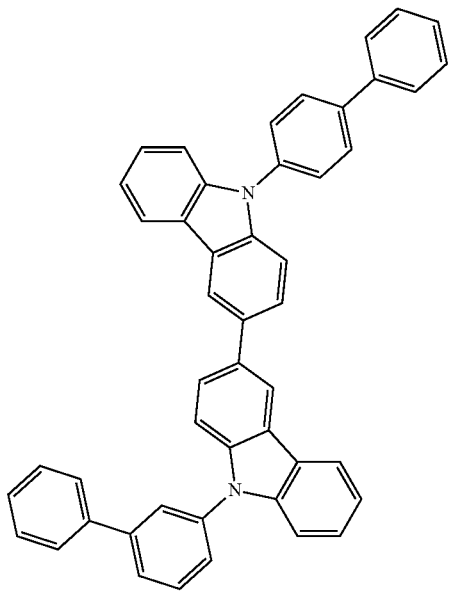
2-81
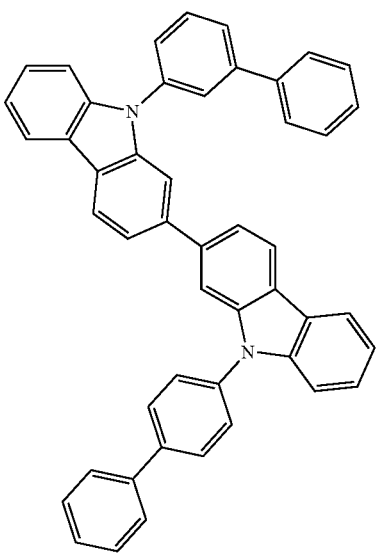
2-79
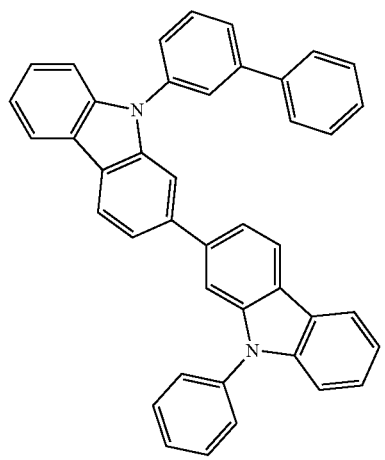
2-82
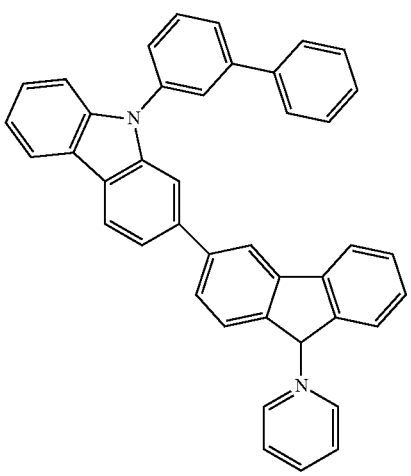
2-80
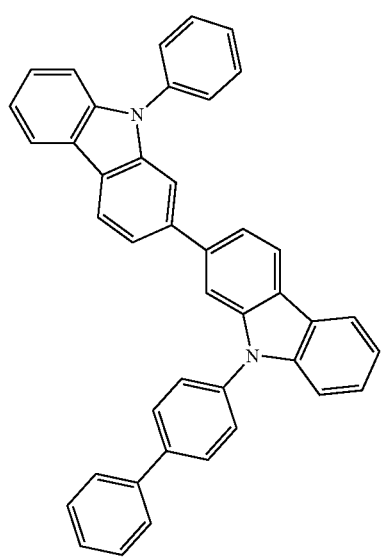
2-83
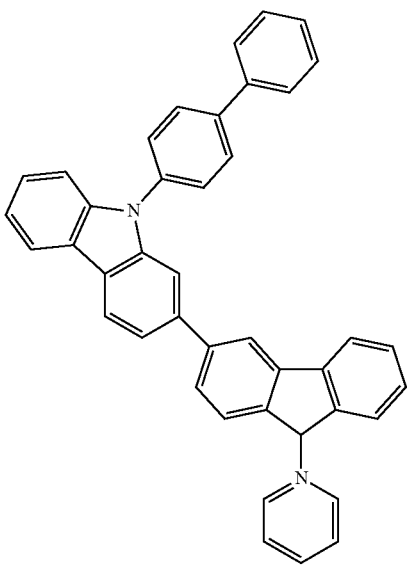

2-84
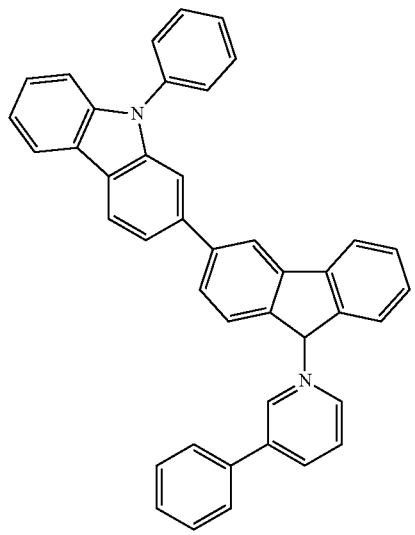
2-85
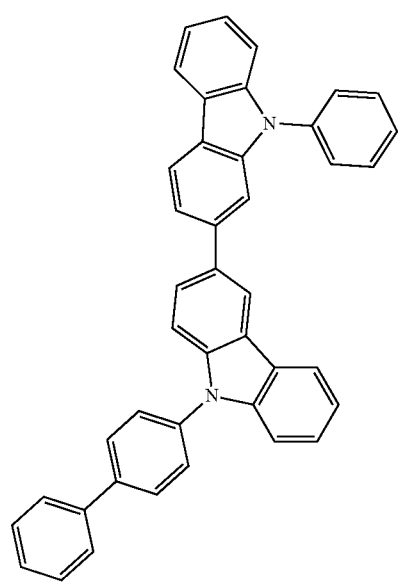
2-86
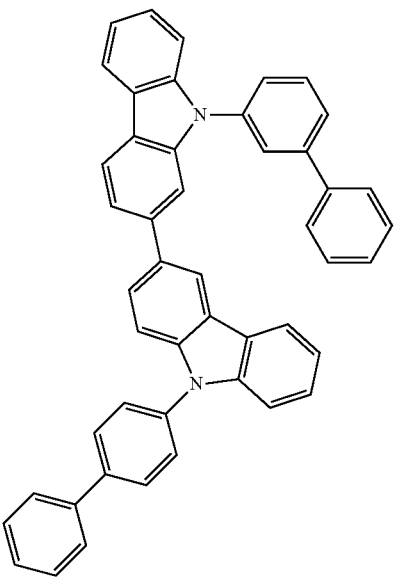
2-87
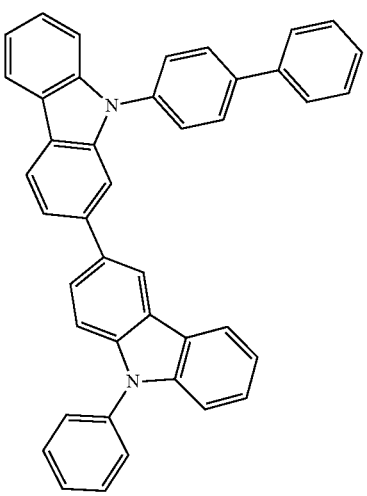
2-88
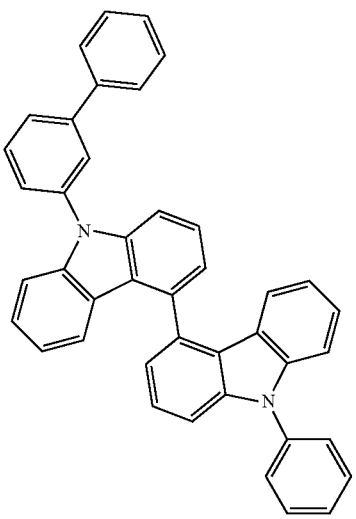

2-89
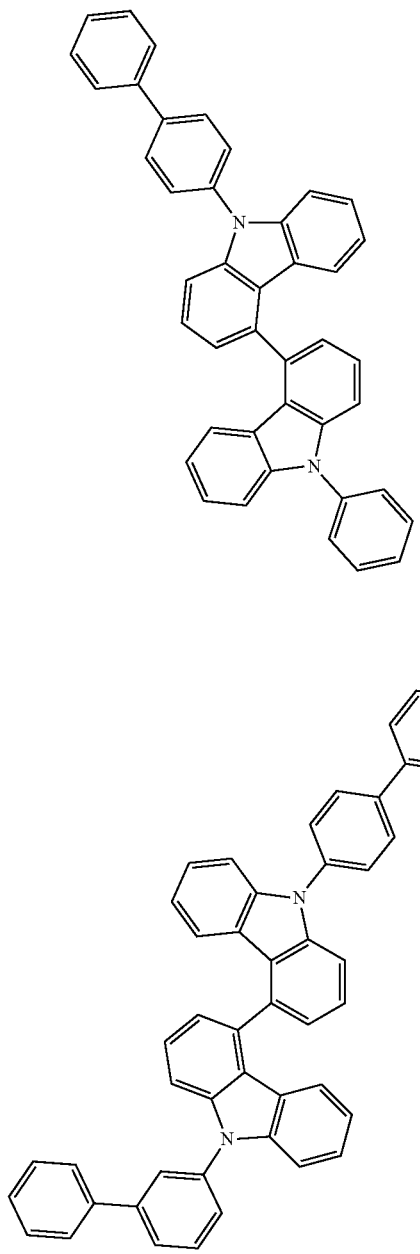
2-90
2-91
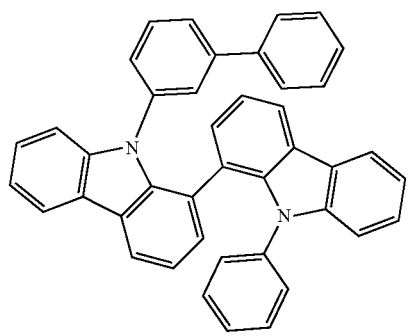
2-92
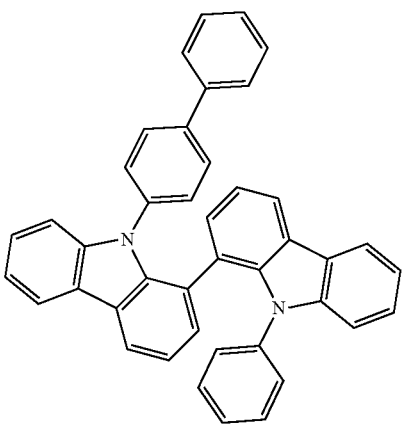
2-93
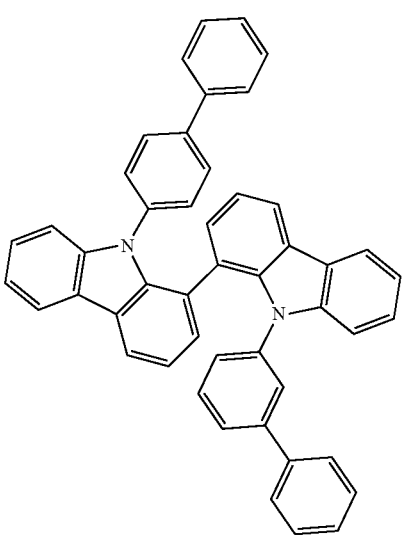
2-94
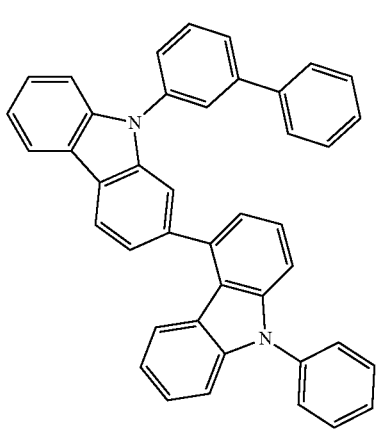

2-95
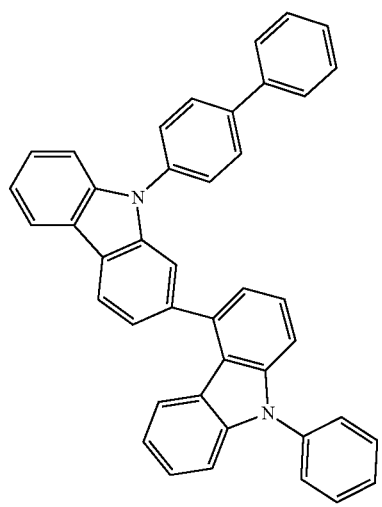
2-96
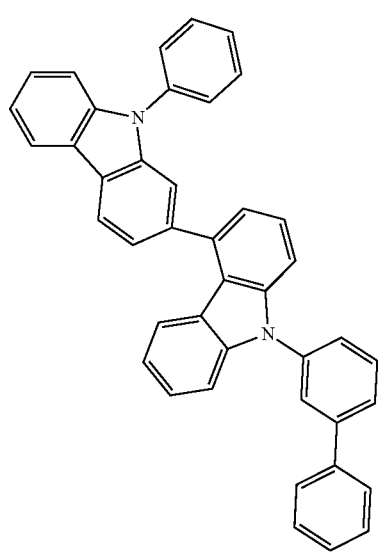
2-97
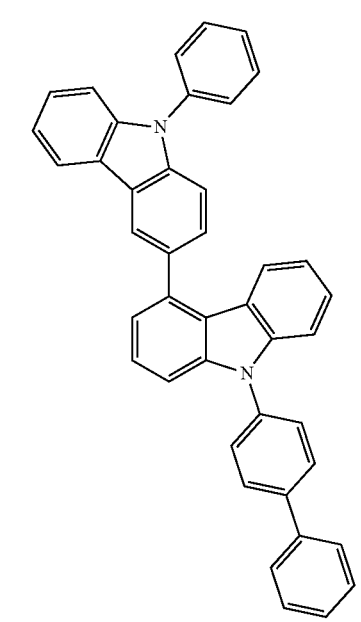
2-98
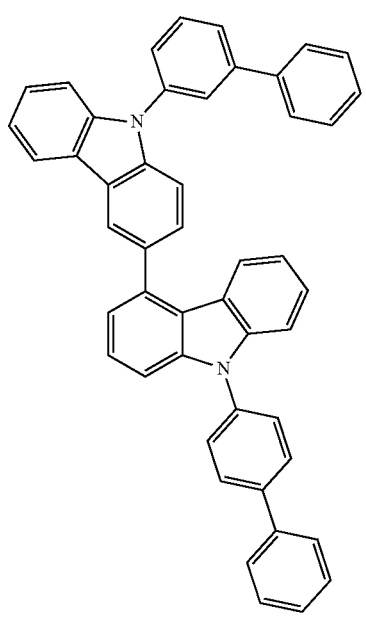
2-99
2-100
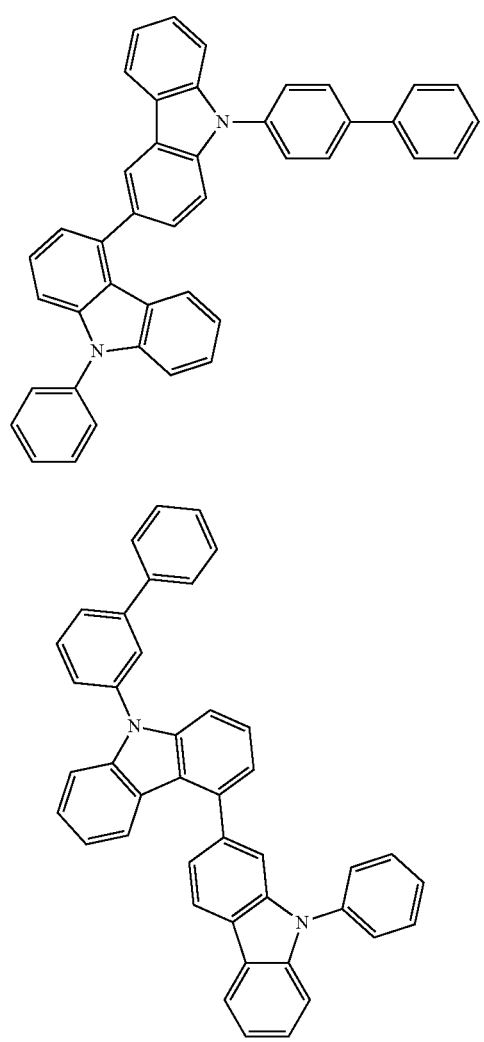

[22]
2-101
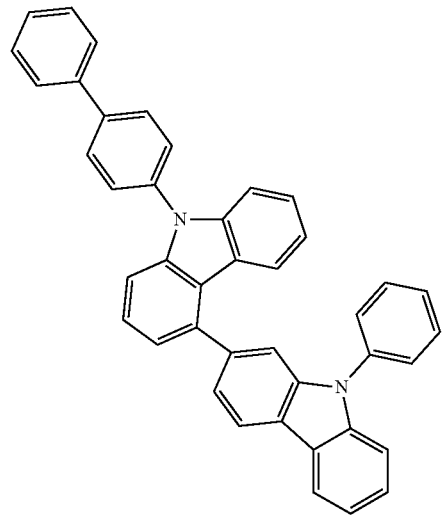
2-102
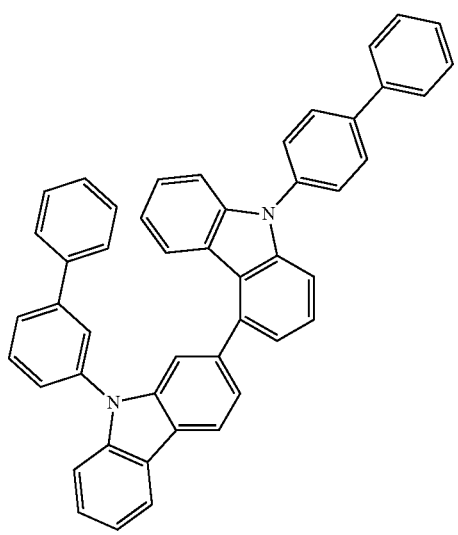
2-103
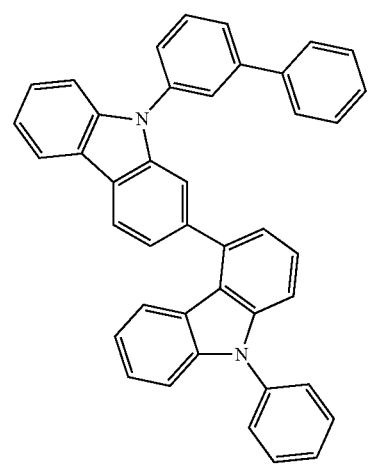
2-104
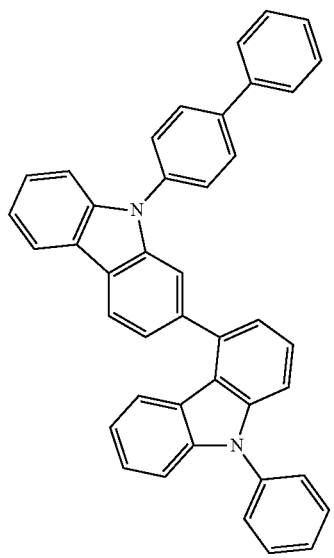
2-105
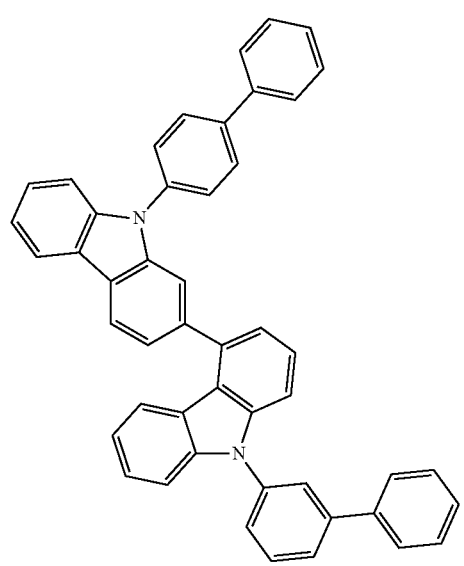
2-106
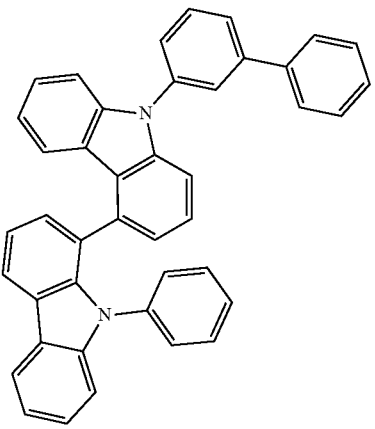

[23]
2-107
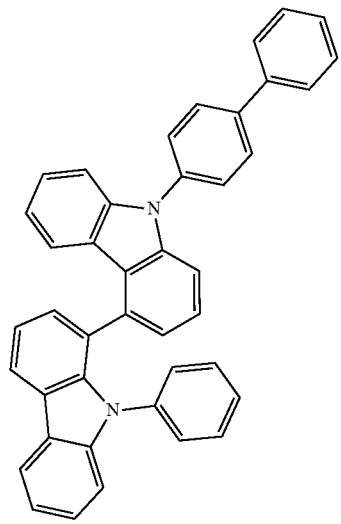
2-108
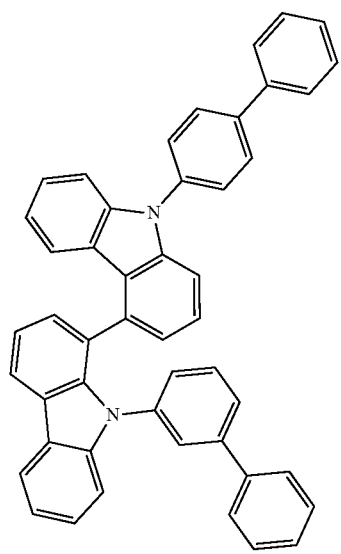
2-109
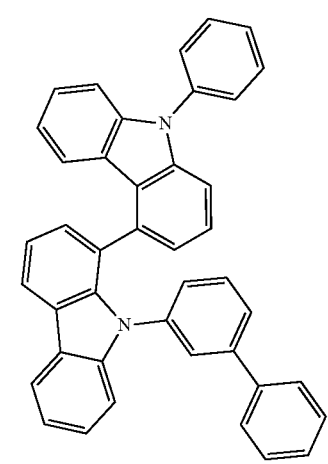
2-110
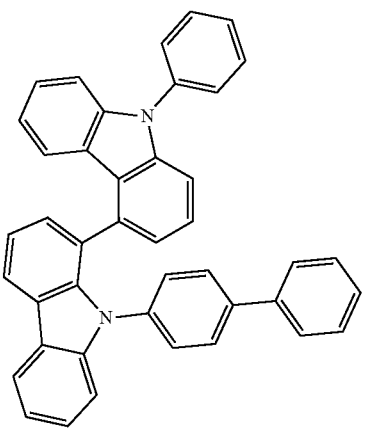
2-111
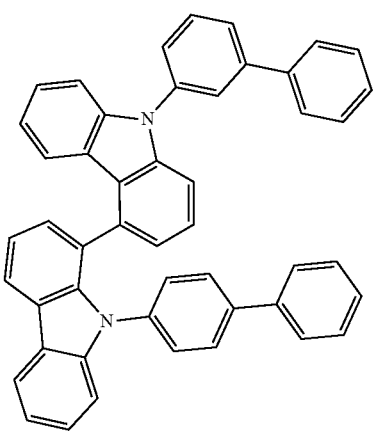
2-112
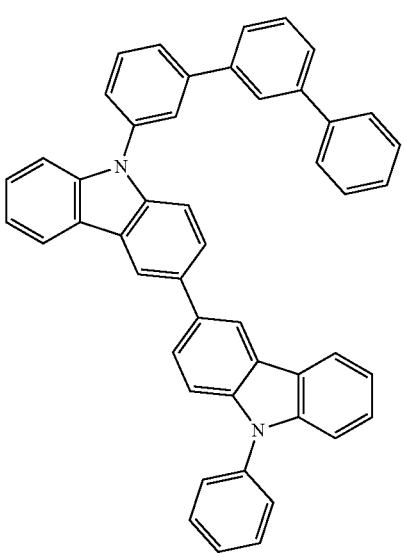

-continued
2-113
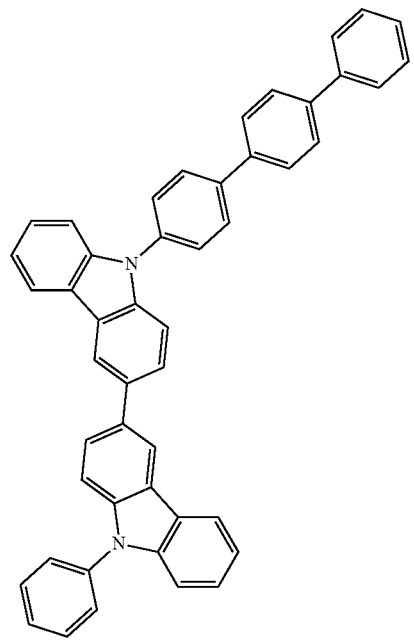
2-114
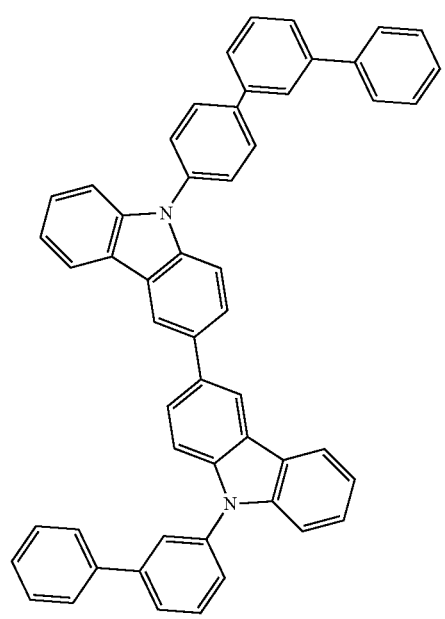
2-115
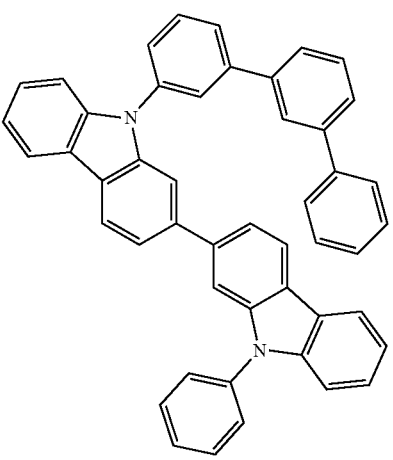
2-116
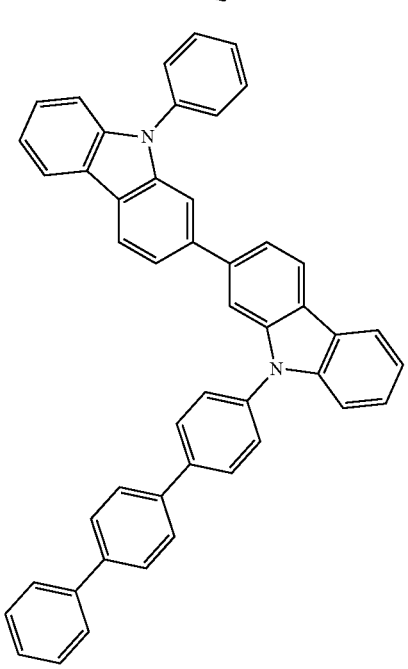
2-117
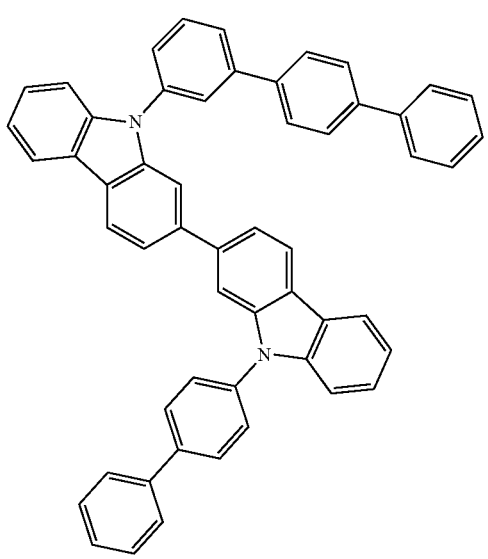

2-118
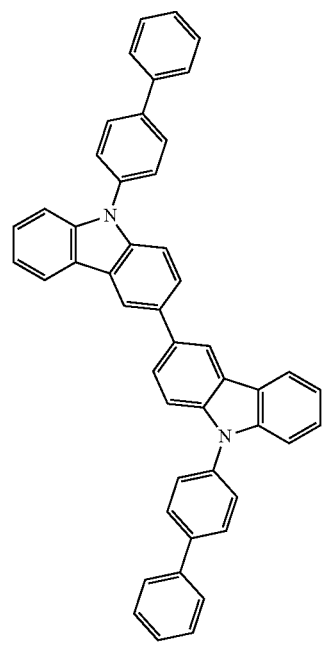
2-119
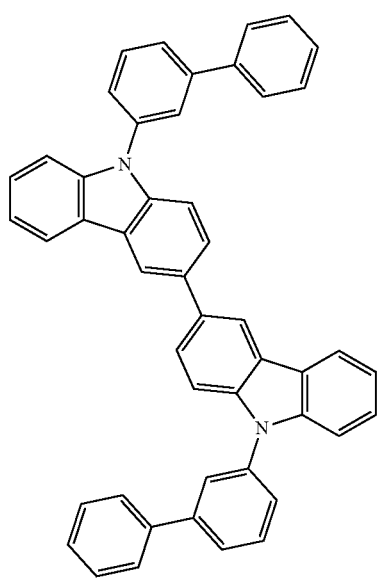
2-120
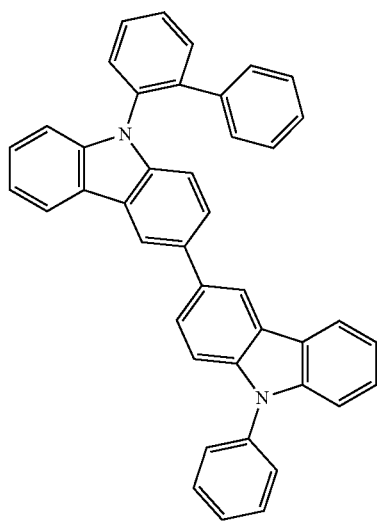
2-121
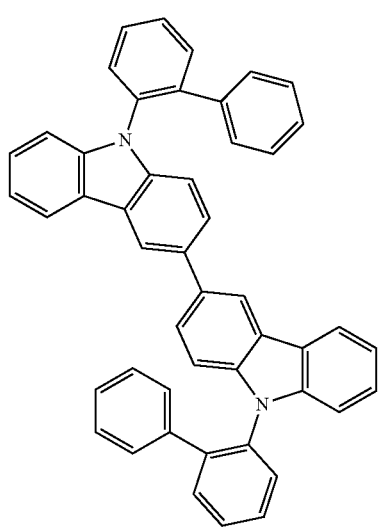
2-122
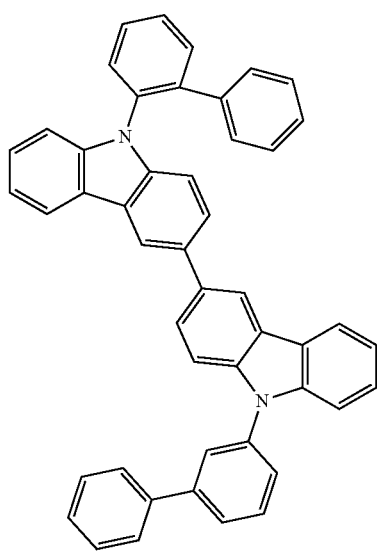

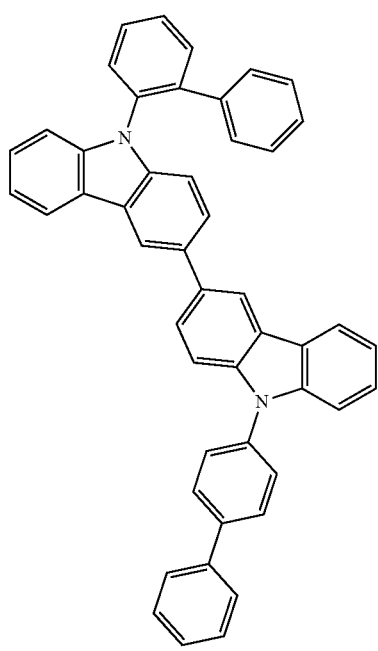
2-123
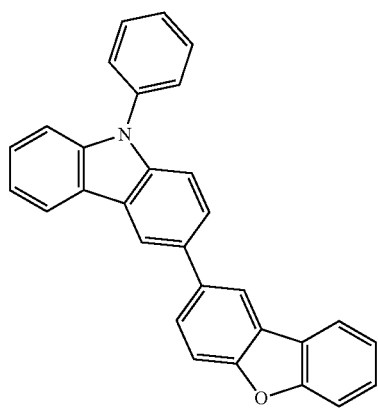
2-124
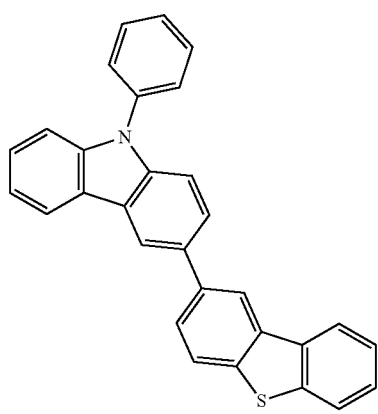
2-125
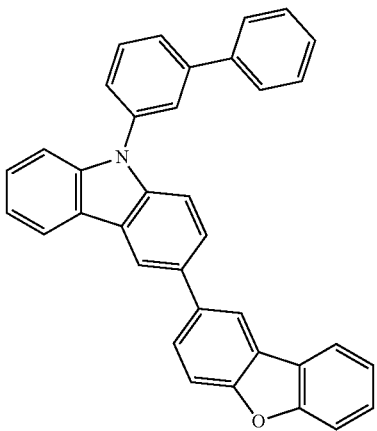
2-126
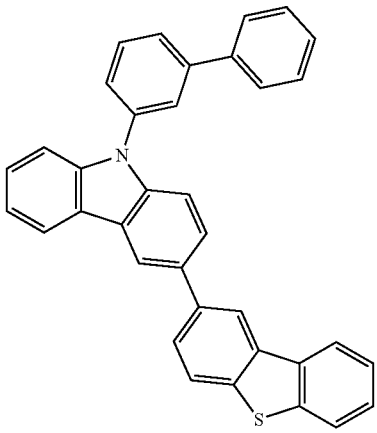
2-127
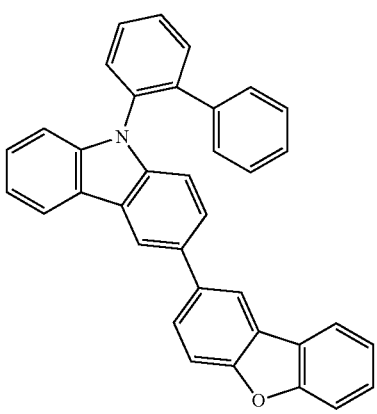
2-128

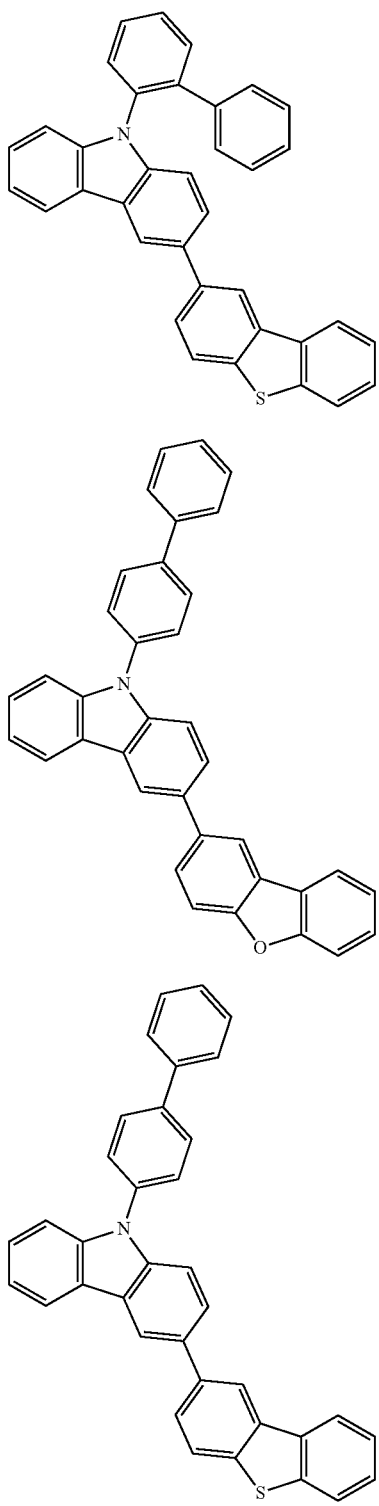

2-129

2-130

2-131

The melt mixture for an organic electroluminescent device of the present invention is a melt mixture of at least two types of organic compounds including a first organic compound and a second organic compound, and a difference in vapor deposition temperature between two types of organic compounds is 20° C. or less, and a difference between the PL maximum emission wavelength of the melt mixture and the PL maximum emission wavelength of any of the first organic compound and the second organic compound is within ±10 nm.

The melt mixture is obtained by melting and mixing organic compounds including the first organic compound and the second organic compound. Specifically, it can be produced by heating and melting a mixture containing the first organic compound and the second organic compound to a melting point of both of or one of the first organic compound and the second organic compound or higher under an inert atmosphere or under a reduced pressure, for example, under a reduced pressure of 200 Pa or less.

An organic EL device having a layer obtained by vacuum-vapor-depositing the melt mixture exhibits excellent performance. In particular, when this is used in the light-emitting layer, the performance is excellent. In the light-emitting layer, the first organic compound and the second organic compound may be used as hosts, and may be vapor-deposited together with a dopant which is a light-emitting material.

The first organic compound and the second organic compound can be mixed at an arbitrary ratio. For the mixing ratio (weight ratio) between the first organic compound and the second organic compound, when the second organic compound is a major component, a proportion of the first organic compound may be 10 to 60%, and is preferably 20 to 50%, and more preferably 30 to 50% with respect to a total amount of the first organic compound and the second organic compound.

When the compound represented by General Formula (1) and the compound represented by General Formula (2) are used, the second organic compound as a major component may be the compound represented by General Formula (2), and the first organic compound may be the compound represented by General Formula (1).

The vapor deposition temperature difference between the first organic compound and the second organic compound may be 20° C. or less, and is preferably 15° C. or less, and more preferably 10° C. or less.

The difference between the PL maximum emission wavelength of the melt mixture for an organic EL device and the PL maximum emission wavelength of any of the first organic compound and the second organic compound is within ±10 nm and is preferably within ±5 nm.

The melt mixture for an organic EL device can be vacuum-vapor-deposited to form a light-emitting layer. In this case, it may be co-vapor-deposited with the dopant or other material.

The reason for this is not clear, but it is speculated that, when the difference between the PL maximum emission wavelength of the melt mixture for an organic EL device of the present invention and the PL maximum emission wavelength of any of the PL maximum emission wavelength of the first organic compound and the second organic compound is smaller, movement of excited energy transfer is smoother, and when used as a vapor deposition raw material of the host material of the light-emitting layer, the light emission brightness, driving voltage, luminous efficiency, brightness half-lifespan characteristics of the element are improved.

Next, the structure of the organic EL device of the present invention will be described with reference to the drawings, but the structure of the organic EL device of the present invention is not limited thereto.

FIG. 1 is a cross-sectional view showing a structure example of a general organic EL device used in the present invention, 1 represents a substrate, 2 represents an anode, 3 represents a hole injection layer, 4 represents a hole transport layer, 5 represents a light-emitting layer, 6 represents an electron transport layer, and 7 represents a cathode. The organic EL device of the present invention may have an exciton blocking layer adjacent to the light-emitting layer or may have an electron blocking layer between the light-emitting layer and the hole injection layer. The exciton blocking layer can be inserted into either on the side of the cathode or the side of the anode of the light-emitting layer and can be inserted into both sides at the same time. The organic EL device of the present invention has the anode, the light-emitting layer, and the cathode as essential layers, and may have a hole injection transport layer and an electron injection transport layer in addition to the essential layers, and may have additionally a hole blocking layer between the light-emitting layer and the electron injection transport layer. Here, the hole injection transport layer refers to either or both of the hole injection layer and the hole transport layer, and the electron injection transport layer refers to either or both of the electron injection layer and the electron transport layer.

A structure reverse to that of FIG. 1, that is, a structure in which a cathode 7, an electron transport layer 6, a light-emitting layer 5, a hole transport layer 4, a hole injection layer 3, and an anode 2 are laminated on a substrate 1 in that order, can be used, and in this case also, layers can be added or omitted as necessary.

—Substrate—

The organic EL device of the present invention is preferably supported on a substrate. The substrate is not particularly limited, and those used in the organic EL device in the related art may be used, and those made of, for example, glass, a transparent plastic, or quartz, can be used.

—Anode—

Regarding an anode material for an organic EL device, a material of a metal having a large work function (4 eV or more), an alloy, an electrically conductive compound or a mixture thereof is preferably used. Specific examples of such an electrode material include a metal such as Au, and a conductive transparent material such as CuI, indium tin oxide (ITO), $SnO_2$, and ZnO. In addition, an amorphous material such as IDIXO ($In_2O_3$—ZnO) which can form a transparent conductive film may be used. Regarding the anode, such an electrode material is used to form a thin film by a vapor-deposition or sputtering method, and a desired shape pattern may be formed by a photolithographic method, or if pattern accuracy is not particularly required (about 100 μm or more), a pattern may be formed via a desired shape mask when the electrode material is vapor-deposited or sputtered. Alternatively, when a coatable substance such as the organic conductive compound is used, a wet film formation method such as a printing method and a coating method can be used. When light is emitted from the anode, it is desirable that the transmittance be larger than 10% and the sheet resistance for the anode is preferably several hundreds of Ω/sq or less. The film thickness depends on the material, and it is generally 10 to 1,000 nm, and preferably selected in a range of 10 to 200 nm.

—Cathode—

On the other hand, regarding a cathode material, a material of a metal having a small work function (4 eV or less) (referred to as an electron injection metal), an alloy, an electrically conductive compound, or a mixture thereof is used. Specific examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Among these, in consideration of electron injectability and durability with respect to oxidation and the like, a mixture of an electron injection metal and a second metal which is a stable metal having a larger work function value, for example, a magnesium/silver mixture, a magnesium/aluminum mixture, a magnesium/indium mixture, an aluminum/aluminum oxide ($Al_2O_3$) mixture, a lithium/aluminum mixture, aluminum, and the like are suitable. The cathode can be produced by forming a thin film by a method such as vapor-depositing or sputtering of such a cathode material. In addition, a sheet resistance for the cathode is preferably several hundreds of Ω/sq or less, and the film thickness is generally 10 nm to 5 μm, and preferably selected in a range of 50 to 200 nm. Here, in order to transmit emitted light, if either the anode or the cathode of the organic EL device is transparent or translucent, light emission brightness is improved, which is advantageous.

In addition, after the metal with a film thickness of 1 to 20 nm is formed on the cathode, when a conductive transparent material exemplified in the description of the anode is formed thereon, a transparent or translucent cathode can be produced and by applying this, it is possible to produce an element in which both the anode and the cathode have transparency.

—Light-Emitting Layer—

The light-emitting layer is a layer that emits light after excitons are generated when holes and electrons injected from the anode and the cathode, respectively, are recombined, and the light-emitting layer contains an organic light-emitting dopant material and a host material.

Regarding the host material in the light-emitting layer, the melt mixture for an organic EL device of the present invention may be used as a vapor deposition raw material.

When a phosphorescent dopant is used as the organic light-emitting dopant material, a phosphorescent dopant including an organometallic complex containing at least one metal selected from among ruthenium, rhodium, palladium, silver, rhenium, osmium, iridium, platinum, and gold may be used. Specifically, iridium complexes described in J. Am. Chem. Soc. 2001, 123, 4304 and Published Japanese Translation of PCT Application No. 2013-53051 are preferably used, but the present invention is not limited thereto.

Only one type of a phosphorescent dopant material may be contained in the light-emitting layer or two or more types thereof may be contained. When two or more types of phosphorescent dopant materials are contained, a total weight of the phosphorescent dopant materials is preferably 30% or less and more preferably 20% or less with respect to the host material.

The phosphorescent dopant material is not particularly limited, and specific examples thereof include the following.

[C27]

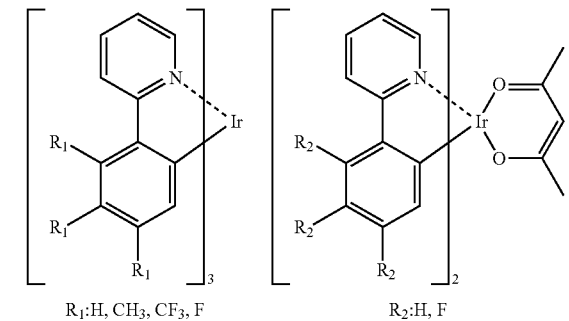

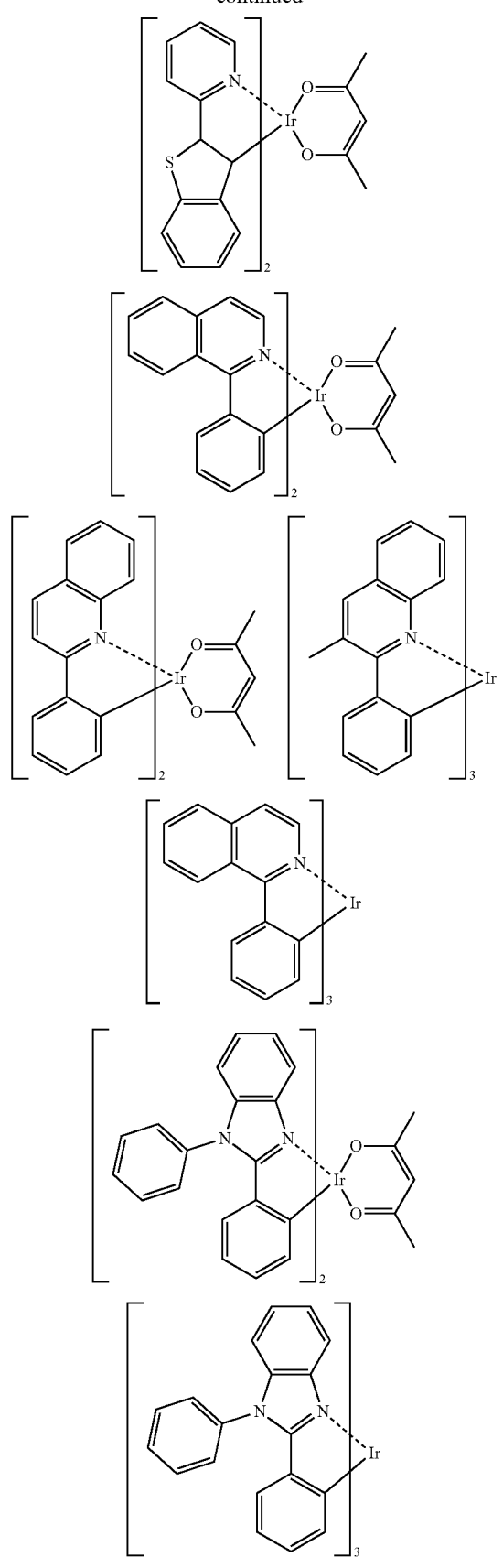
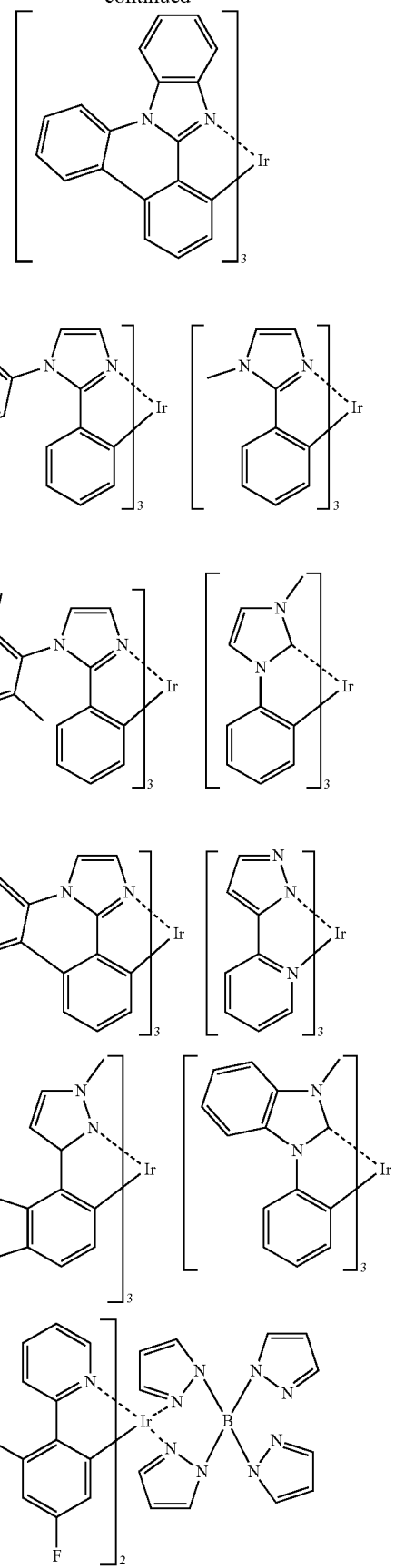

[C28]

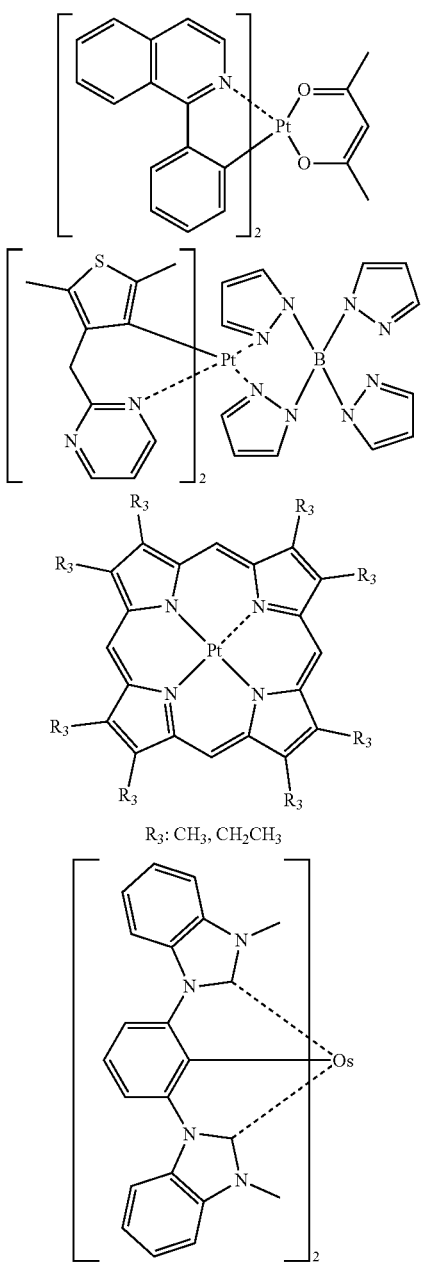

R$_3$: CH$_3$, CH$_2$CH$_3$

When a fluorescence-emitting dopant is used as a light-emitting dopant material, the fluorescence-emitting dopant is not particularly limited. Examples thereof include benzoxazole derivatives, benzothiazole derivatives, benzimidazole derivative, styrylbenzene derivatives, polyphenyl derivatives, diphenyl butadiene derivatives, tetraphenyl butadiene derivatives, naphthalimide derivative, coumarin derivatives, fused aromatic compound, perinone derivatives, oxadiazole derivative, oxazine derivatives, aldazine derivatives, pyrrolidine derivatives, cyclopentadiene derivatives, bisstyryl anthracene derivatives, quinacridone derivatives, pyrrolopyridine derivatives, thiadiazolopyridine derivatives, styrylamine derivatives, diketopyrrolopyrrole derivatives, aromatic dimethylidine compounds, metal complexes of 8-quinolinol derivatives, metal complexes of pyromethene derivatives, rare earth complexes, various metal complexes represented by transition metal complexes, polymer compounds such as polythiophene, polyphenylene, and polyphenylene vinylene, and organosilane derivatives. Preferable examples thereof include fused aromatic derivatives, styryl derivatives, diketopyrrolopyrrole derivatives, oxazine derivatives, pyromethene metal complexes, transition metal complexes, and lanthanoid complexes. More preferable examples thereof include naphthacene, pyrene, chrysene, triphenylene, benzo[c]phenanthrene, benzo[a]anthracene, pentacene, perylene, fluoranthene, acenaphthofluoranthene, dibenzo[a,j]anthracene, dibenzo[a,h]anthracene, benzo[a]naphthalene, hexacene, naphtho[2,1-f]isoquinoline, α-naphthaphenanthridine, phenanthrooxazole, quinolino[6,5-f]quinoline, and benzothiophanthrene. These may have an alkyl group, an aryl group, an aromatic heterocyclic group, or a diarylamino group as a substituent.

Only one type of a fluorescence-emitting dopant material may be contained in the light-emitting layer or two or more types thereof may be contained. When two or more types of fluorescence-emitting dopant materials are contained, a total weight of the fluorescence-emitting dopant materials is preferably 20% or less and more preferably 10% or less with respect to the host material.

The fluorescence-emitting dopant material is not particularly limited, and specific examples thereof include the following.

[C29]

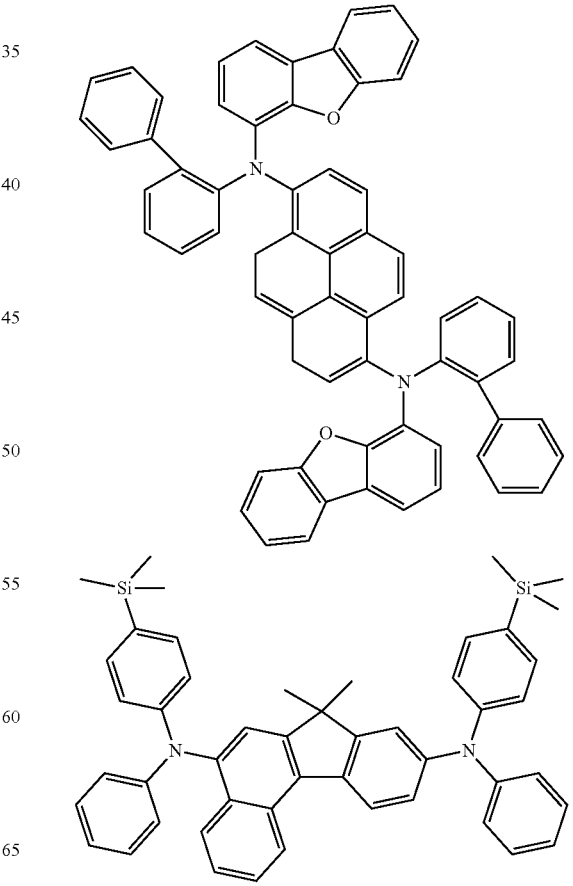

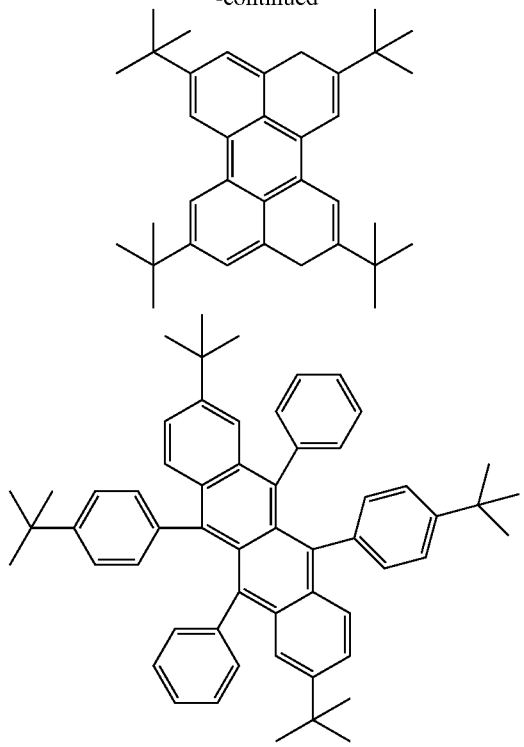

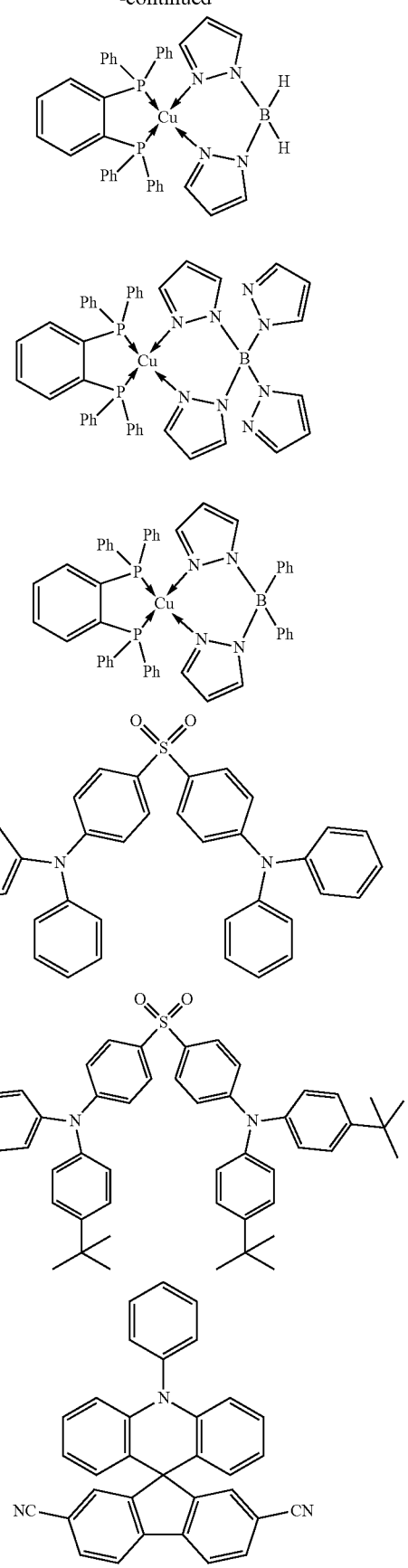

Only one type of a fluorescence-emitting dopant material may be contained in the light-emitting layer or two or more types thereof may be contained. A content of the fluorescence-emitting dopant material is preferably 1 to 20% and more preferably 1 to 10% with respect to the host material.

When a thermally activated delayed fluorescence-emitting dopant is used as a light-emitting dopant material, the thermally activated delayed fluorescence-emitting dopant is not particularly limited. Examples thereof include metal complexes such as a tin complex and a copper complex, indolocarbazole derivatives described in WO2011/070963, cyanbenzene derivatives described in Nature 2012, 492, 234, carbazole derivatives, phenazine derivatives described in Nature Photonics 2014, 8, 326, oxadiazole derivatives, triazole derivatives, sulfone derivatives, phenoxazine derivatives, acridine derivatives, and arylborane derivatives described in Adv. Mater. 2016, 28, 2777.

The thermally activated delayed fluorescence-emitting dopant material is not particularly limited, and specific examples thereof include the following.

[30]

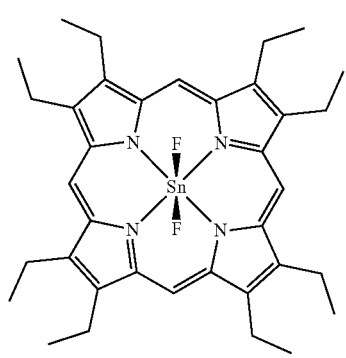

89
-continued
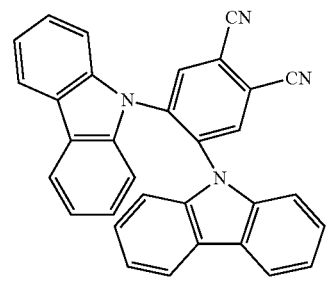
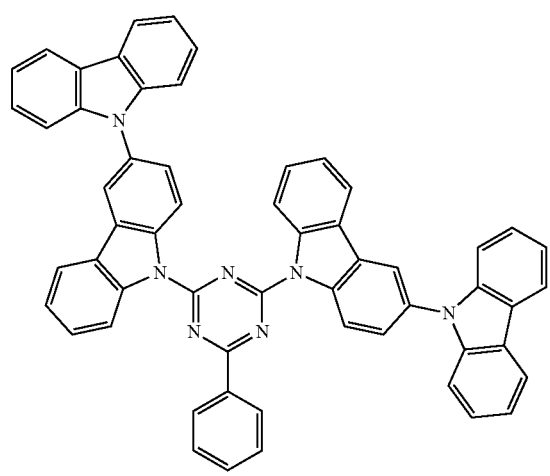
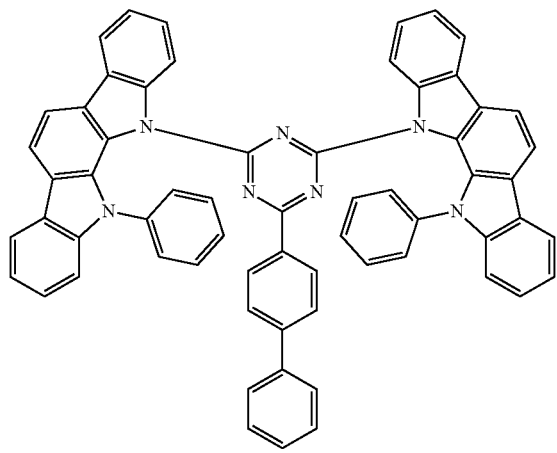
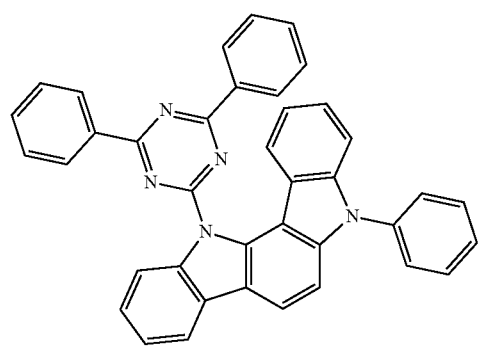
90
-continued
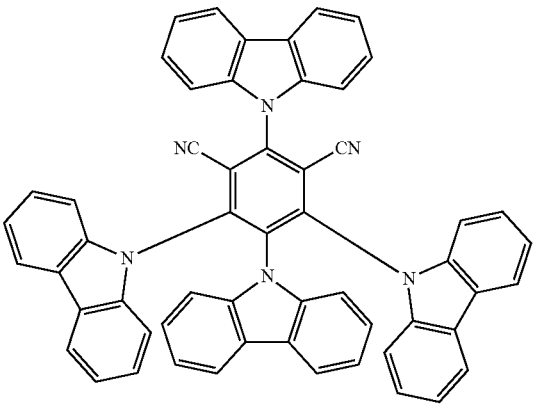
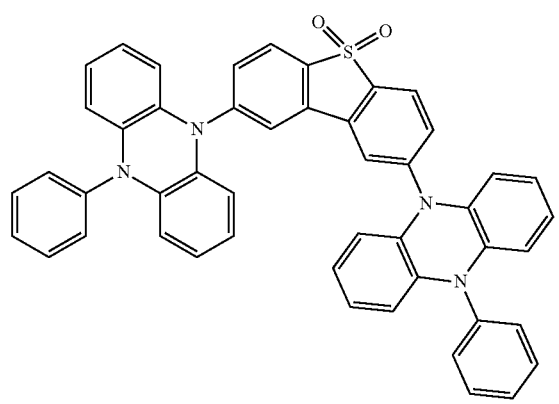

[31]

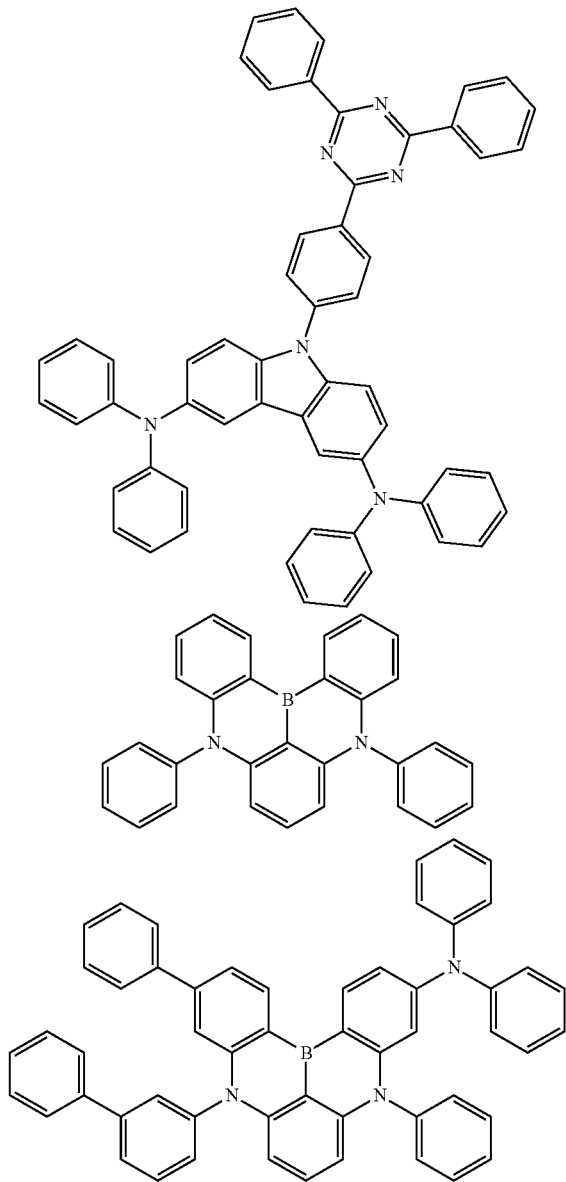

Only one type of a thermally activated delayed fluorescence-emitting dopant material may be contained in the light-emitting layer or two or more types thereof may be contained. In addition, a mixture of thermally activated delayed fluorescence-emitting dopant and a phosphorescent dopant or a fluorescence-emitting dopant may be used. A content of the thermally activated delayed fluorescence-emitting dopant material is preferably 1 to 50% and more preferably 1 to 30% with respect to the host material.

—Injection Layer—

The injection layer is a layer that is provided between an electrode and an organic layer in order to lower a driving voltage and improve light emission brightness, and includes a hole injection layer and an electron injection layer, and may be present between the anode and the light-emitting layer or the hole transport layer, and between the cathode and the light-emitting layer or the electron transport layer. The injection layer can be provided as necessary.

—Hole Blocking Layer—

The hole blocking layer has a function of the electron transport layer in a broad sense, and is made of a hole blocking material having a function of transporting electrons and a significantly low ability to transport holes. When the layer blocks holes while transporting electrons, a probability of recombining electrons and holes in the light-emitting layer can be improved. For the hole blocking layer, a known hole blocking material can be used or a plurality of types of hole blocking materials may be used in combination.

—Electron Blocking Layer—

The electron blocking layer has a function of a hole transport layer in a broad sense and blocks electrons while transporting holes, and thus can improve a probability of recombining electrons and holes in the light-emitting layer. Regarding the material of the electron blocking layer, a known electron blocking layer material can be used. The film thickness of the electron blocking layer is preferably 3 to 100 nm, and more preferably 5 to 30 nm.

—Exciton Blocking Layer—

The exciton blocking layer is a layer for blocking diffusion of excitons generated when holes and electrons are recombined in the light-emitting layer in a charge transport layer (a hole transport layer and an electron transport layer), and when this layer is inserted, excitons can be efficiently confined in the light-emitting layer, and the luminous efficiency of the element can be improved. The exciton blocking layer can be inserted between two adjacent light-emitting layers in an element in which two or more light-emitting layers are adjacent to each other. Regarding the material of the exciton blocking layer, known exciton blocking layer materials can be used.

Examples of layers adjacent to the light-emitting layer include a hole blocking layer, an electron blocking layer, an exciton blocking layer, and the like, but if these layers are not provided, a hole transport layer, an electron transport layer and the like are adjacent layers.

—Hole Transport Layer—

The hole transport layer is made of a hole transport material having a function of transporting holes, and a single hole transport layer or a plurality of hole transport layers can be provided.

The hole transport material has either hole injection or transport properties or electron barrier properties, and may be an organic material or an inorganic material. For the hole transport layer, any one selected from among conventionally known compounds can be used. Examples of such a hole transport material include porphyrin derivatives, arylamine derivatives, triazole derivatives, oxadiazole derivatives, imidazole derivatives, polyarylalkane derivatives, phenylenediamine derivatives, arylamine derivatives, amino-substituted chalcone derivatives, oxazole derivatives, styryl anthracene derivatives, fluorenone derivatives, hydrazone derivatives, stilbene derivatives, silazane derivatives, an aniline copolymer, and a conductive polymer oligomers, and particularly a thiophene oligomer. Porphyrin derivatives, arylamine derivatives, or styrylamine derivatives are preferably used. An arylamine compound is more preferably used.

—Electron Transport Layer—

The electron transport layer is made of a material having a function of transporting electrons, and a single electron transport layer or a plurality of electron transport layers can be provided.

The electron transport material (which may also be a hole blocking material) may have a function of transferring electrons injected from the cathode to the light-emitting layer. For the electron transport layer, any one selected from among conventionally known compounds can be used, and examples thereof include polycyclic aromatic derivatives such as naphthalene, anthracene, and phenanthroline, tris(8-quinolinolato)aluminum (III) derivatives, phosphine oxide derivatives, nitro-substituted fluorene derivatives, diphenylquinone derivatives, thiopyrandioxide derivatives, carbodiimide, freorenylidene methane derivatives, anthraquinodimethane and anthrone derivatives, bipyridine derivatives, quinoline derivatives, oxadiazole derivatives, benzimidazole derivatives, benzothiazole derivatives, and indolocarbazole derivatives. In addition, a polymer material in which such a material is introduced into a polymer chain or such a material is used for a main chain of a polymer can be used.

EXAMPLES

While the present invention will be described below in more detail with reference to examples, the present invention is not limited to these examples, and can be implemented in various forms without departing from the scope and spirit thereof.

Example 1

A pre-mixture H1 was prepared by weighing out Compound 1-5 (0.6 g) and Compound 2-77 (1.4 g) and mixing them while grinding them in a mortar.

The pre-mixture H1 (1.0 g) was put into a vacuum chamber, and heated to 320° C. under a reduced pressure of 100 Pa or less, and H1 was melted, then it was cooled to room temperature, and pulverization and mixing were performed to obtain a melt mixture M1.

FIG. 1 shows PL emission spectrums of the melt mixture M1 and the pre-mixture H1, and Compound 1-5 and Compound 2-77.

Example 2

A pre-mixture H2 was prepared by weighing out Compound 1-11 (0.6 g) and Compound 2-77 (1.4 g) and mixing them while grinding them in a mortar.

The pre-mixture H2 (1.0 g) was put into a vacuum chamber and heated to 320° C. under a reduced pressure of 100 Pa or less, and H2 was melted, then it was cooled to room temperature, and pulverization and mixing were performed to obtain a melt mixture M2.

Figure 2:
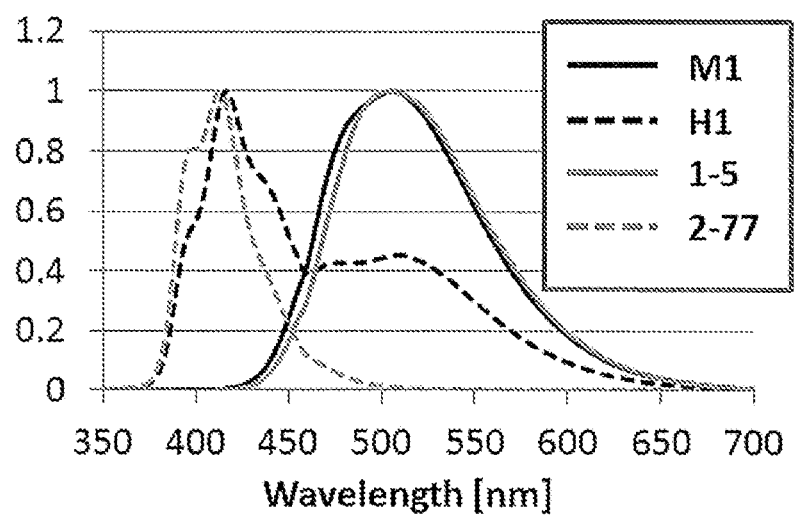
FIG. 2 shows PL spectrums of a melt mixture M1, a pre-mixture and two compounds.

FIG. 2 shows PL emission spectrums of the melt mixture M2 and the pre-mixture H2, and Compound 1-11 and Compound 2-77.

Structural formulae of the compound A and the compound B used for producing melt mixtures for comparison are shown below.

[C32]

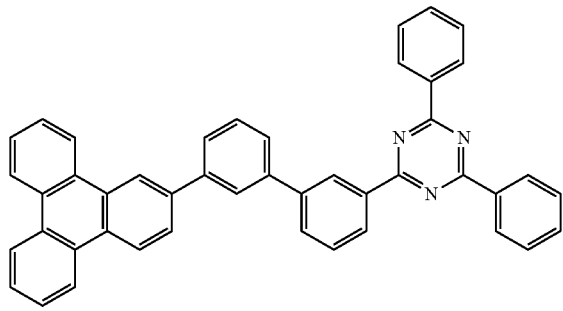

Compound A

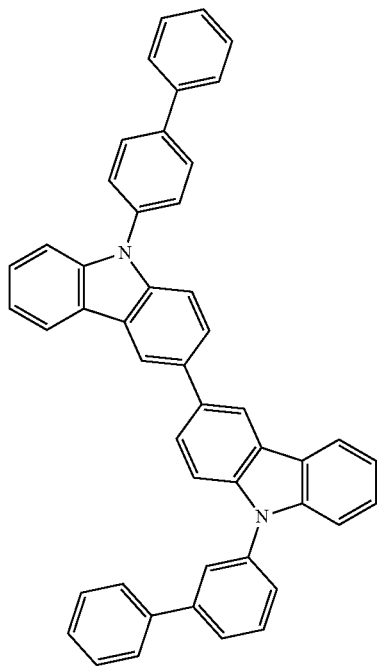

Compound B

Comparative Example 1

A pre-mixture H3 was prepared by weighing out the compound A (0.6 g) and the compound B (1.4 g) and mixing them while grinding them in a mortar.

The pre-mixture H3 (1.0 g) was put into a vacuum chamber and heated to 300° C. under a reduced pressure of 100 Pa or less, and H3 was melted, then it was cooled to room temperature, and pulverization and mixing were performed to obtain a melt mixture M3.

Figure 3:
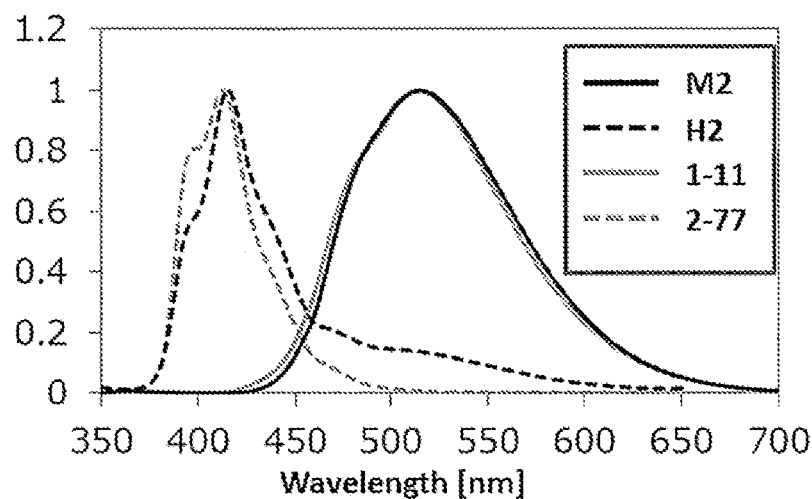
FIG. 3 shows PL spectrums of a melt mixture M2, a pre-mixture and two compounds.
Figure 4:
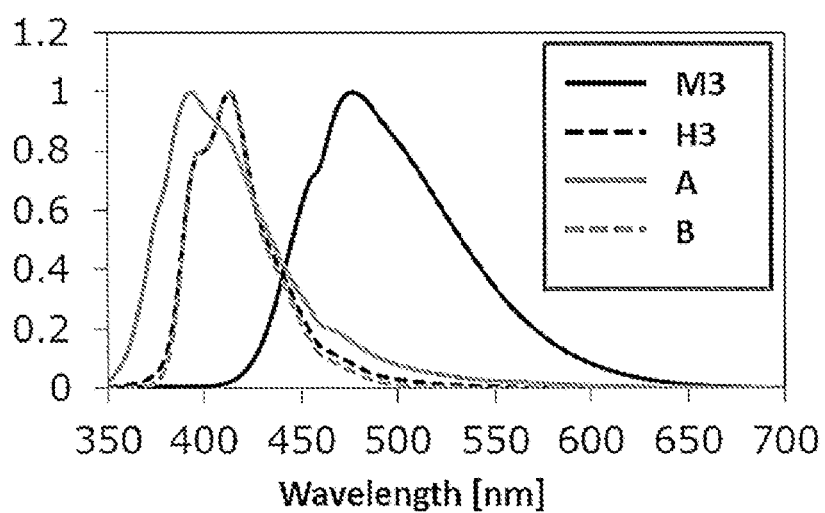
FIG. 4 shows PL spectrums of a melt mixture M3, a pre-mixture and two compounds.

FIG. 3 shows PL emission spectrums of the melt mixture M3 and the pre-mixture H3, and the compound A and the compound B.

Table 1 shows the melting point (Mp) and the vapor deposition temperature ($T_a$) of Compounds 1-5, 1-11, and 2-77, and the compounds A and B.

TABLE 1

| Compound | Mp(° C.) | $T_s$(° C.) |
|---|---|---|
| 1-5 | N.D. | 192 |
| 1-11 | 297 | 195 |
| 2-77 | 241 | 201 |
| A | 285 | 204 |
| B | N.D. | 213 |

Fluorescence-emitting (PL: fluorescence-emitting) spectrums of powders of the pre-mixtures H1 to H3 and the melt mixtures M1 to M3 produced in the above examples and comparative examples, and Compounds 1-5, 1-11, and 2-77, and the compounds A and B were measured. A spectrofluorometer (FP-6500, commercially available from JASCO) was used. A powder sample was interposed between two quartz substrates and the PL spectrum in the powder state was measured.

In the PL spectrum, the wavelength at the maximum peak was set as a PL maximum emission wavelength and this is shown in Table 2.

TABLE 2

| Compound or mixture | PL maximum emission wavelength (nm) |
|---|---|
| M1 | 506 |
| H1 | 416 |
| 1-5 | 504 |
| 2-77 | 413 |
| M2 | 514 |
| H2 | 415 |
| 1-11 | 513 |
| 2-77 | 413 |
| M3 | 477 |
| H3 | 413 |
| A | 393 |
| B | 413 |

Based on Table 2, it was found that the difference between the PL maximum emission wavelength of the melt mixture M1 and the PL maximum emission wavelength of Compound 1-5 was 2 nm.

In addition, it was found that the difference between the PL maximum emission wavelength of the melt mixture M2 and the PL maximum emission wavelength of Compound 1-11 was 1 nm.

In addition, it was found that the PL maximum emission wavelength of the melt mixture M3 had a value different from the PL maximum emission wavelength of any of the pre-mixture H3 and the compounds A and B, a difference from the compound A was 84 nm, and a difference from the compound B was 64 nm.

Compounds used in examples are shown below. [C33]

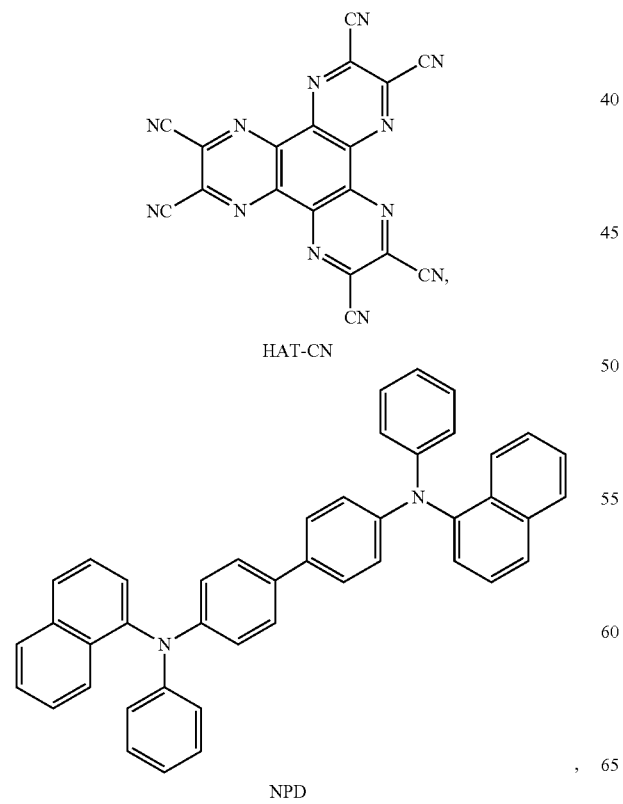

HAT-CN

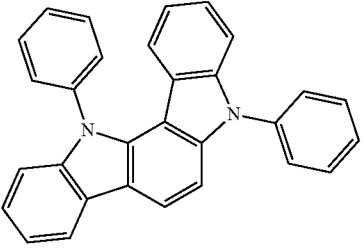

HT-1

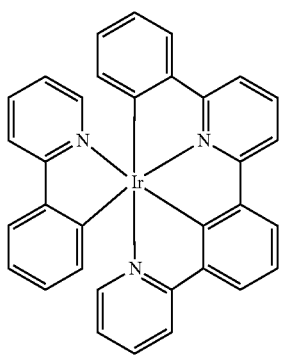

Ir(ppy)$_3$

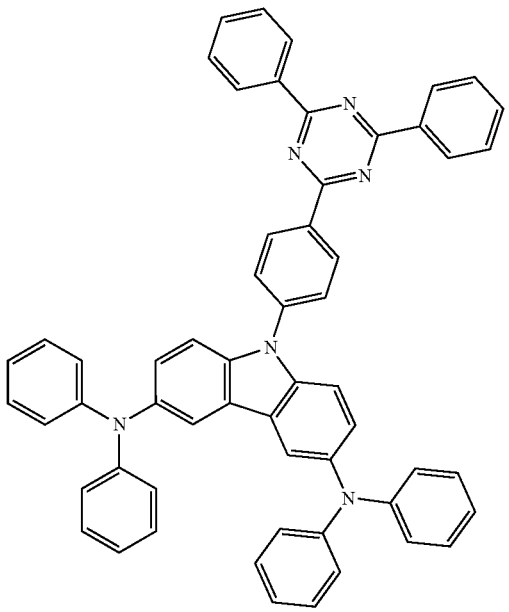

DACT-II

NPD

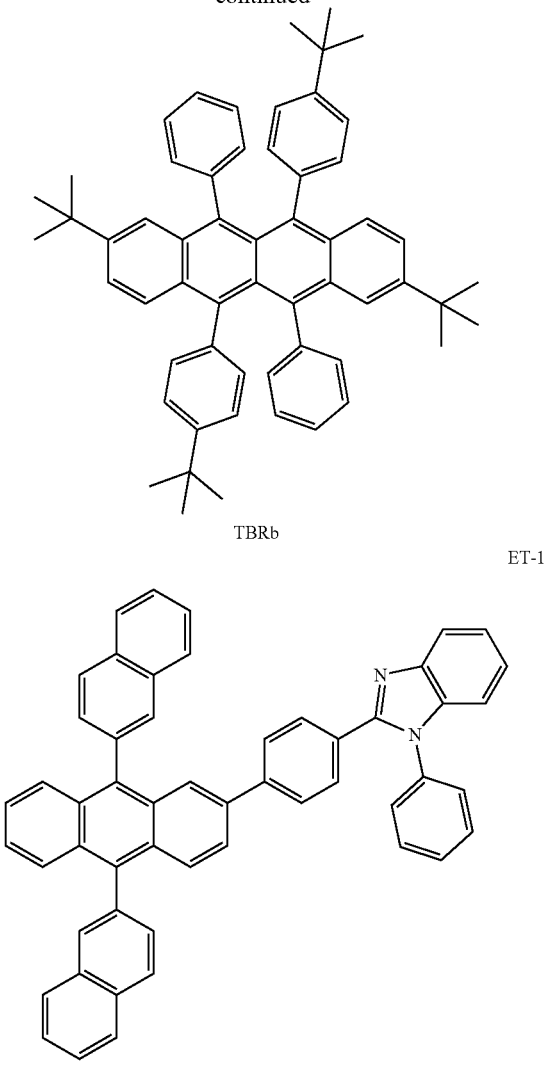

TBRb

ET-1

Example 3

On a glass substrate on which an anode made of ITO with a film thickness of 110 nm was formed, respective thin films were laminated using a vacuum vapor deposition method at a degree of vacuum of $4.0 \times 10^{-5}$ Pa. First, HAT-CN was formed with a thickness of 25 nm as a hole injection layer on ITO. Next, NPD was formed with a thickness of 30 nm as a hole transport layer. Next, HT-1 was formed with a thickness of 10 nm as an electron blocking layer. Then, the melt mixture M1 as a host and Ir(ppy)$_3$ as a light-emitting dopant were co-vapor-deposited from different vapor deposition sources to form a light-emitting layer with a thickness of 40 nm. In this case, co-vapor deposition was performed under vapor deposition conditions such that the concentration of Ir(ppy)$_3$ was 5 wt %. Next, ET-1 was formed with a thickness of 20 nm as an electron transport layer. In addition, lithium fluoride (LiF) was formed with a thickness of 1 nm as an electron injection layer on the electron transport layer. Finally, aluminum (Al) was formed with a thickness of 70 nm as a cathode on the electron injection layer to produce an organic EL device.

Example 4

An organic EL device was produced in the same manner as in Example 3 except that, unlike Example 3, the melt mixture M2 was used as the host.

Comparative Example 2

An organic EL device was produced in the same manner as in Example 3 except that, unlike Example 3, the melt mixture M3 was used as the host.

Comparative Examples 3 to 5

Organic EL devices were produced in the same manner as in Example 3 except that, unlike Example 3, any of the pre-mixtures H1 to H3 were used as the host.

It was found that, when the organic EL devices produced in the above examples and comparative examples were connected to an external power supply and supplied with a DC voltage, an EL emission spectrum with a maximum wavelength of 530 nm was observed in all of the elements, and light emission from Ir(ppy)$_3$ was obtained.

Table 3 shows the brightness, driving voltage, luminous efficiency, and brightness half-lifespan of the produced organic EL devices. In the table, the driving voltage and current efficiency were values at a drive current of 20 mA/cm$^2$ and were initial characteristics. LT95 was a time taken for the brightness to be reduced to 95% of the initial brightness during driving at 20 mA/cm$^2$, and was a lifespan characteristic.

TABLE 3

| | Host | Voltage (V) | Current efficiency (cd/A) | LT95 (h) |
| --- | --- | --- | --- | --- |
| Ex. 3 | M1 | 4.7 | 61.2 | 211 |
| Ex. 4 | M2 | 4.2 | 57.1 | 287 |
| Comp. Ex. 2 | M3 | 4.7 | 60.7 | 153 |
| Comp. Ex. 3 | H1 | 4.3 | 54.9 | 217 |
| Comp. Ex. 4 | H2 | 4.8 | 60.0 | 181 |
| Comp. Ex. 5 | H3 | 4.7 | 59.6 | 160 |

Based on Table 3, it was found that, comparing Example 3 with Comparative Example 3, and Example 4 with Comparative Example 4, the organic EL device containing the melt mixture and the phosphorescent material in the light-emitting layer had a more improved lifespan characteristic than the organic EL device having the light-emitting layer formed from the pre-mixture.

In addition, it was found that, in Examples 3 and 4 and Comparative Example 2, when the melt mixture in which the difference between the PL maximum emission wavelength of the melt mixture and the PL maximum emission wavelength of one compound among compounds constituting the melt mixture is within 10 nm was used as the host, the lifespan characteristic was improved.

The reason for this is not clear, but it is speculated that the stability in an excited state is higher than that of the melt mixture in which the difference between the PL maximum emission wavelength of the melt mixture and the PL maximum emission wavelength of the single compound constituting the melt mixture changes greatly.

Example 5

On a glass substrate on which an anode made of ITO with a film thickness of 70 nm was formed, respective thin films were laminated using a vacuum vapor deposition method at a degree of vacuum of $4.0 \times 10^{-5}$ Pa. First, HAT-CN was formed with a thickness of 10 nm as a hole injection layer on ITO. Next, NPD was formed with a thickness of 25 nm as a hole transport layer. Next, HT-1 was formed with a thickness of 10 nm as an electron blocking layer. Then, the melt mixture M1 as a host and DACT-II as a light-emitting dopant were co-vapor-deposited from different vapor deposition sources to form a light-emitting layer with a thickness of 30 nm. In this case, co-vapor deposition was performed under vapor deposition conditions such that the concentration of DACT-II was 9 wt %. Next, ET-1 was formed with a thickness of 45 nm as an electron transport layer. In addition, lithium fluoride (LiF) was formed with a thickness of 1 nm as an electron injection layer on the electron transport layer. Finally, aluminum (Al) was formed with a thickness of 70 nm as a cathode on the electron injection layer to produce an organic EL device.

Comparative Example 6

An organic EL device was produced in the same manner as in Example 5 except that, unlike Example 5, the pre-mixture H1 was used as the host.

It was found that, when the organic EL devices produced in the above examples and comparative examples were connected to an external power supply and supplied with a DC voltage, an EL emission spectrum with a maximum wavelength of 523 nm was observed in all of the elements, and light emission from DACT-II was obtained.

Table 4 shows the brightness, driving voltage, luminous efficiency, and brightness half-lifespan of the produced organic EL devices. In the table, the driving voltage and current efficiency were values at a drive current of 2.5 mA/cm$^2$, and were initial characteristics. LT50 was a time taken for the brightness to be reduced to 50% of the initial brightness during driving at 2.5 mA/cm$^2$, and was a lifespan characteristic.

TABLE 4

|  | Voltage (V) | Current efficiency (cd/A) | LT50 (h) |
| --- | --- | --- | --- |
| Ex. 5 | 3.2 | 53.3 | 75 |
| Comp. Ex. 6 | 3.2 | 51.2 | 47 |

Based on Table 4, it was found that, when the melt mixture was used as a host of the element in which the thermally activated delayed fluorescent material was used as the light-emitting dopant, the lifespan characteristic was improved.

Example 6

On a glass substrate on which an anode made of ITO with a film thickness of 70 nm was formed, respective thin films were laminated using a vacuum vapor deposition method at a degree of vacuum of $4.0 \times 10^{-5}$ Pa. First, HAT-CN was formed with a thickness of 10 nm as a hole injection layer on ITO. Next, NPD was formed with a thickness of 25 nm as a hole transport layer. Next, HT-1 was formed with a thickness of 10 nm as an electron blocking layer. Then, the melt mixture M1 as a host and TBRb as a light-emitting dopant were co-vapor-deposited from different vapor deposition sources to form a light-emitting layer with a thickness of 30 nm. In this case, co-vapor deposition was performed under vapor deposition conditions such that the concentration of TBRb was 2 wt %. Next, ET-1 was formed with a thickness of 45 nm as an electron transport layer. In addition, lithium fluoride (LiF) was formed with a thickness of 1 nm as an electron injection layer on the electron transport layer. Finally, aluminum (Al) was formed with a thickness of 70 nm as a cathode on the electron injection layer to produce an organic EL device.

Comparative Example 7

An organic EL device was produced in the same manner as in Example 6 except that, unlike Example 6, the pre-mixture H1 was used as the host.

It was found that, when the organic EL devices produced in the above examples and comparative examples were connected to an external power supply and supplied with a DC voltage, an EL emission spectrum with a maximum wavelength of 564 nm was observed in all of the elements, and light emission from TBRb was obtained.

Table 5 shows the brightness, driving voltage, luminous efficiency, and brightness half-lifespan of the produced organic EL devices. In the table, the driving voltage and current efficiency were values at a drive current of 2.5 mA/cm$^2$, and were initial characteristics. LT97 was a time taken for the brightness to be reduced to 97% of the initial brightness during driving at 2.5 mA/cm$^2$, and was a lifespan characteristic.

TABLE 5

|  | Voltage (V) | Current efficiency (cd/A) | LT97 (h) |
| --- | --- | --- | --- |
| Ex. 6 | 3.1 | 22.1 | 198 |
| Comp. Ex. 7 | 3.2 | 19.3 | 159 |

Based on Table 5, it was found that, when the melt mixture was used as a host of the element in which the fluorescent material was used as the light-emitting dopant, the lifespan characteristic was improved.

INDUSTRIAL APPLICABILITY

When the melt mixture for an organic EL device of the present invention is vacuum-vapor-deposited to form a light-emitting layer and an organic EL device is produced, it is possible to provide an organic EL device having high luminous efficiency and a prolonged lifespan with a low driving voltage.

REFERENCE SIGNS LIST

1 Substrate
2 Anode
3 Hole injection layer
4 Hole transport layer
5 Light-emitting layer
6 Electron transport layer
7 Cathode

What is claimed is:

1. A melt mixture for an organic electroluminescent device which is a melt mixture of at least two types of organic compounds,
   wherein the two types of organic compounds include a first organic compound and a second organic compound, a difference in vapor deposition temperature between the first organic compound and the second organic compound is 20° C. or less, and a difference between a maximum emission wavelength of a fluorescence-emitting spectrum of the melt mixture and a maximum emission wavelength of a fluorescence-emitting spectrum of any of the first organic compound and the second organic compound is within ±10 nm, the first organic compound and the second organic compound are hosts used in a light-emitting layer containing a host and a light-emitting dopant.

2. The melt mixture for an organic electroluminescent device according to claim 1, wherein the first organic compound is represented by the following General Formula (1):

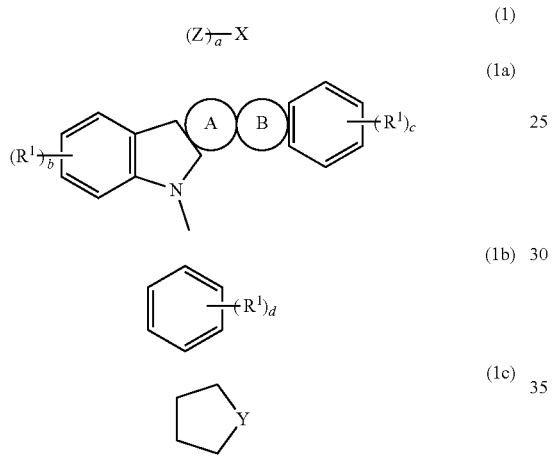

wherein, X represents an aromatic hydrocarbon group having 6 to 18 carbon atoms, an aromatic heterocyclic group having 3 to 17 carbon atoms or a linked aromatic group in which 2 to 8 of these aromatic rings are linked, Z represents an aromatic heterocyclic group represented by Formula (1a), the ring A is an aromatic hydrocarbon ring represented by Formula (1b), the ring B is a heterocycle represented by Formula (1c), and the ring A and the ring B are each fused to an adjacent ring at any position, R1's independently represent a cyano group, deuterium, an aliphatic hydrocarbon group having 1 to 10 carbon atoms, an aromatic hydrocarbon group having 6 to 18 carbon atoms, or an aromatic heterocyclic group having 3 to 17 carbon atoms, Y represents O, S, or N—Ar$^1$, Ar$^1$ represents an aromatic hydrocarbon group having 6 to 18 carbon atoms, an aromatic heterocyclic group having 3 to 17 carbon atoms, or a linked aromatic group in which 2 to 8 of these aromatic rings are linked, and a represents an integer of 1 to 3, b and c represent an integer of 0 to 4, and d represents an integer of 0 to 2.

3. The melt mixture for an organic electroluminescent device according to claim 2, wherein Y is N—Ar$^1$.

4. The melt mixture for an organic electroluminescent device according to claim 1, wherein the second organic compound is represented by the following General Formula (2):

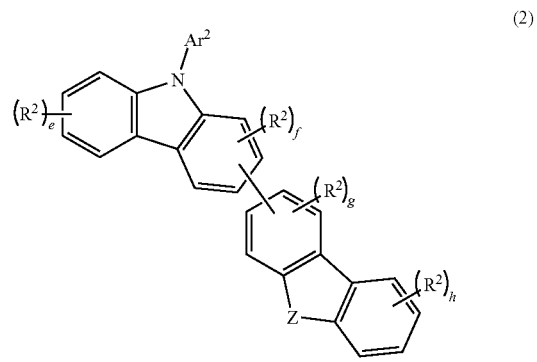

here, Z represents O, S, or N—Ar$^3$, and Ar$^2$ and Ar$^3$ represent an aromatic hydrocarbon group having 6 to 18 carbon atoms, an aromatic heterocyclic group having 3 to 17 carbon atoms or a linked aromatic group in which 2 to 8 of these aromatic rings are linked, R$^2$'s independently represent a cyano group, deuterium, an aliphatic hydrocarbon group having 1 to 10 carbon atoms, an aromatic hydrocarbon group having 6 to 18 carbon atoms, or an aromatic heterocyclic group having 3 to 17 carbon atoms, and e and h represent an integer of 0 to 4, and f and g represent an integer of 0 to 3.

5. The melt mixture for an organic electroluminescent device according to claim 4, wherein Z is N—Ar$^3$.

6. The melt mixture for an organic electroluminescent device according to claim 4, wherein General Formula (2) is the following Formula (3):

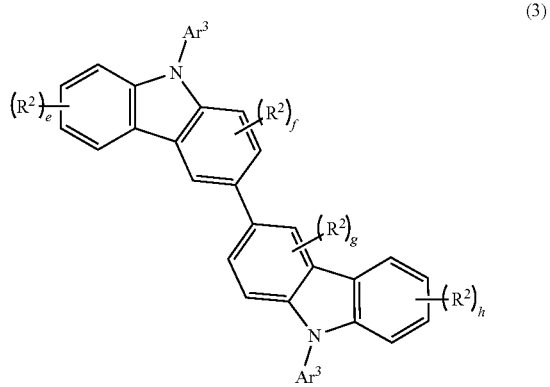

here, Ar$^2$, Ar$^3$, R$^2$, e, h, f and g are the same as those in General Formula (2).

7. An organic electroluminescent device containing a sublimate obtained by vacuum-vapor-depositing the melt mixture for an organic electroluminescent device according to claim 1 in a light-emitting layer.

8. A method of producing an organic electroluminescent device, comprising a process in which the melt mixture for an organic electroluminescent device according to claim 1 is vacuum-vapor-deposited to form a light-emitting layer.

* * * * *